United States Patent
Kashima et al.

(10) Patent No.: US 11,930,695 B2
(45) Date of Patent: Mar. 12, 2024

(54) BLOCK COPOLYMER AND LIGHT EMITTING DEVICE USING THE SAME

(71) Applicant: Sumitomo Chemical Company, Limited, Tokyo (JP)

(72) Inventors: Ken Kashima, Osaka (JP); Mayuko Sugiyama, Osaka (JP); Mio Shiratori, Tsukuba (JP); Katsuhiro Suenobu, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 708 days.

(21) Appl. No.: 17/042,442

(22) PCT Filed: Apr. 24, 2019

(86) PCT No.: PCT/JP2019/017475
§ 371 (c)(1),
(2) Date: Sep. 28, 2020

(87) PCT Pub. No.: WO2019/208647
PCT Pub. Date: Oct. 31, 2019

(65) Prior Publication Data
US 2021/0083191 A1    Mar. 18, 2021

(30) Foreign Application Priority Data

Apr. 26, 2018  (JP) .................. 2018-085556

(51) Int. Cl.
| C08G 61/12 | (2006.01) |
| H10K 85/10 | (2023.01) |
| H10K 50/15 | (2023.01) |

(52) U.S. Cl.
CPC .......... *H10K 85/115* (2023.02); *C08G 61/12* (2013.01); *H10K 85/151* (2023.02); *C08G 2261/126* (2013.01); *C08G 2261/1412* (2013.01); *C08G 2261/1414* (2013.01); *C08G 2261/148* (2013.01); *C08G 2261/1646* (2013.01); *C08G 2261/18* (2013.01); *C08G 2261/228* (2013.01); *C08G 2261/312* (2013.01);
(Continued)

(58) Field of Classification Search
CPC .... H10K 85/115; H10K 85/151; H10K 50/15; H10K 85/111; H10K 50/11; H10K 85/342; H10K 2101/10; H10K 50/00; C08G 61/12; C08G 2261/126; C08G 2261/1412; C08G 2261/1414; C08G 2261/148; C08G 2261/1646; C08G 2261/18; C08G 2261/228; C08G 2261/312; C08G 2261/314; C08G 2261/3142; C08G 2261/3162; C08G 2261/95; C08G 2261/12; C08G 2261/135; C08G 2261/1424; C08G 2261/1426; C08G 2261/1434; C08G 2261/149; C08G 2261/1526; C08G 2261/1644; C08G 2261/411; C08G 2261/51; C08G 2261/524; C08G 2261/76; C08G 2261/92; C08G 73/0206; C08G 2261/52; C08K 3/014; C08L 65/00; C08L 79/02; C09D 165/00

See application file for complete search history.

(56) References Cited

U.S. PATENT DOCUMENTS

| 2010/0096980 A1 | 4/2010 | Nakatani et al. |
| 2013/0270544 A1 | 10/2013 | Anryu et al. |

(Continued)

FOREIGN PATENT DOCUMENTS

| EP | 2112184 A1 | 10/2009 |
| EP | 2112185 A1 | 10/2009 |

(Continued)

OTHER PUBLICATIONS

Extended European Search Report dated Feb. 9, 2022 in EP Application No. 19791934.3.
Office Action dated Jan. 10, 2023 in TW Application No. 108114336 (English translation).
Office Action dated Oct. 18, 2022 in Application No. JP 2020-515531 (English machine translation).
Office Action dated Oct. 13, 2022 in Application No. CN 201980028033.8 (partial English translation).
International Search Report dated Jun. 18, 2019 in International Application No. PCT/JP2019/017475.

(Continued)

*Primary Examiner* — Mark Kopec
*Assistant Examiner* — Jaison P Thomas
(74) *Attorney, Agent, or Firm* — Panitch Schwarze Belisario & Nadel LLP

(57) ABSTRACT

A block copolymer includes an end group, a block that binds to the end group, and a block that does not bind to the end group. The block that does not bind to the end group contains at least one non-crosslinkable constitutional unit represented by the formula (X) and/or at least one non-crosslinkable constitutional unit represented by the formula (Z). At least one of formulas (i) $X_I > X_{II}$, (ii) $Z_I > Z_{II}$ and (iii) $X_I + Z_I > X_{II} + Z_{II}$ is satisfied when the total number of non-crosslinkable constitutional units represented by formulas (X) and (Z) in the block that does not bind to the end group are represented by $X_I$ and $Z_I$, respectively, and the total number of non-crosslinkable constitutional units represented by formulas (X) and (Z) in the block that binds to the end group are represented by $X_{II}$ and $Z_{II}$, respectively.

14 Claims, No Drawings

(52) U.S. Cl.
CPC .......... *C08G 2261/314* (2013.01); *C08G 2261/3142* (2013.01); *C08G 2261/3162* (2013.01); *C08G 2261/95* (2013.01); *H10K 50/15* (2023.02)

(56) References Cited

U.S. PATENT DOCUMENTS

| | | | |
|---|---|---|---|
| 2014/0008622 A1 | 1/2014 | Lee et al. | |
| 2015/0102334 A1 | 4/2015 | Iida et al. | |
| 2015/0115204 A1 | 4/2015 | Sekine et al. | |
| 2017/0283546 A1 * | 10/2017 | Sakakibara | C08G 61/12 |

FOREIGN PATENT DOCUMENTS

| | | | | |
|---|---|---|---|---|
| EP | 2308910 | A1 | 4/2011 | |
| EP | 2314639 | A1 | 4/2011 | |
| EP | 2518111 | A1 | 10/2012 | |
| EP | 2832761 | A1 | 2/2015 | |
| EP | 2862888 | A1 | 4/2015 | |
| EP | 3124518 | A1 | 2/2017 | |
| EP | 3199565 | A1 | 8/2017 | |
| JP | 2008208359 | A | 9/2008 | |
| JP | 2012144722 | A | 8/2012 | |
| JP | 2013133359 | A | 7/2013 | |
| JP | 2014003247 | A | 1/2014 | |
| JP | 2016111355 | A | 6/2016 | |
| JP | 2019194317 | A | 11/2019 | |
| JP | 2019194318 | A | 11/2019 | |
| JP | 2019195057 | A | 11/2019 | |
| WO | 2006043087 | A1 | 4/2006 | |
| WO | 2013146806 | A1 | 10/2013 | |
| WO | 2013191137 | A1 | 12/2013 | |
| WO | 2016047536 | A1 | 3/2016 | |
| WO | WO-2016047536 | A1 * | 3/2016 | ............ C08G 61/12 |
| WO | 2019208648 | A1 | 10/2019 | |

OTHER PUBLICATIONS

Office Action dated Apr. 1, 2023 in CN Application No. 201980028033.8 (English translation).
Office Action dated May 2, 2023 in TW Application No. 108114336 (English translation).
Office Action dated Apr. 11, 2023 in EP Application No. 19791934.3.

* cited by examiner

BLOCK COPOLYMER AND LIGHT EMITTING DEVICE USING THE SAME

CROSS-REFERENCE TO RELATED APPLICATIONS

This application is a Section 371 of International Application No. PCT/JP2019/017475, filed Apr. 24, 2019, which was published in the Japanese language on Oct. 31, 2019, under International Publication No. WO 2019/208647 A1, which claims priority under 35 U.S.C. § 119(b) to Japanese Application No. 2018-085556, filed Apr. 26, 2018, the disclosures of each of which are incorporated herein by reference in their entireties.

TECHNICAL FIELD

The present invention relates to a block copolymer and a light emitting device using the same.

BACKGROUND ART

Light emitting devices such as organic electroluminescent devices and the like can be suitably used for applications such as displays, lighting and the like, and active research and development thereof have been conducted. For example, Japanese Unexamined Patent Application Publication (JP-A) No. 2012-144722 (Patent Document 1) discloses a polymer compound (for example, polymer 23) containing a constitutional unit having a fluorene skeleton and a constitutional unit having an anthracene skeleton, which can form a light emitting layer or a charge transporting layer of a light emitting device. Further, JP-A No. 2016-111355 (Patent Document 2) discloses a polymer compound (for example, polymer compound P4) having a crosslinkable group, which can form a light emitting layer or a charge transporting layer of a light emitting device.

PRIOR ART DOCUMENT

[Patent Document]
Patent Document 1: JP-A No. 2012-144722
Patent Document 2: JP-A No. 2016-111355

SUMMARY OF THE INVENTION

Problem to be Solved by the Invention

However, the above-described polymer compound does not necessarily show sufficient hole transportability.

Then, the present invention has an object of providing a block copolymer which shows good hole transportability, a composition containing this block copolymer, and a light emitting device using this block copolymer.

Means for Solving the Problem

The present invention provides a block copolymer, a composition and a light emitting device described below.

[1] A block copolymer comprising an end group, a block that binds to the end group, and a block that does not bind to the end group, wherein the above-described block that does not bind to the end group contains at least one constitutional unit selected from the group consisting of a non-crosslinkable constitutional unit represented by the following the formula (X) and a non-crosslinkable constitutional unit represented by the following formula (Z), at least one selected from the group consisting of the above-described end group and the above-described block that binds to the end group contains a crosslinkable group, and at least one of the following formulae (i) to (iii) is satisfied when the total number of the above-described non-crosslinkable constitutional unit represented by the formula (X) and the total number of the above-described non-crosslinkable constitutional unit represented by the formula (Z) in the above-described block that does not bind to the end group are represented by $X_I$ and $Z_I$, respectively, and the total number of the above-described non-crosslinkable constitutional unit represented by the formula (X) and the total number of the above-described non-crosslinkable constitutional unit represented by the formula (Z) in the above-described block that binds to the end group are represented by $X_{II}$ and $Z_{II}$, respectively:

$$X_I > X_{II} \tag{i}$$

$$Z_I > Z_{II} \tag{ii}$$

$$X_I + Z_I > X_{II} + Z_{II} \tag{iii}$$

[Chemical Formula 1]

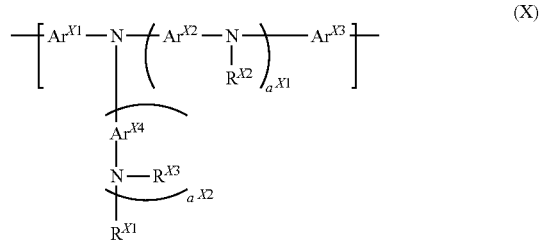

(X)

[wherein,
$a^{X1}$ and $a^{X2}$ each independently represent an integer of 0 or more and 10 or less.

$Ar^{X1}$ and $Ar^{X3}$ each independently represent an arylene group or a divalent heterocyclic group, and the foregoing groups optionally have a substituent.

$Ar^{X1}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent. When a plurality of $Ar^{X2}$ are present, they may be the same or different. When a plurality of $Ar^{X4}$ are present, they may be the same or different.

$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent. When a plurality of $R^{X2}$ are present, they may be the same or different. When a plurality of $R^{X3}$ are present, they may be the same or different.]

[Chemical Formula 2]

(Z)

[wherein, Ar$^Z$ represents a divalent heterocyclic group, or a divalent group in which at least one arylene group and at least one divalent heterocyclic group are bonded directly, and the foregoing groups optionally have a substituent.].

[2] The block copolymer according to [1], wherein the above-described block that binds to the end group contains the above-described crosslinkable group, and the above-described crosslinkable group is contained in the above-described block that binds to the end group as at least one constitutional unit selected from the group consisting of a constitutional unit represented by the following the formula (2) and a constitutional unit represented by the following the formula (2'):

[Chemical Formula 3]

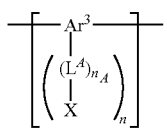

(2)

[wherein, nA represents an integer of 0 or more and 5 or less, and n represents an integer of 1 or more and 5 or less. When a plurality of nA are present, they may be the same or different.

Ar$^3$ represents an aromatic hydrocarbon group or a heterocyclic group, and the foregoing groups optionally have a substituent.

L$^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of L$^A$ are present, they may be the same or different.

X represents the above-described crosslinkable group. When a plurality of X are present, they may be the same or different.]

[Chemical Formula 4]

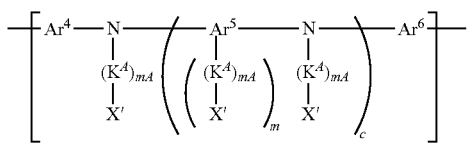

(2')

[wherein, mA represents an integer of 0 or more and 5 or less, m represents an integer of 1 or more and 5 or less, and c represents 0 or 1. When a plurality of mA are present, they may be the same or different.

Ar$^5$ represents an aromatic hydrocarbon group, a heterocyclic group, or a group in which at least one aromatic hydrocarbon group and at least one heterocyclic group are bonded directly, and the foregoing groups optionally have a substituent.

Ar$^4$ and Ar$^6$ each independently represent an arylene group or a divalent heterocyclic group, and the foregoing groups optionally have a substituent.

K$^A$ represents an alkylene group, a cycloalkylene group, an arylene group, a divalent heterocyclic group, a group represented by —NR"—, an oxygen atom or a sulfur atom, and the foregoing groups optionally have a substituent. R" represents a hydrogen atom, an alkyl group, a cycloalkyl group, an aryl group or a monovalent heterocyclic group, and the foregoing groups optionally have a substituent. When a plurality of K$^A$ are present, they may be the same or different.

X' represents the above-described crosslinkable group, a hydrogen atom, an alkyl group, a cycloalkyl group, an aryl group or a monovalent heterocyclic group, and the foregoing groups optionally have a substituent. When a plurality of X' are present, they may be the same or different. However, at least one X' is the above-described crosslinkable group.].

[3] The block copolymer according to [1] or [2], wherein the above-described end group contains a crosslinkable group.

[4] The block copolymer according to any one of [1] to [3], wherein the above-described crosslinkable group contains at least one structure selected from the group consisting of a carbon-carbon double bond, a carbon-carbon triple bond, oxirane, oxetane, aziridine, azetidine, azide, benzocyclobutene and naphthocyclobutene.

[5] The block copolymer according to [4], wherein the above-described crosslinkable group contains at least one group selected from the group consisting of crosslinkable groups represented by the formula (XL-1) to the formula (XL-19) in Group A:

(Group A)

[Chemical Formula 5]

(XL-1)

(XL-2)

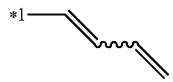

(XL-3)

(XL-4)

(XL-5)

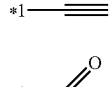

(XL-6)

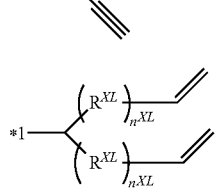

(XL-7)

-continued (XL-8) 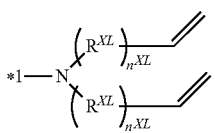

(XL-9) 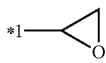

(XL-10) 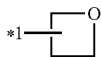

(XL-11) 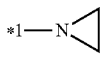

(XL-12) 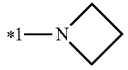

(XL-13) 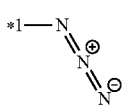

(XL-14) 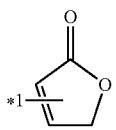

(XL-15) 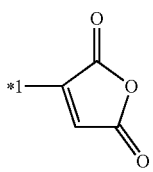

(XL-16) 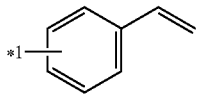

(XL-17) 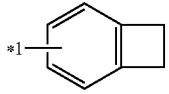

(XL-18) 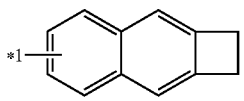

(XL-19) 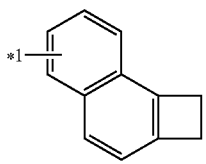

[wherein, $n^{XL}$ represents an integer of 0 or more and 5 or less. A plurality of $n^{XL}$ may be the same or different.

$R^{XL}$ represents a methylene group, an oxygen atom or a sulfur atom. When a plurality of $R^{XL}$ are present, they may be the same or different.

The wavy line indicates that the group having the wavy line is any one of a plurality of geometric isomers or contains a plurality of geometric isomers.

*1 represents a binding position.

The crosslinkable group in Group A optionally has a substituent, and when a plurality of the substituents are present, they may be combined together to form a ring together with carbon atoms to which they are attached.].

[6] The block copolymer according to [4], wherein the above-described crosslinkable group contains at least one group selected from the group consisting of a crosslinkable group represented by the following the formula (XL-1), a crosslinkable group represented by the following the formula (XL-16), a crosslinkable group represented by the following the formula (XL-17), a crosslinkable group represented by the following the formula (XL-18) and a crosslinkable group represented by the following the formula (XL-19).

[Chemical Formula 6]

(XL-1) 

(XL-16) 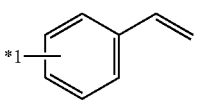

(XL-17) 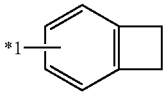

(XL-18) 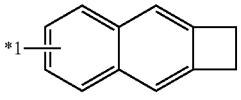

(XL-19) 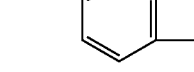

[wherein,

*1 represents a binding position.

The above-described crosslinkable group represented by the formula (XL-1), the formula (XL-16), the formula (XL-17), the formula (XL-18) or the formula (XL-19) optionally has a substituent, and when a plurality of the substituents are present, they may be combined together to form a ring together with carbon atoms to which they are attached.]

[7] The block copolymer according to any one of [1] to [6], wherein the above-described end group is an aryl group optionally having a substituent or a monovalent heterocyclic group optionally having a substituent.

[8] The block copolymer according to any one of [1] to [7], wherein the above-described block that does not bind to the end group contains the above-described non-crosslinkable constitutional unit represented by the formula (X).

[9] The block copolymer according to any one of [1] to [8], wherein the above-described block that does not bind to the end group further contains a non-crosslinkable constitutional unit represented by the following the formula (Y):

[Chemical Formula 7]

(Y)

[wherein, Ar$^{Y1}$ represents an arylene group optionally having a substituent.]

[10] The block copolymer according to any one of [1] to [8], wherein the above-described block that binds to the end group contains a non-crosslinkable constitutional unit represented by the following the formula (Y):

[Chemical Formula 8]

(Y)

[wherein, Ar$^{Y1}$ represents an arylene group optionally having a substituent.]

[11] The block copolymer according to any one of [1] to [10], wherein the above-described block that binds to the end group does not contain the above-described non-crosslinkable constitutional unit represented by the formula (X) or the above-described non-crosslinkable constitutional unit represented by the formula (Z).

[12] The block copolymer according to any one of [1] to [11], which satisfies the above-described the formula (i).

[13] The block copolymer according to any one of [1] to [12], comprising the above-described end group, the above-described block that binds to the end group, the above-described block that does not bind to the end group, the above-described block that binds to the end group and the above-described end group in this order.

[14] A composition comprising the block copolymer according to any one of [1] to [13] and at least one selected from the group consisting of a hole transporting material, a hole injection material, an electron transporting material, an electron injection material, a light emitting material, an antioxidant and a solvent.

[15] A light emitting device comprising a crosslinked product of the block copolymer according to any one of [1] to [13].

Effect of the Invention

According to the present invention, it is possible to provide a block copolymer which shows good hole transportability, a composition containing this block copolymer, and a light emitting device using this block copolymer.

MODES FOR CARRYING OUT THE INVENTION

Hereinafter, preferred embodiments of the present invention will be described in detail.
<Explanation of Common Terms>

Unless otherwise specified, the terms commonly used in the present specification will be described as follows with specific examples given as needed.

"Me" represents a methyl group, "Et" represents an ethyl group, "i-Pr" represents an isopropyl group, and "t-Bu" represents a tert-butyl group.

The hydrogen atom may be a heavy hydrogen atom or a light hydrogen atom.

In the formula representing a metal complex, the solid line representing a bond with a metal means a covalent bond or a coordination bond.

The "polymer compound" means a polymer having molecular weight distribution and having a polystyrene-equivalent number-average molecular weight of $1\times10^3$ or more and $1\times10^8$ or less.

The "low molecular weight compound" means a compound having no molecular weight distribution and having a molecular weight of $1\times10^4$ or less.

The "constitutional unit" means a unit occurring once or more times in the molecular chain of the polymer compound. In addition, the constitutional unit occurring twice or more times in the molecular chain of the polymer compound is particularly referred to as a "repeating unit".

The "block" refers to a block that constitutes a molecular chain of a polymer compound that is a block copolymer, and is a molecular chain portion (block) composed of one or more kinds of constitutional units.

The "block copolymer" means a polymer compound containing two or more types of blocks. In the block copolymer, it is preferable that adjacent blocks have different constitutions.

The "adjacent blocks have different constitutions" means, for example, that the constitutional units included in the blocks adjacent to each other are the same, but their compositions and/or chain distributions are different, and that at least one constitutional unit contained in one of adjacent blocks and at least one constitutional unit contained in the other are different. The adjacent block can be produced by, for example, a method in which one block (hereinafter, also referred to as "first block") is formed by polymerization, and then, the other block is formed, in the presence of the first block, by polymerization and bonded to the first block, and a method in which adjacent blocks are each independently formed, then, these blocks are combined.

The "crosslinkable group" is a group capable of forming a new bond by being subjected to heating, ultraviolet irradiation, near-ultraviolet irradiation, visible light irradiation, infrared irradiation, radical reaction and the like. The crosslinkable group preferably contains at least one structure selected from the group consisting of a carbon-carbon double bond, a carbon-carbon triple bond, oxirane, oxetane, aziridine, azetidine, azide, benzocyclobutene and naphthocyclobutene, as the crosslinkable site, because the polymer compound is excellent in crosslinkability.

The crosslinkable group having the above structure includes the above Group A, namely, crosslinkable groups represented by the formula (XL-1) to the formula (XL-19).

The "non-crosslinkable" constitutional unit denotes that the constitutional unit has no crosslinkable group.

The "alkyl group" may be any one linear or branched. The number of carbon atoms of the linear alkyl group, not including the number of carbon atoms of the substituent, is usually 1 or more and 50 or less, and preferably 1 or more and 20 or less. The number of carbon atoms of the branched alkyl group, not including the number of carbon atoms of the substituent, is usually 3 or more and 50 or less, and preferably 3 or more and 20 or less. The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propyl-heptyl group, a decyl group, a 3,7-dimethyloctyl group, a 2-ethyloctyl group, a 2-hexyldecyl group and a dodecyl group, and groups obtained by replacing a hydrogen atom in these groups with a cycloalkyl group, an alkoxy group, a cycloalkoxy group, an aryl group, a fluorine atom or the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group, and a 6-ethyloxyhexyl group).

The number of carbon atoms of the "cycloalkyl group", not including the number of carbon atoms of the substituent, is usually 3 or more and 50 or less, and preferably 4 or more and 20 or less. The cycloalkyl group optionally has a substituent, and examples thereof include a cyclohexyl group, a cyclohexylmethyl group, and a cyclohexylethyl group.

The "aryl group" means an atomic group remaining after removing from an aromatic hydrocarbon one hydrogen atom bonding directly to a carbon atom constituting the ring. The number of carbon atoms of the aryl group, not including the number of carbon atoms of the substituent, is usually 6 or more and 60 or less, preferably 6 or more and 20 or less, and more preferably 6 or more and 10 or less. The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, and a 4-phenylphenyl group, and groups obtained by replacing a hydrogen atom in these groups with an alkyl group, a cycloalkyl group, an alkoxy group, a cycloalkoxy group, an aryl group, a fluorine atom or the like.

The "alkoxy group" may be any of linear or branched. The number of carbon atoms of the linear alkoxy group, not including the number of carbon atoms of the substituent, is usually 1 or more and 40 or less, and preferably 1 or more and 10 or less. The number of carbon atoms of the branched alkoxy group, not including the number of carbon atoms of the substituent, is usually 3 or more and 40 or less, and preferably 3 or more and 10 or less. The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by replacing a hydrogen atom in these groups with a cycloalkyl group, an alkoxy group, a cycloalkoxy group, an aryl group, a fluorine atom or the like.

The number of carbon atoms of the "cycloalkoxy group", not including the number of carbon atoms of the substituent, is usually 3 or more and 40 or less, and preferably 4 or more and 10 or less. The cycloalkoxy group optionally has a substituent, and examples thereof include a cyclohexyloxy group.

The number of carbon atoms of the "aryloxy group", not including the number of carbon atoms of the substituent, is usually 6 or more and 60 or less, and preferably 6 or more and 20 or less. The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

The "p-valent heterocyclic group" (p represents an integer of 1 or more) means an atomic group remaining after removing from a heterocyclic compound p hydrogen atoms among hydrogen atoms bonding directly to carbon atoms or hetero atoms constituting the ring. Of the p-valent heterocyclic groups, "p-valent aromatic heterocyclic group" as an atomic group remaining after removing from an aromatic heterocyclic compound p hydrogen atoms among hydrogen atoms bonding directly to carbon atoms or hetero atoms constituting the ring is preferable.

The "aromatic heterocyclic compound" includes compounds in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and compounds in which an aromatic ring is condensed to a hetero ring even if the hetero ring itself shows no aromaticity such as phenoxazine, phenothiazine, dibenzoborole, dibenzosilole, benzopyran and the like.

The number of carbon atoms of the monovalent heterocyclic group, not including the number of carbon atoms of the substituent, is usually 2 to 60, and preferably 4 to 20. The monovalent heterocyclic group optionally has a substituent and examples thereof include a thienyl group, a pyrrolyl group, a furyl group, a pyridinyl group, a piperidinyl group, a quinolinyl group, an isoquinolinyl group, a pyridyl group and a triazinyl group, and groups obtained by replacing a hydrogen atom in these groups with an alkyl group, a cycloalkyl group, an alkoxy group, a cycloalkoxy group or the like.

The "halogen atom" include a fluorine atom, a chlorine atom, a bromine atom and an iodine atom.

The "amino group" optionally has a substituent, and a substituted amino group is preferred. The substituent which the amino group has is preferably an alkyl group, a cycloalkyl group, an aryl group or a monovalent heterocyclic group. The substituted amino group includes, for example, a dialkylamino group, a dicycloalkylamino group and a diarylamino group. The substituted amino group includes, more specifically, a dimethylamino group, a diethylamino group, a diphenylamino group, a bis(4-methylphenyl)amino group, a bis(4-tert-butylphenyl)amino group and a bis(3,5-di-tert-butylphenyl)amino group.

The "alkenyl group" may be any of linear or branched. The number of carbon atoms of the linear alkenyl group, not including the number of carbon atoms of the substituent, is usually 2 or more and 30 or less, and preferably 3 or more and 20 or less. The number of carbon atoms of the branched alkenyl group, not including the number of carbon atoms of the substituent, is usually 3 or more and 30 or less, and preferably 4 or more and 20 or less.

The number of carbon atoms of the "cycloalkenyl group", not including the number of carbon atoms of the substituent, is usually 3 or more and 30 or less, and preferably 4 or more and 20 or less.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

The "alkynyl group" may be any of linear or branched. The number of carbon atoms of the linear alkynyl group, not including the carbon atoms of the substituent, is usually 2 or more and 20 or less, and preferably 3 or more and 20 or less. The number of carbon atoms of the branched alkynyl group, not including the carbon atoms of the substituent, is usually 4 or more and 30 or less, and preferably 4 or more and 20 or less.

The number of carbon atoms of the "cycloalkynyl group", not including the carbon atoms of the substituent, is usually 4 or more and 30 or less, and preferably 4 or more and 20 or less.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

The "arylene group" means an atomic group remaining after removing from an aromatic hydrocarbon two hydrogen atoms bonding directly to carbon atoms constituting the ring. The number of carbon atoms of the arylene group, not including the number of carbon atoms of the substituent, is usually 6 or more and 60 or less, preferably 6 or more and 30 or less, and more preferably 6 or more and 18 or less. The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group and a dibenzocycloheptanediyl group, and these groups having a substituent, and groups represented the formula (A-1) to the formula (A-23) described below are preferable. The arylene group may be a group in which a plurality of these groups are bonded.

[Chemical Formula 9]

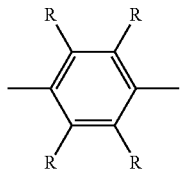
(A-1)

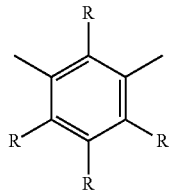
(A-2)

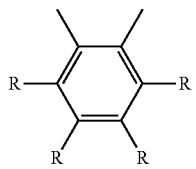
(A-3)

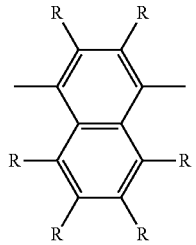
(A-4)

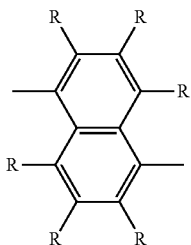
(A-5)

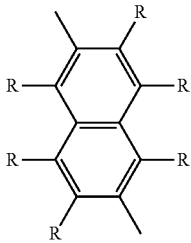
(A-6)

[Chemical Formula 10]

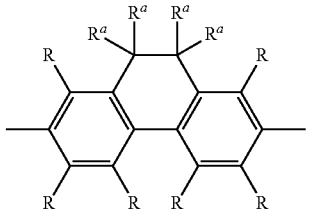
(A-7)

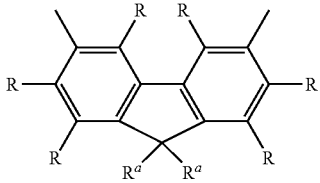
(A-8)

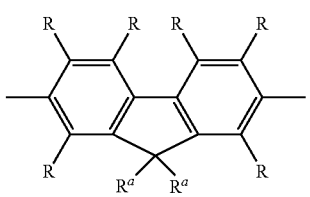
(A-9)

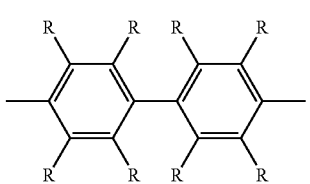
(A-10)

[Chemical Formula 11]
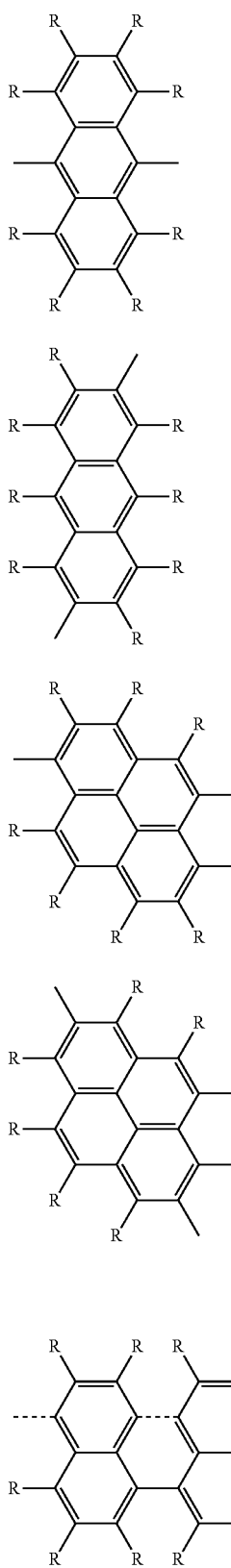
(A-11)
(A-12)
(A-13)
(A-14)
(A-15)
[Chemical Formula 12]
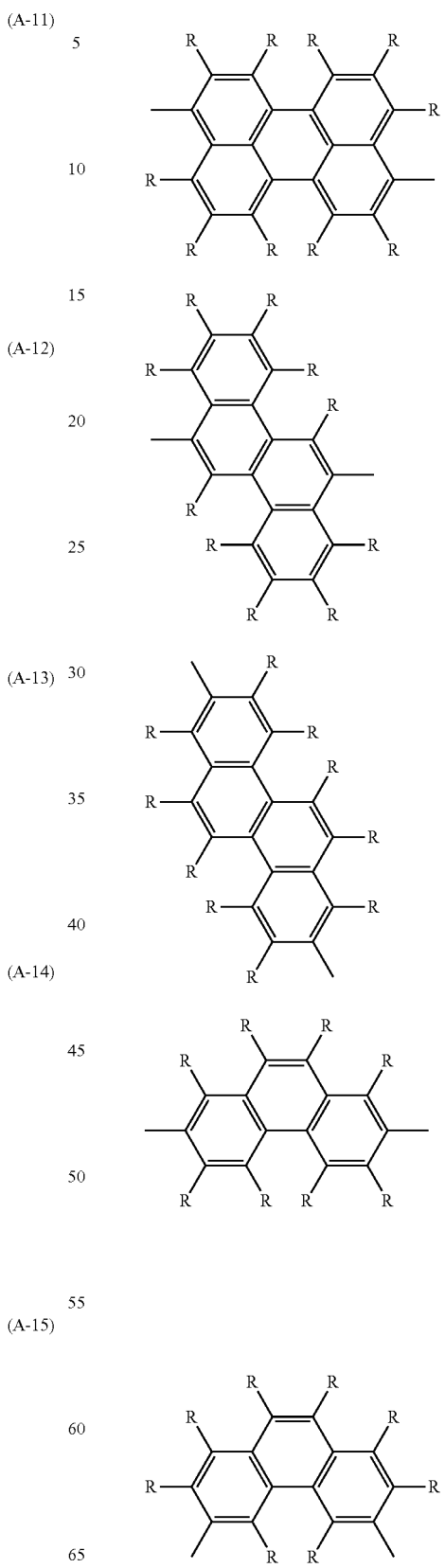
(A-16)
(A-17)
(A-18)
(A-19)
(A-20)

[Chemical Formula 13]

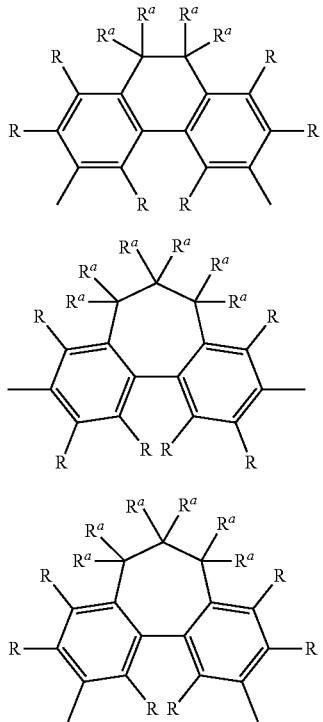

(A-21)

(A-22)

(A-23)

[wherein, R and Ra each independently represent a hydrogen atom, an alkyl group, a cycloalkyl group, an aryl group or a monovalent heterocyclic group. A plurality of R and Ra each may be the same or different, and the plurality of Ra may be combined together to form a ring together with atoms to which they are attached.]

The number of carbon atoms of the divalent heterocyclic group, not including the number of carbon atoms of the substituent, is usually 2 or more and 60 or less, preferably 3 or more and 20 or less, and more preferably 4 or more and 15 or less. The divalent heterocyclic group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, and groups represented by the formula (AA-1) to the formula (AA-34) described below are preferable. The divalent heterocyclic group may be a group in which a plurality of these groups are bonded.

[Chemical Formula 14]

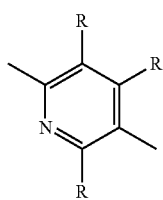

(AA-1)

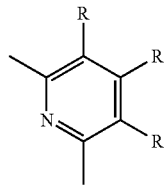

(AA-2)

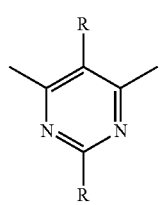

(AA-3)

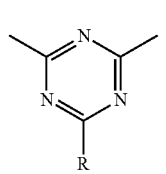

(AA-4)

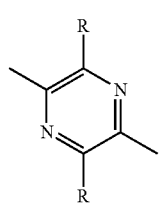

(AA-5)

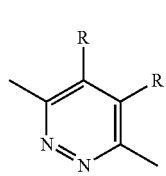

(AA-6)

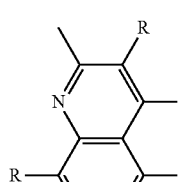

(AA-7)

[Chemical Formula 15]

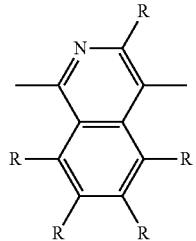

(AA-8)

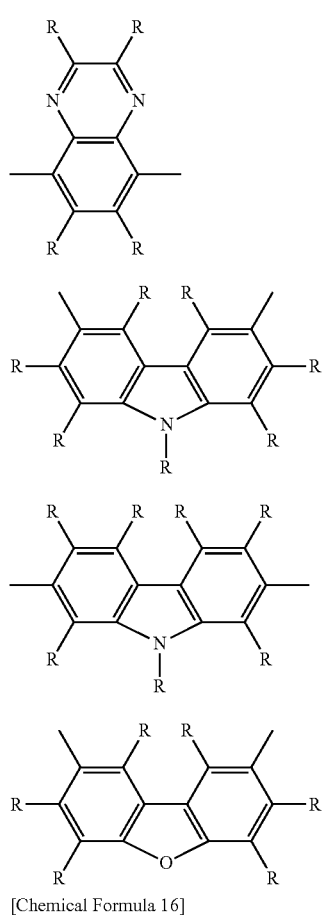
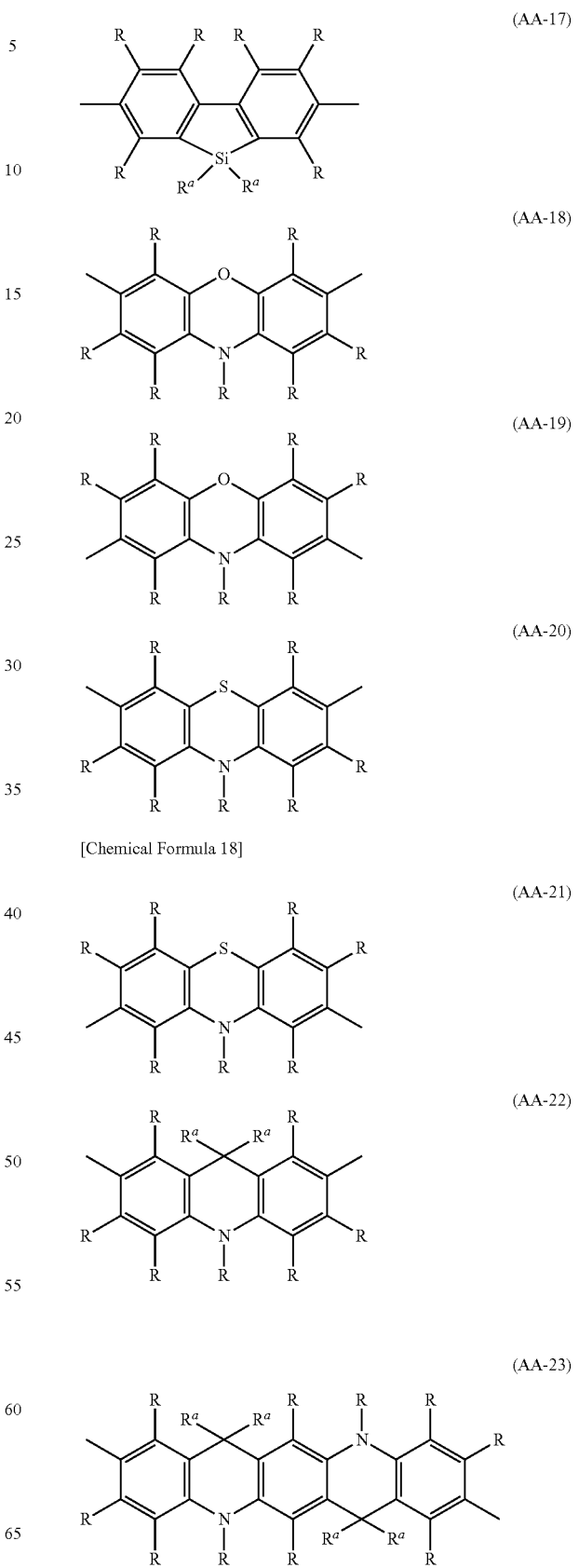

-continued (AA-24)
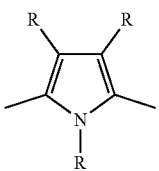

(AA-25)
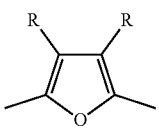

[Chemical Formula 19]

(AA-26)
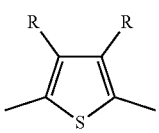

(AA-27)
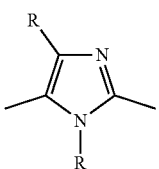

(AA-28)
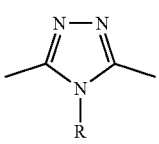

(AA-29)
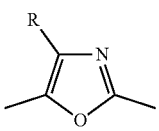

(AA-30)
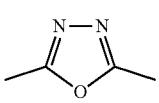

(AA-31)
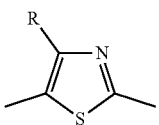

(AA-32)
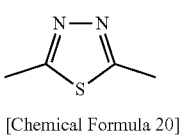

[Chemical Formula 20]

(AA-33)
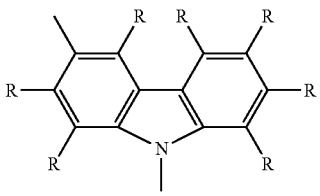

(AA-34)
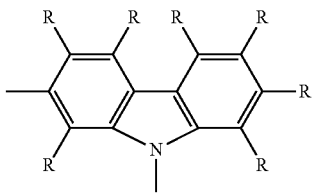

[wherein, R and Ra represent the same meaning as described above.]

The "substituent" means a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Constitutional Unit Represented by the Formula (X)>

The constitutional unit represented by the formula (X) is a non-crosslinkable constitutional unit.

The constitutional unit represented by the formula (X) is a constitutional unit which is useful for improving charge transportability (especially improving hole transportability).

In the above-described formula (X), $a^{X1}$ is preferably an integer of 0 or more and 5 or less, more preferably an integer of 0 or more and 2 or less, and further preferably 0 or 1, from the viewpoint of improving the charge transportability of the block copolymer according to the present invention (hereinafter, also simply referred to as "block copolymer").

$a^{X2}$ is preferably an integer of 0 or more and 5 or less, more preferably an integer of 0 or more and 2 or less, and further preferably 0, from the viewpoint of improving the charge transportability of the block copolymer.

$R^{X1}$, $R^{X2}$ and $R^{X3}$ are preferably aryl groups or monovalent heterocyclic groups, and more preferably aryl groups, and the foregoing groups optionally have a substituent.

The aryl group represented by $R^{X1}$, $R^{X2}$ and $R^{X3}$ is preferably a group obtained by removing from a benzene ring, a naphthalene ring, an anthracene ring, a phenanthrene ring, a dihydrophenanthrene ring, a naphthacene ring, a fluorene ring, a pyrene ring, a perylene ring or a chrysene ring one hydrogen atom bonding directly to a carbon atom constituting the ring, more preferably a group obtained by removing from a benzene ring, a naphthalene ring, a phenanthrene ring, a dihydrophenanthrene ring or a fluorene ring one hydrogen atom bonding directly to a carbon atom constituting the ring, further preferably a phenyl group or a fluorenyl group, and particularly preferably a phenyl group, and the foregoing groups optionally have a substituent.

The monovalent heterocyclic group represented by $R^{X1}$, $R^{X2}$ and $R^{X3}$ is preferably a group obtained by removing from a pyridine ring, a diazabenzene ring, a triazine ring, an azanaphthalene ring, a diazanaphthalene ring, a carbazole ring, a dibenzofuran ring, a dibenzothiophene ring, a phenoxazine ring, a phenothiazine ring or a dihydroacridine ring one hydrogen atom bonding directly to a carbon atom or a hetero atom constituting the ring, and more preferably a group obtained by removing from a pyridine ring, a diazabenzene ring, a triazine ring, a carbazole ring, a dibenzofuran ring or dibenzothiophene ring one hydrogen atom bonding directly to a carbon atom or a hetero atom constituting the ring, and the foregoing groups optionally have a substituent.

The arylene group represented by $Ar^{X1}$, $Ar^{X2}$, $Ar^{X3}$ and $Ar^{X4}$ is preferably a phenylene group, a naphthalenediyl group, an anthracenediyl group, a phenanthrenediyl group, a dihydrophenanthrenediyl group, a pyrenediyl group, a fluorenediyl group or a dibenzocycloheptanediyl group, more preferably a phenylene group, a naphthalenediyl group, a phenanthrenediyl group, a dihydrophenanthrenediyl group or a fluorenediyl group, and further preferably a phenylene group or a fluorenediyl group, and the foregoing groups optionally have a substituent, from the viewpoint of improving the charge transportability of the block copolymer.

The divalent heterocyclic group represented by $Ar^{X1}$, $Ar^{X2}$, $Ar^{X3}$ and $Ar^{X4}$ is preferably a group obtained by removing from a pyridine ring, a diazabenzene ring, a triazine ring, an azanaphthalene ring, a diazanaphthalene ring, a carbazole ring, a dibenzofuran ring, a dibenzothiophene ring, a phenoxazine ring, a phenothiazine ring or a dihydroacridine ring two hydrogen atoms bonding directly to carbon atoms or hetero atoms constituting the ring, and more preferably a group obtained by removing from a pyridine ring, a diazabenzene ring, a triazine ring, a carbazole ring, a dibenzofuran ring or a dibenzothiophene ring two hydrogen atoms bonding directly to carbon atoms or hetero atoms constituting the ring, and the foregoing groups optionally have a substituent.

The arylene group represented by $Ar^{X1}$ and $Ar^{X3}$ is preferably a group represented by the formula (A-1) to the formula (A-9) or the formula (A-19) to the formula (A-21), more preferably a group represented by the formula (A-1) to the formula (A-3), the formula (A-8) or the formula (A-9), further preferably a group represented by the formula (A-1) to the formula (A-3), and particularly preferably a group represented by the formula (A-1), from the viewpoint of improving the charge transportability of the block copolymer.

The divalent heterocyclic group represented by $Ar^{X1}$ and $Ar^{X3}$ is preferably a group represented by the formula (AA-1) to the formula (AA-15) or the formula (AA-18) to the formula (AA-22), and more preferably a group represented by the formula (AA-1) to the formula (AA-6) or the formula (AA-10) to the formula (AA-15), from the viewpoint of improving the charge transportability of the block copolymer.

$Ar^{X1}$ and $Ar^{X3}$ are each preferably an arylene group optionally having a substituent, from the viewpoint of improving the charge transportability of the block copolymer.

The arylene group represented by $Ar^{X2}$ and $Ar^{X4}$ is preferably a group represented by the formula (A-1) to the formula (A-14) or the formula (A-19) to the formula (A-23), more preferably a group represented by the formula (A-1) to the formula (A-10) or the formula (A-19) to the formula (A-21), further preferably a group represented by the formula (A-1) to the formula (A-3), the formula (A-6) to the formula (A-9) or the formula (A-19) to the formula (A-21), particularly preferably a group represented by the formula (A-1) to the formula (A-3), the formula (A-8) or the formula (A-9), and especially preferably a group represented by the formula (A-1) or the formula (A-9), from the viewpoint of improving the charge transportability of the block copolymer.

Preferable examples of the divalent heterocyclic group represented by $Ar^{X2}$ and $Ar^{X4}$ and the reasons therefor are the same as the preferable examples of the divalent heterocyclic group represented by $Ar^{X1}$ and $Ar^{X3}$ and the reasons therefor.

Preferable examples of the arylene group and the divalent heterocyclic group in the divalent group in which at least one arylene group and at least one divalent heterocyclic group are bonded directly represented by $Ar^{X2}$ and $Ar^{X4}$ are the same as the preferable examples of the arylene group and the divalent heterocyclic group represented by $Ar^{X2}$ and $Ar^{X4}$.

The divalent group in which at least one arylene group and at least one divalent heterocyclic group are bonded directly represented by $Ar^{X2}$ and $Ar^{X4}$ includes, for example, groups represented by the following formulae, and the foregoing groups optionally have a substituent.

[Chemical Formula 21]

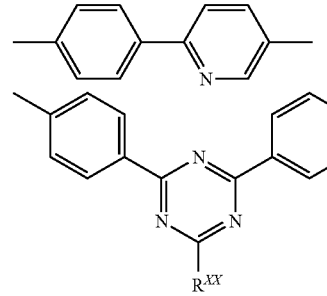

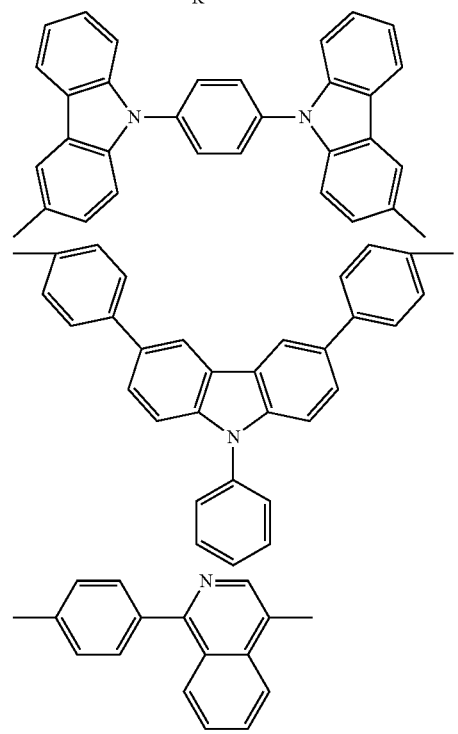

[wherein, $R^{XX}$ represents a hydrogen atom, an alkyl group, a cycloalkyl group, an aryl group or a monovalent heterocyclic group, and the foregoing groups optionally have a substituent.]

$R^{XX}$ is preferably an alkyl group, a cycloalkyl group or an aryl group, and the foregoing groups optionally have a substituent.

$Ar^{X2}$ and $Ar^{X4}$ are preferably arylene groups optionally having a substituent, from the viewpoint of improving the charge transportability of the block copolymer.

The substituent which the groups represented by $Ar^{X1}$ to $Ar^{X4}$ and RI to $R^{X3}$ optionally have is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group, a monovalent heterocyclic group or a substituted amino group, further preferably an alkyl group, a cycloalkyl group or an aryl group, and particularly preferably an alkyl group, and the foregoing groups optionally further have a substituent.

Examples and preferable examples of the aryl group and the monovalent heterocyclic group as the substituent which the groups represented by $Ar^{X1}$ to $Ar^{X4}$ and $R^{X1}$ to $R^{X3}$ optionally have are the same as the examples and preferable examples of the aryl group and the monovalent heterocyclic group represented by $R^{X1}$, $R^{X2}$ and $R^{X3}$, respectively.

In the substituted amino group as the substituent which the groups represented by $Ar^{X1}$ to $Ar^{X4}$ and $R^{X1}$ to $R^{X3}$ optionally have, the substituent which the amino group has is preferably an aryl group or a monovalent heterocyclic group, and more preferably an aryl group, and the foregoing groups optionally further have a substituent. Examples and preferable examples of the aryl group as the substituent which the amino group has are the same as the examples and preferable examples of the aryl group represented by $R^{X1}$, $R^{X2}$ and $R^{X3}$. Examples and preferable examples of the monovalent heterocyclic group as the substituent which the amino group has are the same as the examples and preferable examples of the monovalent heterocyclic group represented by $R^{X1}$, $R^{X2}$ and $R^{X3}$.

The substituent which the substituent which the groups represented by $Ar^{X1}$ to $Ar^{X4}$ and $R^{X1}$ to $R^{X3}$ optionally have optionally further has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group or a monovalent heterocyclic group, and further preferably an alkyl group or a cycloalkyl group, and the foregoing groups optionally further have a substituent, but preferably have no substituent.

Examples and preferable examples of the aryl group, the monovalent heterocyclic group and the substituted amino group as the substituent which the substituent which the groups represented by $Ar^{X1}$ to $Ar^{X4}$ and $R^{X1}$ to $R^{X3}$ optionally have optionally further has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

The constitutional unit represented by the formula (X) is preferably a constitutional unit represented by the following formula (X-1) to formula (X-7), and more preferably a constitutional unit represented by the formula (X-1) to the formula (X-6).

[Chemical Formula 22]

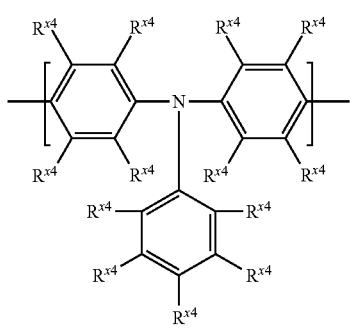

(X-1)

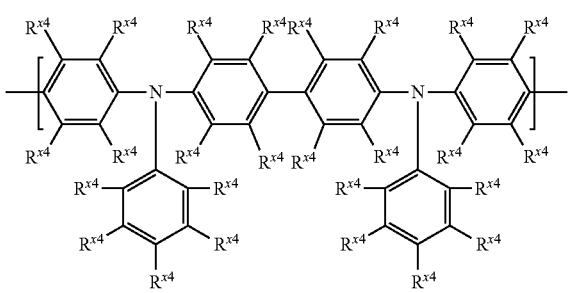

(X-2)

[Chemical Formula 23]

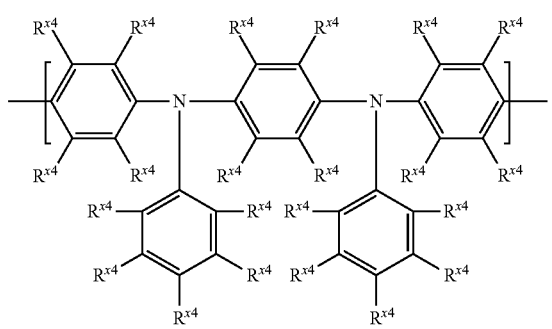

(X-3)

[Chemical Formula 24]

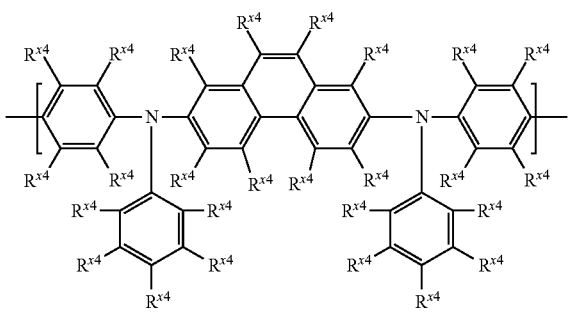

(X-4)

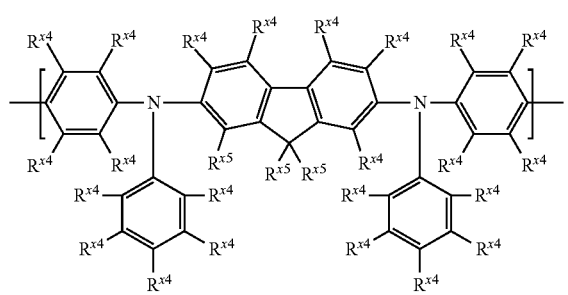

(X-5)

-continued

[Chemical Formula 25]

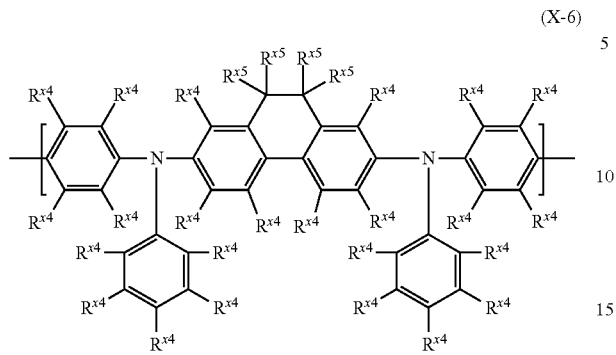

(X-6)

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group, a cyano group or a substituted amino group, and the foregoing groups optionally have a substituent. A plurality of $R^{X4}$ may be the same or different. A plurality of $R^{X5}$ may be the same or different, and groups $R^{X5}$ (preferably adjacent groups $R^{X5}$) may be combined together to form a ring together with carbon atoms to which they are attached.]

$R^{X4}$ and $R^{X5}$ are each preferably a hydrogen atom, an alkyl group, a cycloalkyl group, an aryl group, a monovalent heterocyclic group or a substituted amino group, more preferably a hydrogen atom, an alkyl group, a cycloalkyl group or an aryl group, and further preferably a hydrogen atom or an alkyl group, and the foregoing groups optionally have a substituent.

Examples and preferable examples of the aryl group, the monovalent heterocyclic group and the substituted amino group represented by $R^{X4}$ and $R^{X5}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the groups represented by $R^{X4}$ and $R^{X5}$ optionally have are the same as the examples and preferable examples of the substituent which the groups represented by $Ar^{X1}$ to $Ar^{X4}$ and $R^{X1}$ to $R^{X3}$ optionally have.

The constitutional unit represented by the formula (X) includes, for example, constitutional units represented by the formula (X1-1) to the formula (X1-19) described below.

[Chemical Formula 26]

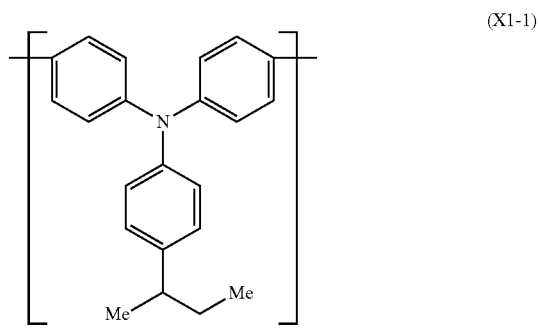

(X1-1)

(X1-2)

(X1-3)

[Chemical Formula 27]

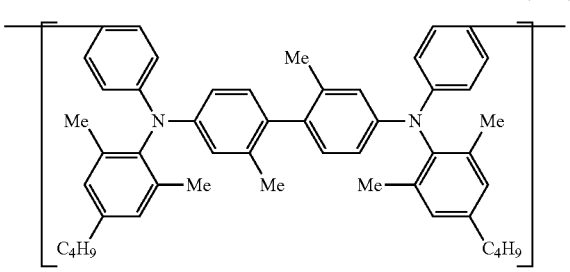

(X1-4)

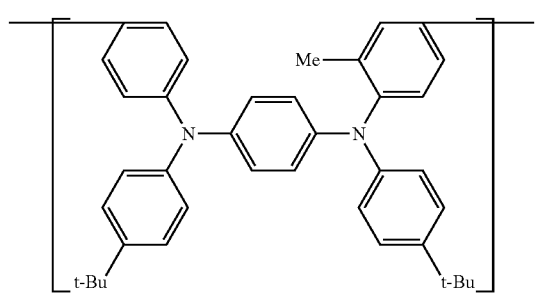

(X1-5)

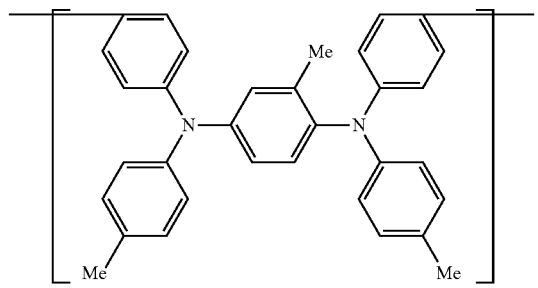

[Chemical Formula 28]
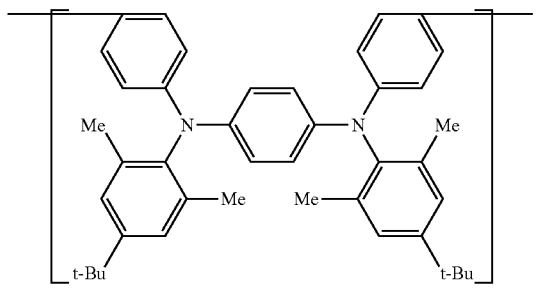
(X1-6)
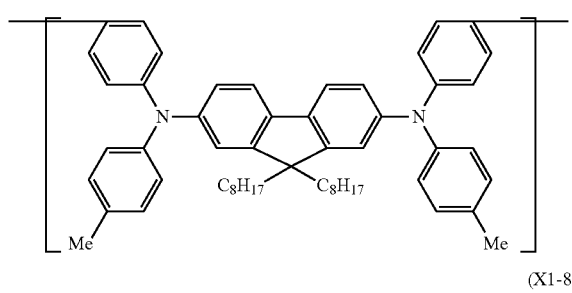
(X1-7)
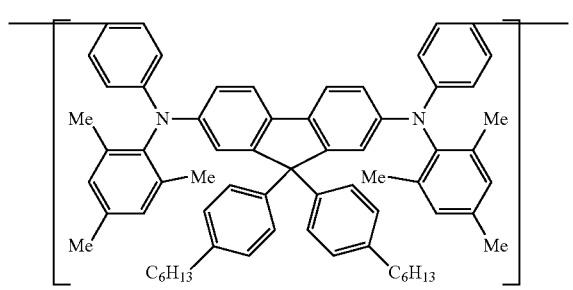
(X1-8)
[Chemical Formula 29]
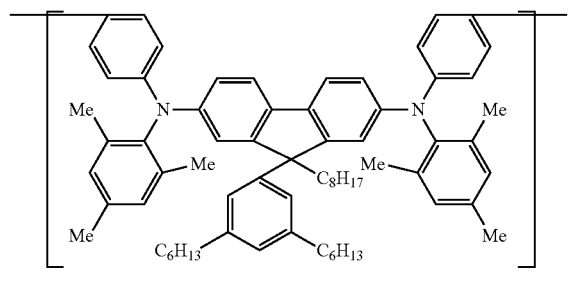
(X1-9)
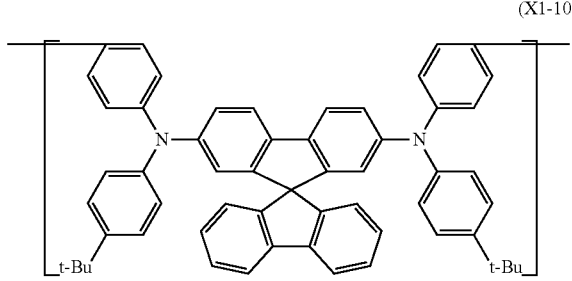
(X1-10)
[Chemical Formula 30]
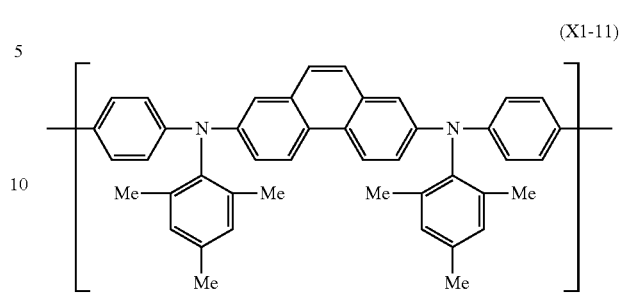
(X1-11)
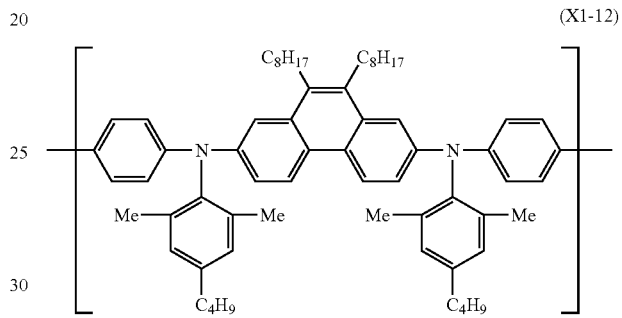
(X1-12)
[Chemical Formula 31]
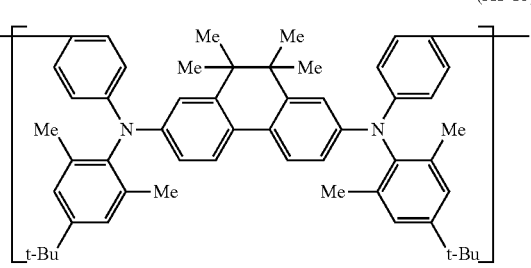
(X1-13)
(X1-14)

[Chemical Formula 32]

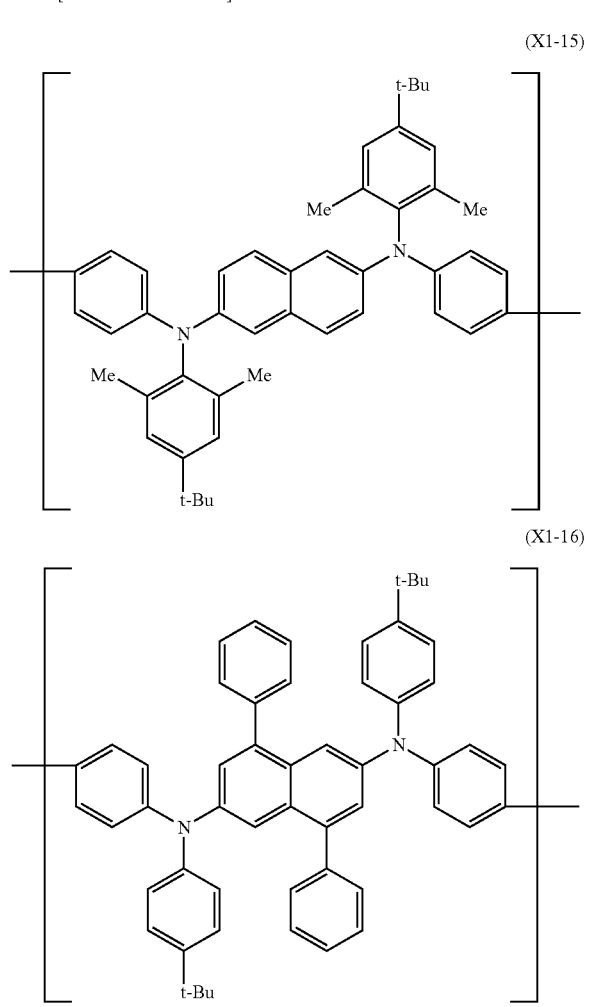

(X1-15)

(X1-16)

[Chemical Formula 33]

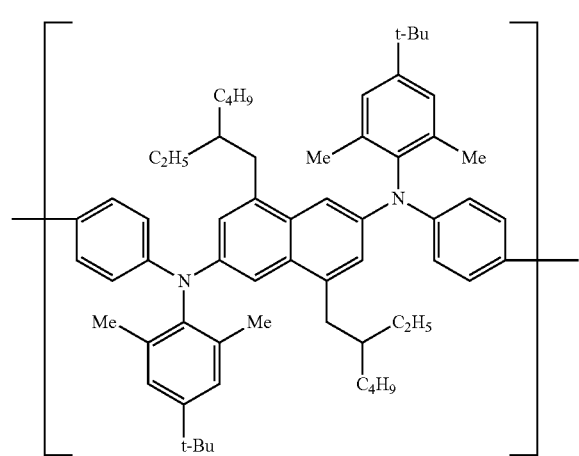

(X1-17)

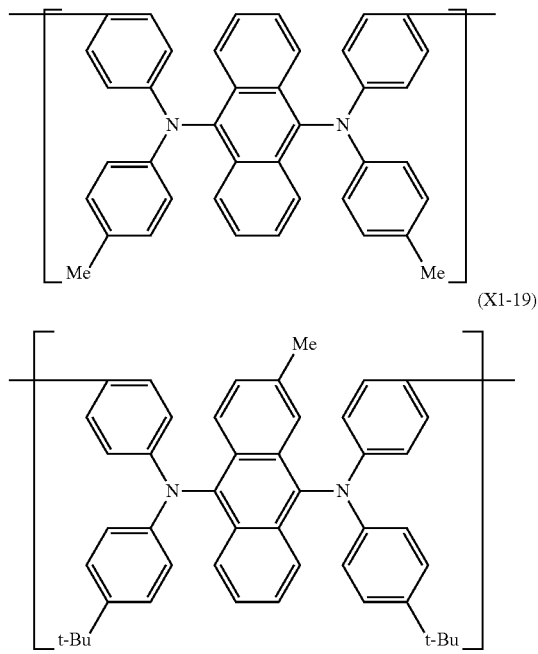

(X1-18)

(X1-19)

<Constitutional Unit Represented by the Formula (Z)>

The constitutional unit represented by the formula (Z) is a non-crosslinkable constitutional unit.

The number of carbon atoms of the divalent heterocyclic group represented by $Ar^Z$, not including the number of carbon atoms of the substituent, is usually 2 or more and 60 or less, preferably 2 or more and 30 or less, and more preferably 3 or more and 15 or less.

The number of hetero atoms of the divalent heterocyclic group represented by $Ar^Z$, not including the number of hetero atoms of the substituent, is usually 1 or more and 30 or less, preferably 1 or more and 10 or less, more preferably 1 or more and 5 or less, and further preferably 1 or more and 3 or less.

The divalent heterocyclic group represented by $Ar^Z$ is preferably a group obtained by removing from a hetero ring containing as the ring constituent atom at least one hetero atom selected from the group consisting of a boron atom, a nitrogen atom, an oxygen atom, a silicon atom, a phosphorus atom, a sulfur atom and a selenium atom two hydrogen atoms bonding directly to carbon atoms or hetero atoms constituting the ring, more preferably a group obtained by removing from a hetero ring containing as the ring constituent atom at least one hetero atom selected from the group consisting of a nitrogen atom, an oxygen atom and a sulfur atom two hydrogen atoms bonding directly to carbon atoms or hetero atoms constituting the ring, and further preferably a group obtained by removing from a hetero ring containing as the ring constituent atom a nitrogen atom two hydrogen atoms bonded directly to carbon atoms or hetero atoms constituting the ring (hereinafter, referred to also as "divalent nitrogen-containing heterocyclic group"), and the foregoing groups optionally have a substituent.

Regarding the divalent heterocyclic group represented by $Ar^Z$, the divalent heterocyclic group other than the divalent nitrogen-containing heterocyclic group includes, for example, groups obtained by removing from a borole ring, a furan ring, a silole ring, a phosphole ring, a thiophene ring, a selenophene ring, a benzofuran ring, a benzothiophene ring, dibenzoborole ring, a dibenzofuran ring, a dibenzosilole ring, a dibenzophosphole ring, a dibenzothiophene ring or a dibenzoselenophene ring two hydrogen atoms bonding directly to carbon atoms or hetero atoms constituting the ring, and is, from the standpoint of improving the charge transportability of the block copolymer, preferably a group obtained by removing from a furan ring, a thiophene ring, a benzofuran ring, a benzothiophene ring, a dibenzofuran ring or a dibenzothiophene ring two hydrogen atoms bonding directly to carbon atoms or hetero atoms constituting the ring, and more preferably a group represented by the formula (AA-12) to the formula (AA-15), and the foregoing groups optionally have a substituent.

Regarding the divalent heterocyclic group represented by $Ar^Z$, the divalent nitrogen-containing heterocyclic group is preferably a divalent nitrogen-containing heterocyclic group containing a nitrogen atom having no double bond as the ring constituent atom and not containing a nitrogen atom having a double bond as the ring constituent atom (hereinafter, referred to also as "divalent nitrogen-containing heterocyclic group containing nitrogen atom having no double bond"), and this group optionally has a substituent, from the standpoint of improving the charge transportability, especially the hole transportability of the block copolymer. Further, regarding the divalent heterocyclic group represented by $Ar^Z$, the divalent nitrogen-containing heterocyclic group is preferably a divalent nitrogen-containing heterocyclic group containing a nitrogen atom having a double bond as the ring constituent atom (hereinafter, referred to also as "divalent nitrogen-containing heterocyclic group containing nitrogen atom having double bond"), and this group optionally has a substituent, from the standpoint of improving the charge transportability, especially the hole transportability of the block copolymer.

The "nitrogen atom having no double bond" means a nitrogen atom having only a single bond between the nitrogen atom and all the atoms bonded to the nitrogen atom.

The phrase "containing a nitrogen atom having no double bond as the ring constituent atom" means that $-N(-R^N)-$ [wherein, $R^N$ represents a hydrogen atom or a substituent] or a group represented by the following formula is contained in the ring.

[Chemical Formula 34]

The divalent nitrogen-containing heterocyclic group containing a nitrogen atom having no double bond includes, for example, groups obtained by removing from a pyrrole ring, an indole ring, an isoindole ring, a carbazole ring, a dihydroacridine ring, a 5,10-dihydrophenazine ring, an acridone ring, a quinacridone ring, a phenoxazine ring, a phenothiazine ring, an indolocarbazole ring or an indenocarbazole ring two hydrogen atoms bonding directly to carbon atoms or hetero atoms constituting the ring, and is, from the standpoint of improving the charge transportability, especially the hole transportability of the block copolymer, preferably a group obtained by removing from a carbazole ring, a dihydroacridine ring, a 5,10-dihydrophenazine ring, a phenoxazine ring, a phenothiazine ring, an indolocarbazole ring or an indenocarbazole ring two hydrogen atoms bonding directly to carbon atoms or hetero atoms constituting the ring, more preferably a group obtained by removing from a carbazole ring, a dihydroacridine ring, a 5,10-dihydrophenazine ring, a phenoxazine ring or a phenothiazine ring two hydrogen atoms bonding directly to carbon atoms or hetero atoms constituting the ring, further preferably a group obtained by removing from a carbon atom, a phenoxazine ring or a phenothiazine ring two hydrogen atoms bonding directly to carbon atoms or hetero atoms constituting the ring, and particularly preferably a group represented by the formula (AA-10), the formula (AA-11) or the formula (AA-18) to the formula (AA-21), and the foregoing groups optionally have a substituent.

The "nitrogen atom having a double bond" means a nitrogen atom having a double bond between the nitrogen atom and the atom bonded to the nitrogen atom.

The phrase "containing a nitrogen atom having a double bond as the ring constituent atom" means that a group represented by $-N=$ is contained in the ring.

The divalent nitrogen-containing heterocyclic group containing a nitrogen atom having a double bond includes, for example, groups obtained by removing from a diazole ring, a triazole ring, an oxadiazole ring, a thiadiazole ring, a thiazole ring, an oxazole ring, a benzodiazole ring, a benzotriazole ring, a benzooxadiazole ring, a benzothiadiazole ring, an azacarbazole ring, a diazacarbazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring or a triazaphenanthrene ring two hydrogen atoms bonding directly to carbon atoms or hetero atoms constituting the ring, and is, from the standpoint of improving the charge transportability, especially the electron transportability of the block copolymer, preferably a group obtained by removing from a pyridine ring, a diazabenzene ring, a triazine ring, an azanaphthalene ring, a diazanaphthalene ring, an azaanthracene ring, a diazaanthracene ring, an azaphenanthrene ring or a diazaphenanthrene ring two hydrogen atoms bonding directly to carbon atoms constituting the ring, more preferably a group obtained by removing from a pyridine ring, a diazabenzene ring or triazine ring two hydrogen atoms bonding directly to carbon atoms constituting the ring, further preferably a group represented by the formula (AA-1) to the formula (AA-4), and particularly preferably a group represented by the formula (AA-4), and the foregoing groups optionally have a substituent.

Examples and preferable examples of the arylene group in the divalent group in which at least one arylene group and at least one divalent heterocyclic group are bonded directly represented by $Ar^Z$ are the same as the examples and preferable examples of the arylene group represented by $Ar^{X1}$ and $Ar^{X3}$.

Examples and preferable examples of the divalent heterocyclic group in the divalent group in which at least one arylene group and at least one divalent heterocyclic group are bonded directly represented by $Ar^Z$ are the same as the examples and preferable examples of the divalent heterocyclic group represented by $Ar^Z$.

Examples of the divalent group in which at least one arylene group and at least one divalent heterocyclic group are bonded directly represented by $Ar^Z$ include, for example, examples of the divalent group in which at least one arylene group and at least one divalent heterocyclic group are bonded directly represented by $Ar^{X2}$ and $Ar^{X4}$.

The substituent which the group represented by $Ar^Z$ optionally has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group or a monovalent heterocyclic group, and further preferably an alkyl group or an aryl group, and the foregoing groups optionally further have a substituent.

Examples and preferable examples of the aryl group, the monovalent heterocyclic group and the substituted amino group as the substituent which the group represented by $Ar^Z$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^Z$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

The constitutional unit represented by the formula (Z) is, from the viewpoint of improving the charge transportability, particularly the electron transportability of the block copolymer, preferably a constitutional unit represented by the following formula (Z-1) to formula (Z-4). Further, the constitutional unit represented by the formula (Z) is, from the viewpoint of improving the charge transportability, particularly the hole transportability of the block copolymer, preferably a constitutional unit represented by the following formula (Z-5) to formula (Z-7).

[Chemical Formula 35]

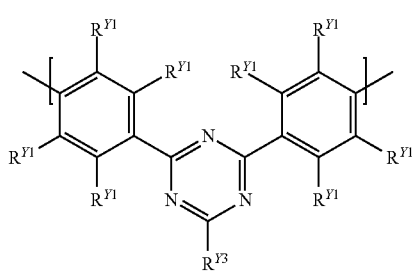

(Z-1)

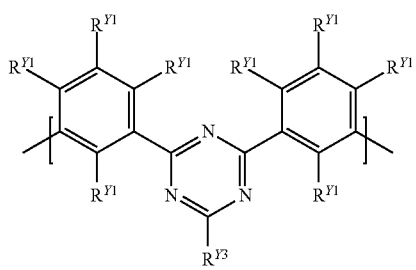

(Z-2)

[Chemical Formula 36]

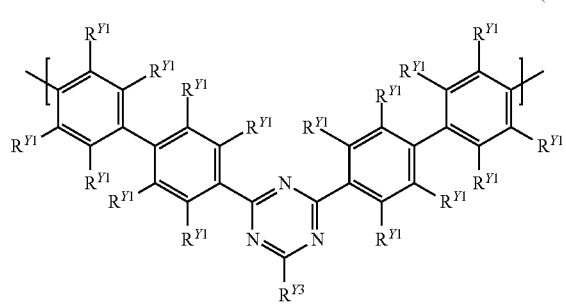

(Z-3)

-continued

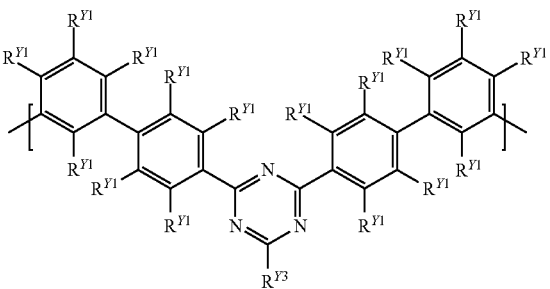

(Z-4)

[wherein, $R^{Y1}$ and $R^{Y3}$ each independently represent a hydrogen atom, a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y1}$ may be the same or different and may be combined together to form a ring together with carbon atoms to which they are attached.]

$R^{Y1}$ is preferably a hydrogen atom, an alkyl group, a cycloalkyl group, an aryl group or a monovalent heterocyclic group, more preferably a hydrogen atom, an alkyl group, a cycloalkyl group or an aryl group, and further preferably a hydrogen atom or an alkyl group, and the foregoing groups optionally have a substituent.

$R^{Y3}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

Examples and preferable examples of the aryl group, the monovalent heterocyclic group and the substituted amino group as the group represented by $R^{Y1}$ and $R^{Y3}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{Y3}$ optionally have, respectively.

Examples and preferable examples of the substituent which $R^{Y1}$ and $R^{Y3}$ optionally have are the same as the examples and preferable examples of the substituent which the groups represented by $Ar^{X1}$ to $Ar^{X4}$ and $R^{X1}$ to $R^{X3}$ optionally have.

The constitutional unit represented by the formula (Z-1) is preferably a constitutional unit represented by the following the formula (Z-1'). Further, the constitutional unit represented by the formula (Z-3) is preferably a constitutional unit represented by the following the formula (Z-3').

[Chemical Formula 37]

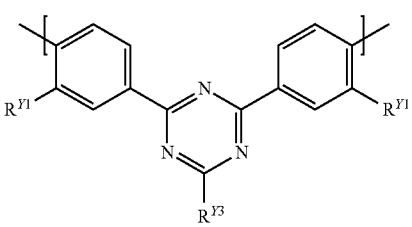

(Z-1')

-continued

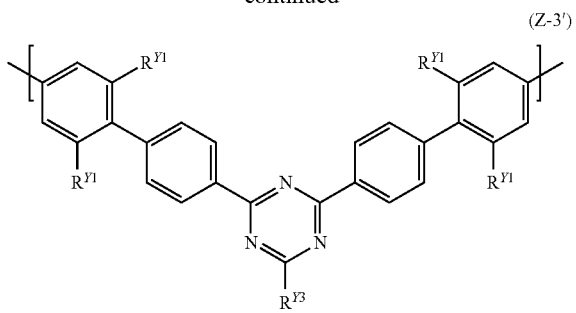
(Z-3′)

[wherein, $R^{Y1}$ and $R^{Y3}$ represent the same meaning as described above.]

[Chemical Formula 38]

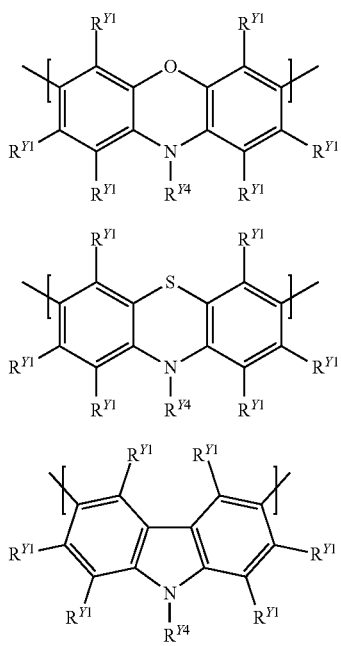

(Z-5)

(Z-6)

(Z-7)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent.]

$R^{Y4}$ is preferably an alkyl group, a cycloalkyl group, an aryl group or a monovalent heterocyclic group, more preferably an aryl group or a monovalent heterocyclic group, and further preferably an aryl group, and the foregoing groups optionally have a substituent.

Examples and preferable examples of the aryl group and the monovalent heterocyclic group as the group represented by $R^{Y4}$ are the same as the examples and preferable examples of the aryl group and the monovalent heterocyclic group as the substituent which the groups represented by $Ar^{X1}$ to $Ar^{X4}$ and $R^{X1}$ to $R^{X3}$ optionally have, respectively.

Examples and preferable examples of the substituent which $R^{Y4}$ optionally has are the same as the examples and preferable examples of the substituent which the groups represented by $Ar^{X1}$ to $Ar^{X4}$ and $R^{X1}$ to $R^{X3}$ optionally have.

The constitutional unit represented by the formula (Z) includes, for example, constitutional units composed of a divalent heterocyclic group represented by the following formula (Z-201) to formula (Z-215), and constitutional units composed of a divalent group in which at least one arylene group and at least one divalent heterocyclic group are bonded directly represented by the following formula (Z-301) to formula (Z-310).

[Chemical Formula 39]

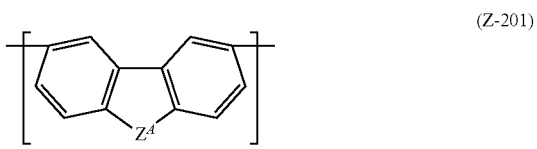
(Z-201)

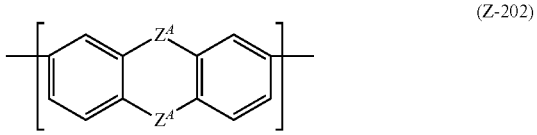
(Z-202)

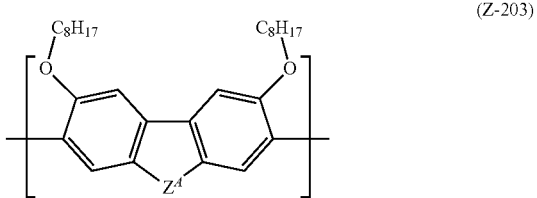
(Z-203)

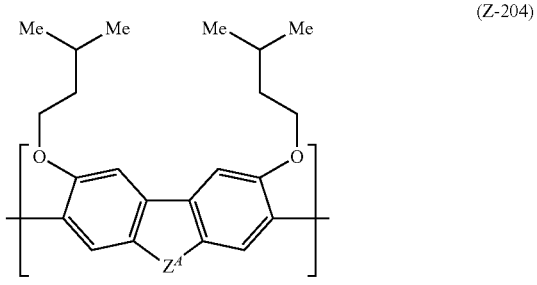
(Z-204)

[Chemical Formula 40]

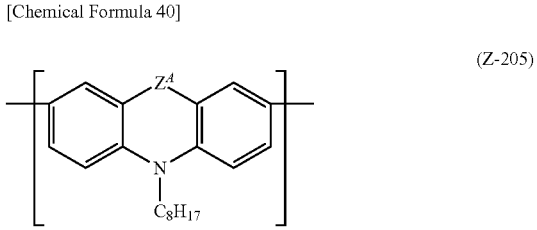
(Z-205)

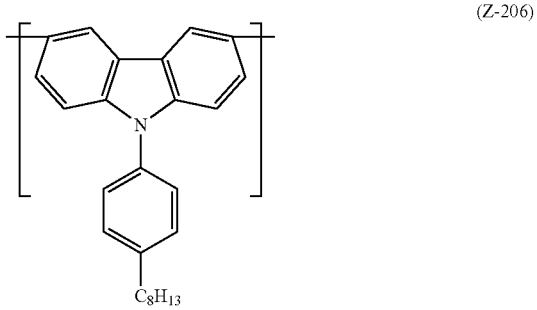
(Z-206)

(Z-207)
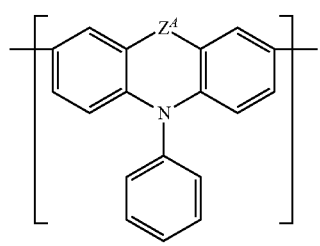
(Z-208)
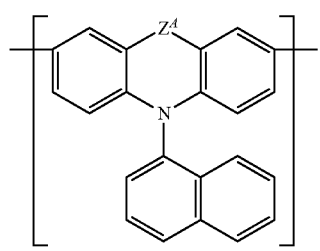
(Z-209)
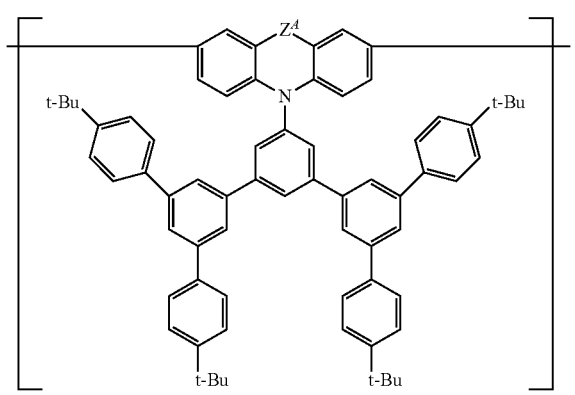
(Z-210)
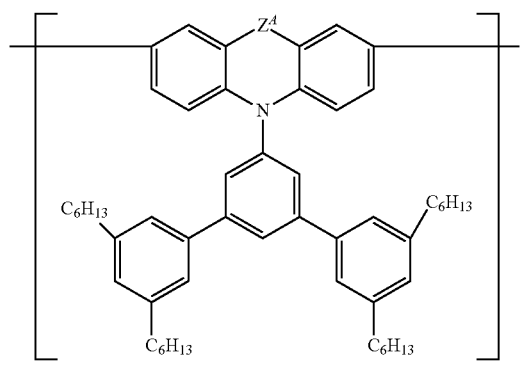
[Chemical Formula 41]
(Z-211)
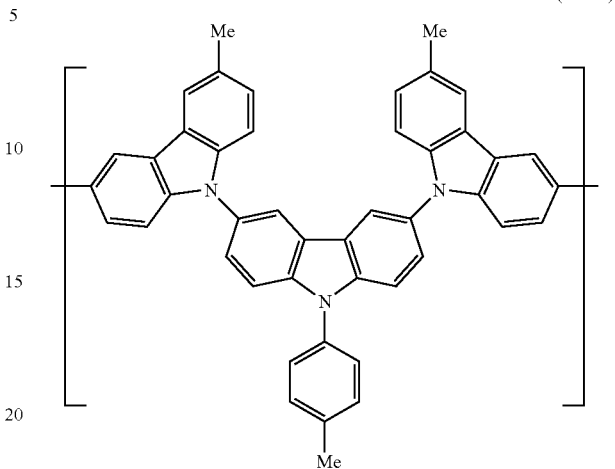
(Z-212)
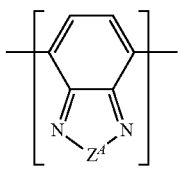
(Z-213)
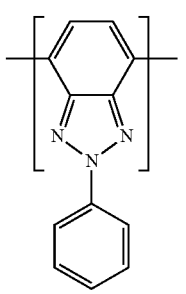
(Z-214)
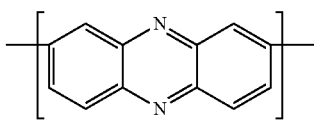
(Z-215)
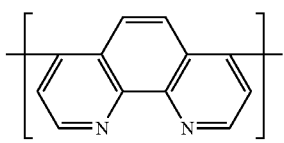
[Chemical Formula 42]
(Z-301)
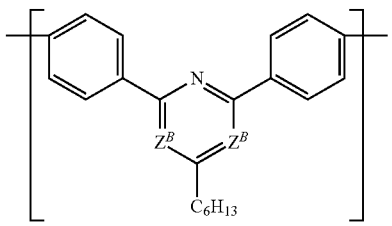

(Z-302) 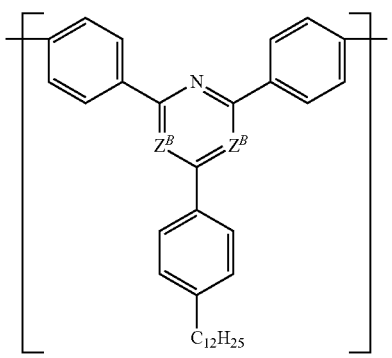
(Z-303) 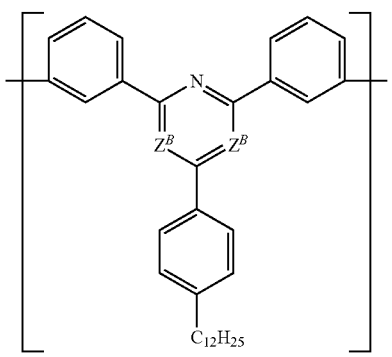
(Z-304) 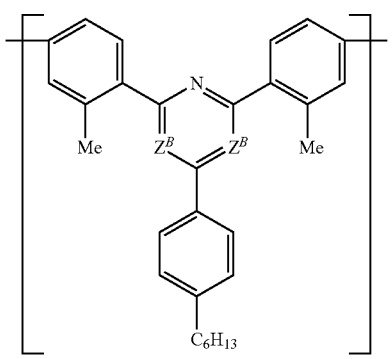
[Chemical Formula 43]
(Z-305) 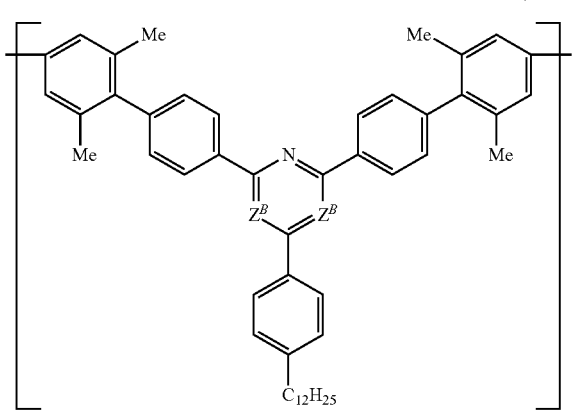
(Z-306) 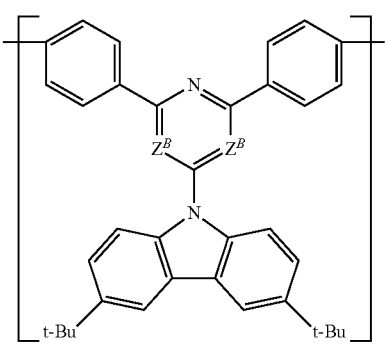
(Z-307) 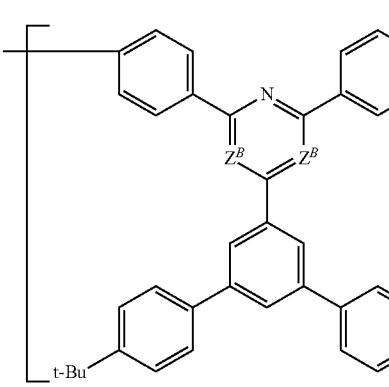
[Chemical Formula 44]
(Z-308) 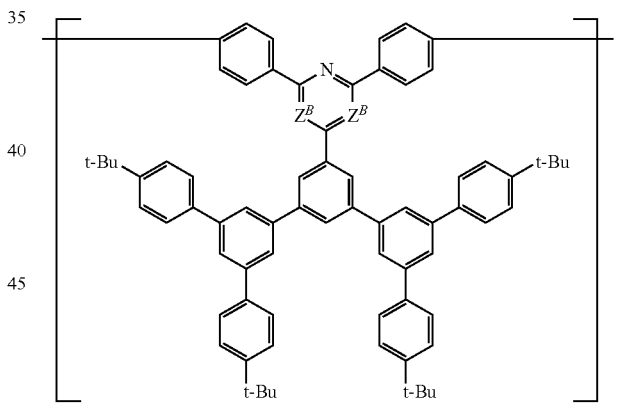
(Z-309) 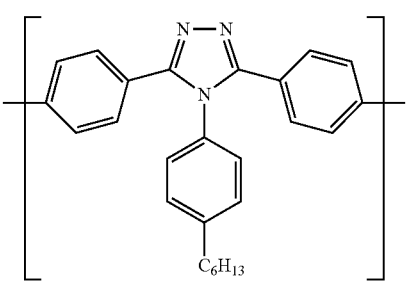

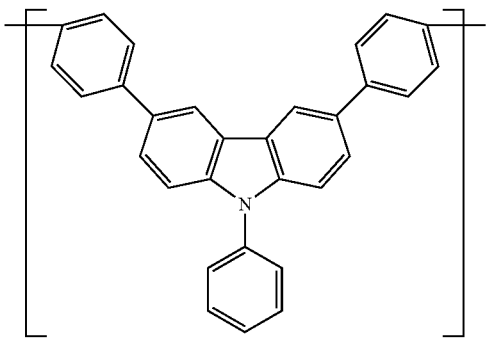

(Z-310)

[wherein, $Z^A$ represents a group represented by —O— or a group represented by —S—. When a plurality of $Z^A$ are present, they may be the same or different.

$Z^B$ represents a group represented by —CH= or a group represented by —N=. When a plurality of $Z^B$ are present, they may be the same or different.]

$Z^A$ is preferably a group represented by —O—. $Z^B$ is preferably a group represented by —N=.

<Constitutional Unit Represented by the Formula (Y)>

The constitutional unit represented by the formula (Y) is a non-crosslinkable constitutional unit.

The group represented by $Ar^{Y1}$ is, from the viewpoint of improving the charge transportability of the block copolymer, preferably a phenylene group, a naphthalenediyl group, an anthracenediyl group, a phenanthrendiyl group, a dihydrophenanthrenediyl group, a pyrenediyl group, a fluorenediyl group or a dibenzocycloheptanediyl group, more preferably a phenylene group, a naphthalenediyl group, an anthracenediyl group, a phenanthrenediyl group, a dihydrophenanthrenediyl group or a fluorenediyl group, and further preferably a phenylene group, an anthracenediyl group or a fluorenediyl group, and the foregoing groups optionally have a substituent.

The substituent which the group represented by $Ar^{Y1}$ optionally has is preferably a fluorine atom, an alkyl group, a cycloalkyl group, an aryl group, a monovalent heterocyclic group, an alkoxy group, a cycloalkoxy group or a substituted amino group, more preferably an alkyl group, a cycloalkyl group, an aryl group, a monovalent heterocyclic group or a substituted amino group, and further preferably an alkyl group or an aryl group, and these groups are further substituted groups.

Examples and preferable examples of the aryl group, the monovalent heterocyclic group and the substituted amino group as the substituent which the group represented by $Ar^{Y1}$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^{Y1}$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

From the viewpoint of improving the charge transportability of the block copolymer, the constitutional unit represented by the formula (Y) is preferably a constitutional unit represented by the formula (Y-1) to the formula (Y-3), and more preferably a constitutional unit represented by the formula (Y-1) or the formula (Y-2).

[Chemical Formula 45]

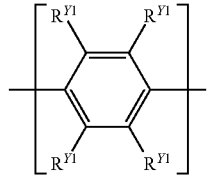

(Y-1)

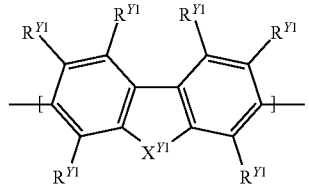

(Y-2)

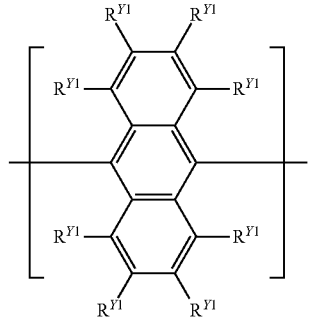

(Y-3)

[wherein, $R^{Y1}$ represents the same meaning as described above.

$X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y2}$ may be the same or different, and groups $R^{Y2}$ may be combined together to form a ring together with carbon atoms to which they are attached.]

$R^{Y2}$ is preferably an alkyl group, a cycloalkyl group, an aryl group, a monovalent heterocyclic group or a substituted amino group, and more preferably an alkyl group, a cycloalkyl group or an aryl group, and the foregoing groups optionally have a substituent.

Examples and preferable examples of the aryl group, the monovalent heterocyclic group and the substituted amino group as the group represented by $R^{Y2}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which $R^{Y2}$ optionally has are the same as the examples and preferable examples of the substituent which the groups represented by $Ar^{X1}$ to $Ar^{X4}$ and $R^{X1}$ to $R^{X3}$ optionally have.

The combination of two groups $R^{Y2}$ in the group represented by —C($R^{Y2}$)$_2$— as $X^{Y1}$ is preferably a combination in which both represent an alkyl group or a cycloalkyl group, both represent an aryl group, both represent a monovalent heterocyclic group, or one represents an alkyl group or a cycloalkyl group and the other represents an aryl group or a monovalent heterocyclic group, more preferably a combination in which both represent an alkyl group or a cycloalkyl group, both represent an aryl group, or one represents an alkyl group or a cycloalkyl group and the other represents an aryl group, and further preferably a combination in which one represents an alkyl group or a cycloalkyl group and the other represents an aryl group, and the foregoing groups optionally have a substituent.

Two groups $R^{Y2}$ may be combined together to form a ring together with atoms to which they are attached, and when $R^{Y2}$ forms a ring, the group represented by $-C(R^{Y2})_2-$ is preferably a group represented by the following formula (Y-A1) to formula (Y-A5), and more preferably a group represented by the formula (Y-A4), and the foregoing groups optionally have a substituent.

[Chemical Formula 46]

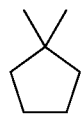

(Y-A1)

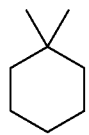

(Y-A2)

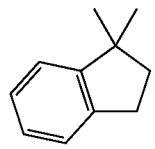

(Y-A3)

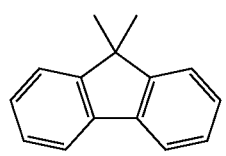

(Y-A4)

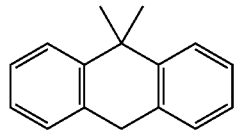

(Y-A5)

The combination of two groups $R^{Y2}$ in the group represented by $-C(R^{Y2})=C(R^{Y2})-$ as $X^{Y1}$ is preferably a combination in which both represent an alkyl group or a cycloalkyl group, or one represents an alkyl group or a cycloalkyl group and the other represents an aryl group, and the foregoing groups optionally have a substituent.

Four groups $R^{Y2}$ in the group represented by $-C(R^{Y2})_2-C(R^{Y2})_2-$ as $X^{Y1}$ represent preferably an alkyl group optionally having a substituent or a cycloalkyl group optionally having a substituent.

A plurality of $R^{Y2}$ may be combined together to form a ring together with atoms to which they are attached, and when $R^{Y2}$ forms a ring, the group represented by $-C(R^{Y2})_2-C(R^{Y2})_2-$ is preferably a group represented by the following formula (Y-B1) to formula (Y-B5), and more preferably a group represented by the formula (Y-B3), and the foregoing groups optionally have a substituent.

[Chemical Formula 47]

(Y-B1)

(Y-B2)

(Y-B3)

(Y-B4)

(Y-B5)

[wherein, $R^{Y2}$ represents the same meaning as described above.]

$X^{Y1}$ is preferably a group represented by $-C(R^{Y2})_2-$.

The constitutional unit represented by the formula (Y-1) is preferably a constitutional unit represented by the following the formula (Y-1'). The constitutional unit represented by the formula (Y-2) is preferably a constitutional unit represented by the following the formula (Y-2'). The constitutional unit represented by the formula (Y-3) is preferably a constitutional unit represented by the following the formula (Y-3').

[Chemical Formula 48]

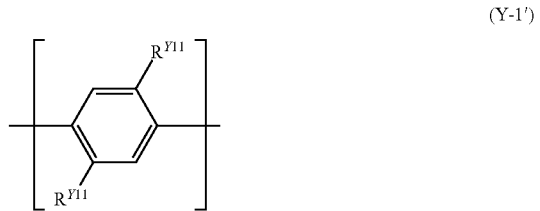

(Y-1')

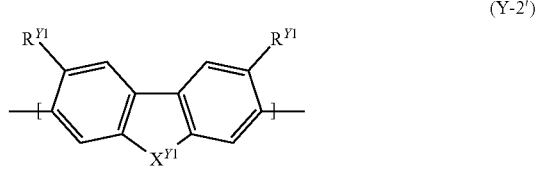

(Y-2')

-continued (Y-3')

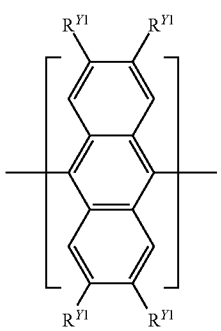

[wherein, $R^{Y1}$ and $X^{Y1}$ represent the same meaning as described above.

$R^{Y11}$ represents a fluorine atom, an alkyl group, a cycloalkyl group, an aryl group, a monovalent heterocyclic group, an alkoxy group, a cycloalkoxy group or a substituted amino group, and the foregoing groups optionally have a substituent. A plurality of $R^{Y11}$ may be the same or different.]

$R^{Y11}$ is preferably an alkyl group, a cycloalkyl group, an aryl group or a monovalent heterocyclic group, more preferably an alkyl group, a cycloalkyl group or an aryl group, and further preferably an alkyl group or a cycloalkyl group, and the foregoing groups optionally have a substituent.

Examples and preferable examples of the aryl group, the monovalent heterocyclic group and the substituted amino group as the group represented by $R^{Y11}$ are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which $R^{Y11}$ optionally has are the same as the examples and preferable examples of the substituent which the groups represented by $Ar^{X1}$ to $Ar^{X4}$ and $R^{X1}$ to $R^{X3}$ optionally have.

The constitutional unit represented by the formula (Y) includes, for example, constitutional units represented by the following formula (Y-11) to formula (Y-49).

[Chemical Formula 49]

(Y-11)

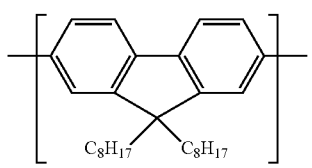

(Y-12)

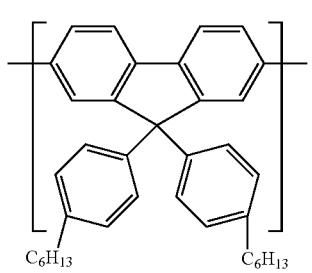

-continued (Y-13)

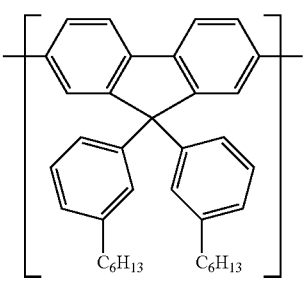

[Chemical Formula 50]

(Y-14)

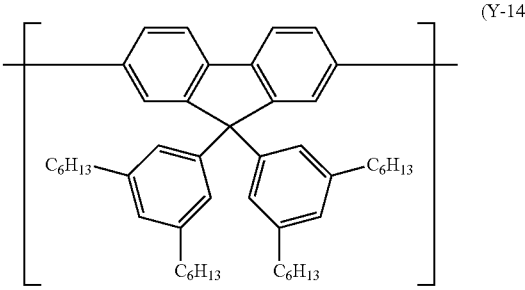

(Y-15)

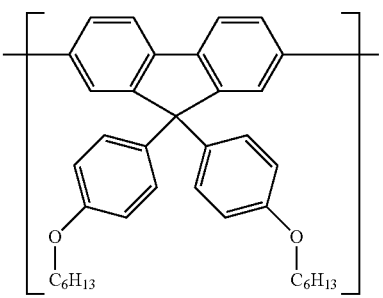

(Y-16)

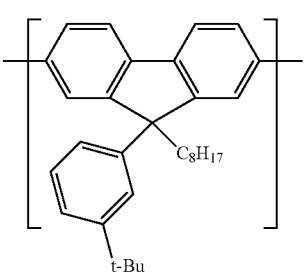

[Chemical Formula 51]

(Y-17)

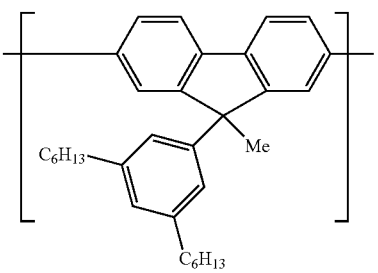

-continued
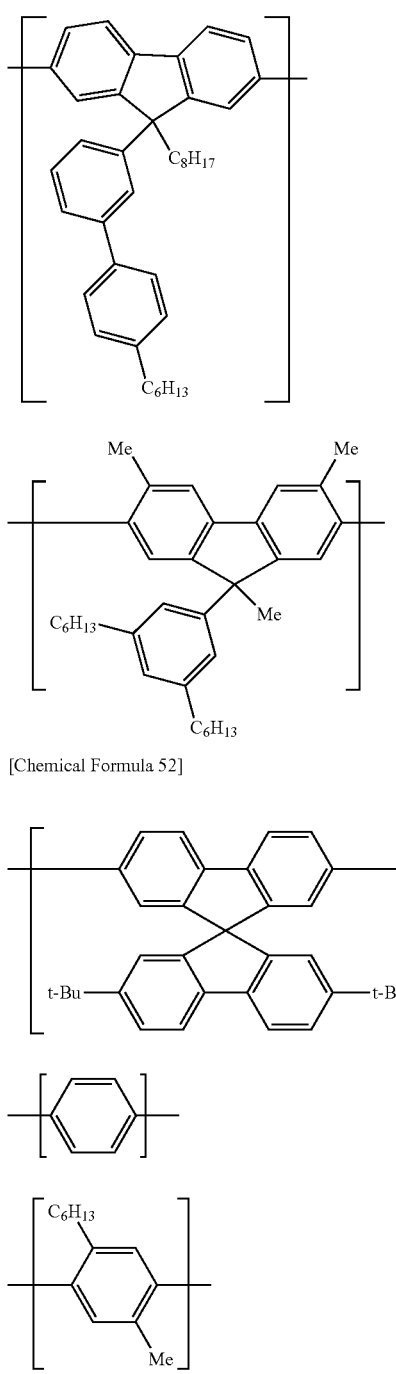
(Y-18)
(Y-19)
[Chemical Formula 52]
(Y-20)
(Y-21)
(Y-22)
(Y-23)
-continued
[Chemical Formula 53]
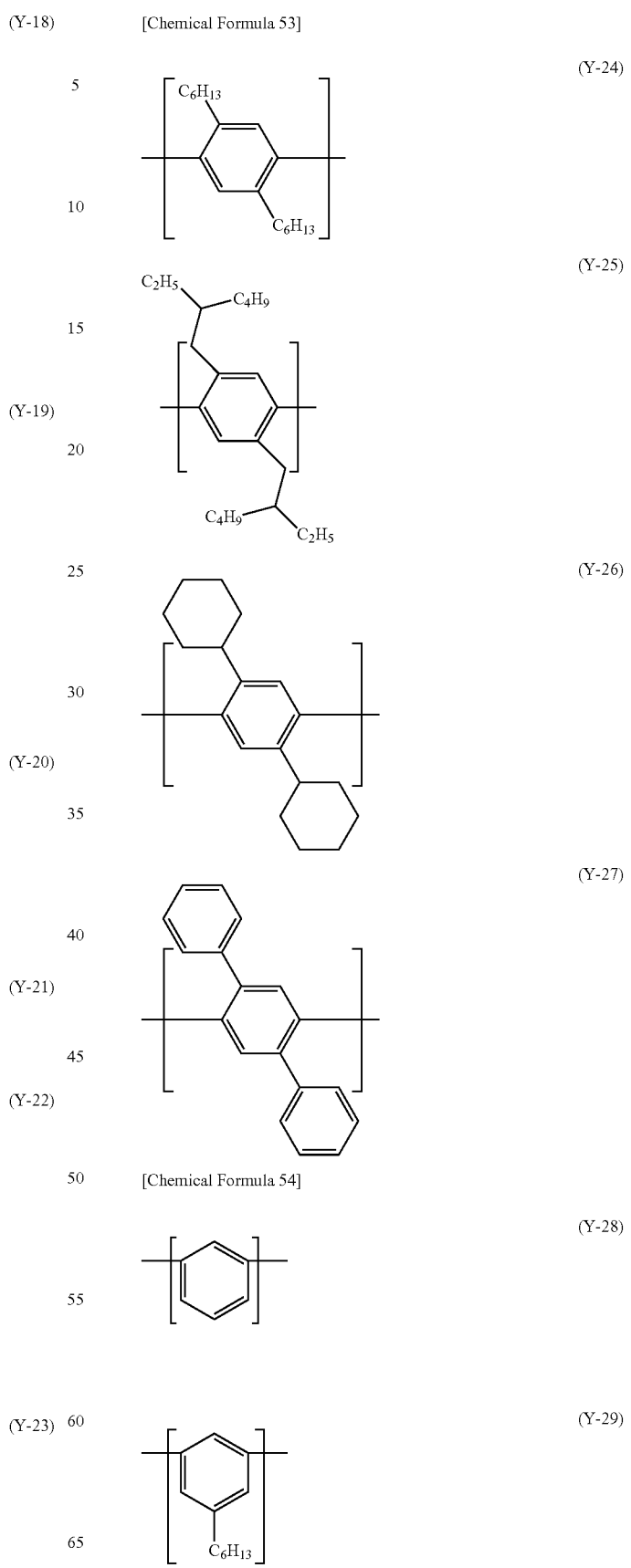
(Y-24)
(Y-25)
(Y-26)
(Y-27)
[Chemical Formula 54]
(Y-28)
(Y-29)

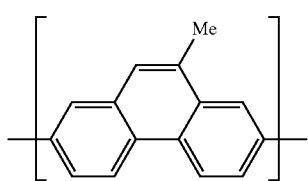
(Y-30)
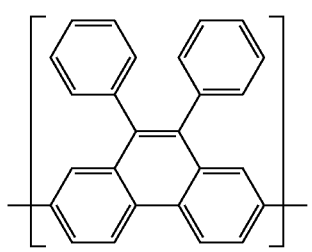
(Y-31)
[Chemical Formula 55]
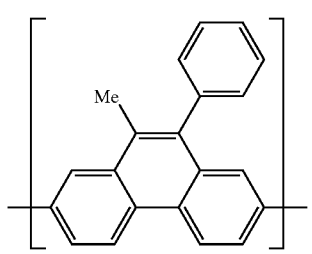
(Y-32)
(Y-33)
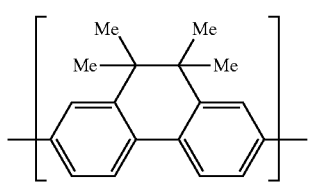
(Y-34)
(Y-35)
[Chemical Formula 56]
(Y-36)
(Y-37)
(Y-38)
(Y-39)
[Chemical Formula 57]
(Y-40)
(Y-41)

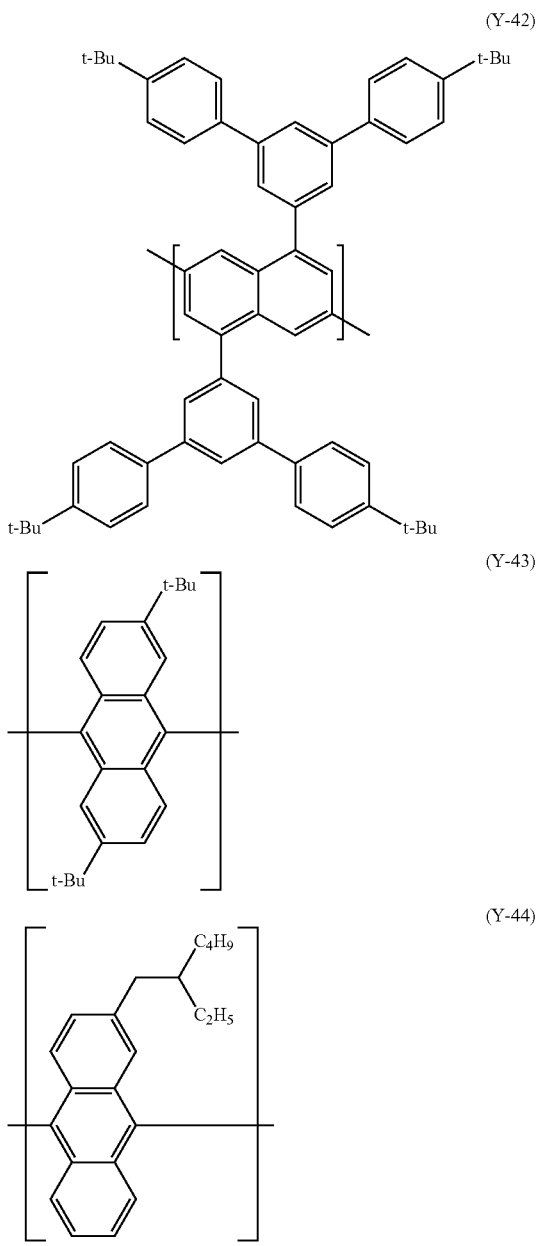
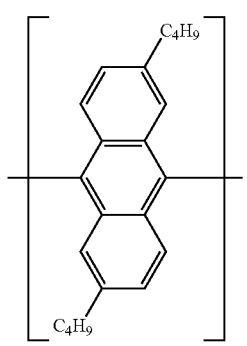
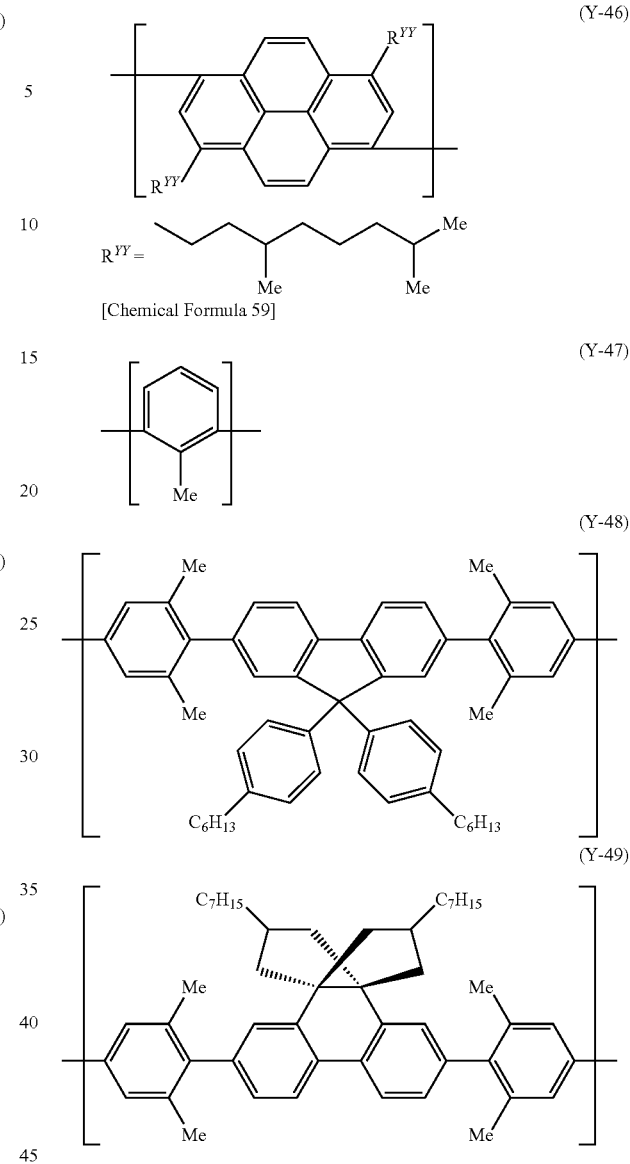

<Crosslinkable Group Contained in the Block Copolymer>

The crosslinkable group contained in the block copolymer according to the present invention is preferably a crosslinkable group represented by the formula (XL-1) to the formula (XL-4), the formula (XL-7) to the formula (XL-10) or the formula (XL-14) to the formula (XL-19), more preferably a crosslinkable group represented by the formula (XL-1), the formula (XL-3), the formula (XL-9), the formula (XL-10) or the formula (XL-16) to the formula (XL-19), further preferably a crosslinkable group represented by the formula (XL-1) or the formula (XL-16) to the formula (XL-19), particularly preferably a crosslinkable group represented by the formula (XL-1) or the formula (XL-17), and especially preferably a crosslinkable group represented by the formula (XL-17), because the block copolymer has excellent crosslinkability.

In the block copolymer, the crosslinkable group may be contained alone or in combination of two or more.

Examples and preferable examples of the substituent which crosslinkable groups in the above Group A optionally have are the same as the examples and preferable examples of the substituent which the groups represented by $Ar^{X1}$ to $Ar^{X4}$ and $R^{X1}$ to $R^{X3}$ optionally have.

<Constitutional Unit Having Crosslinkable Group>

The block copolymer preferably contains a crosslinkable group as a constitutional unit having a crosslinkable group, and more preferably contains a crosslinkable group as at least one constitutional unit selected from the group consisting of a constitutional unit represented by the above-described formula (2) and a constitutional unit represented by the above-described formula (2'). That is, the constitutional unit having a crosslinkable group is preferably a constitutional unit represented by the formula (2) or a constitutional unit represented by the above-described formula (2'). As a result, the block copolymer tends to have excellent crosslinkability.

[Constitutional Unit Represented by the Formula (2)]

From the viewpoint of improving the charge transportability of the block copolymer, nA is preferably an integer of 0 or more and 3 or less, more preferably an integer of 0 or more and 2 or less, and further preferably 0 or 1.

From the viewpoint of improving the charge transportability of the block copolymer, n is preferably an integer of 1 or more and 3 or less, more preferably 1 or 2, and further preferably 2.

In the above-described formula (2), $Ar^3$ is preferably an aromatic hydrocarbon group optionally having a substituent, from the standpoint of improvement in the charge transportability of the block copolymer.

The number of carbon atoms of the aromatic hydrocarbon group represented by $Ar^3$, not including the number of carbon atoms of the substituent, is usually 6 or more and 60 or less, preferably 6 or more and 30 or less, and more preferably 6 or more and 18 or less.

Examples and preferable range of the arylene group portion obtained by removing n substituents from the aromatic hydrocarbon group represented by $Ar^3$ are the same as the examples and preferable examples of the group represented by $Ar^{Y1}$.

The arylene group portion obtained by removing n substituents from the aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and the foregoing groups optionally have a substituent, from the standpoint of improvement in the charge transportability of the block copolymer.

The number of carbon atoms of the heterocyclic group represented by $Ar^3$, not including the number of carbon atoms of the substituent, is usually 2 or more and 60 or less, preferably 3 or more and 30 or less, and more preferably 4 or more and 18 or less.

Examples and preferable range of the divalent heterocyclic group portion obtained by removing n substituents from the heterocyclic group represented by $Ar^3$ are the same as the examples and preferable examples of the group represented by $Ar^Z$.

The divalent heterocyclic group portion obtained by removing n substituents from the heterocyclic group represented by $Ar^3$ is preferably a group represented by the formula (AA-1) to the formula (AA-34), from the standpoint of improvement in the charge transportability of the block copolymer.

The substituent which the aromatic hydrocarbon group and the heterocyclic group represented by $Ar^3$ optionally have is preferably an alkyl group, a cycloalkyl group, an alkoxy group, a cycloalkoxy group, an aryl group, an aryloxy group, a halogen atom, a monovalent heterocyclic group or a cyano group, more preferably an alkyl group, a cycloalkyl group, an aryl group, a monovalent heterocyclic group or a substituted amino group, and further preferably an alkyl group, a cycloalkyl group or an aryl group, and the foregoing groups optionally further have a substituent.

Examples and preferable examples of the aryl group, the monovalent heterocyclic group and the substituted amino group as the substituent which the group represented by $Ar^3$ optionally has are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have, respectively.

Examples and preferable examples of the substituent which the substituent which the group represented by $Ar^3$ optionally has optionally further has are the same as the examples and preferable examples of the substituent which the substituent which the groups represented by $Ar^{X1}$ to $Ar^{X4}$ and $R^{X1}$ to $R^{X3}$ optionally have optionally further has.

The number of carbon atoms of the alkylene group represented by $L^A$, not including the number of carbon atoms of the substituent, is usually 1 or more and 20 or less, preferably 1 or more and 15 or less, and more preferably 1 or more and 10 or less. The number of carbon atoms of the cycloalkylene group represented by $L^A$, not including the number of carbon atoms of the substituent, is usually 3 or more and 20 or less.

The alkylene group and the cycloalkylene group optionally have a substituent. The alkylene group and the cycloalkylene group include, for example, a methylene group, an ethylene group, a propylene group, a butylene group, a hexylene group, a cyclohexylene group, and an octylene group.

The substituent which the alkylene group and the cycloalkylene group represented by $L^A$ optionally have is preferably an alkyl group, a cycloalkyl group, an alkoxy group, a cycloalkoxy group, a halogen atom or a cyano group, and the foregoing groups optionally further have a substituent.

The arylene group represented by $L^A$ optionally has a substituent. Examples and preferable examples of the arylene group represented by $L^A$ are the same as the examples and preferable examples of the group represented by $Ar^{Y1}$, and it is preferably a phenylene group or a fluorenediyl group, more preferably a m-phenylene group, a p-phenylene, a fluorene-2,7-diyl group or a fluorene-9,9-diyl group, and the foregoing groups optionally have a substituent.

The substituent which the arylene group represented by $L^A$ optionally has is preferably an alkyl group, a cycloalkyl group, an alkoxy group, a cycloalkoxy group, an aryl group, an aryloxy group, a monovalent heterocyclic group, a halogen atom, a cyano group or a crosslinkable group (preferably a crosslinkable group selected from the above Group A), and the foregoing groups optionally further have a substituent.

Examples and preferable examples of the divalent heterocyclic group represented by $L^A$ are the same as the examples and preferable examples of the group represented by $Ar^Z$.

The divalent heterocyclic group represented by $L^A$ is preferably a group represented by the formula (AA-1) to the formula (AA-34).

$L^A$ is preferably an arylene group or an alkylene group, more preferably a phenylene group, a fluorenediyl group or an alkylene group, and further preferably an alkylene group, and the foregoing groups optionally have a substituent, from the viewpoint of easy production of the block copolymer.

Examples and preferable examples of the substituent which the group represented by $L^A$ optionally has are the same as the examples and preferable examples of the substituent which the group represented by $Ar^3$ optionally has.

R' is preferably an aryl group or a monovalent heterocyclic group, more preferably an aryl group, and the foregoing groups optionally have a substituent.

Examples and preferable examples of the substituent which the group represented by R' optionally has are the same as the examples and preferable examples of the substituent which the substituent which the groups represented by $Ar^{X1}$ to $Ar^{X4}$ and $R^{X1}$ to $R^{X3}$ optionally have optionally further has.

In the above-described formula (2), X is preferably a crosslinkable group selected from the above Group A. When a plurality of X are present, they may be the same or different.

The crosslinkable group represented by X is preferably a crosslinkable group represented by the formula (XL-1) to the formula (XL-4), the formula (XL-7) to the formula (XL-10), or the formulas (XL-14) to (XL-19), more preferably a crosslinkable group represented by the formula (XL-1), the formula (XL-3), the formula (XL-9), the formula (XL-10), or the formula (XL-16) to the formula (XL-19), further preferably a crosslinkable group represented by the formula (XL-1) or the formula (XL-16) to the formula (XL-19), particularly preferably a crosslinkable group represented by the formula (XL-1) or the formula (XL-17), and especially preferably a crosslinkable group represented by the formula (XL-17), because the block copolymer is excellent in crosslinkability.

[Constitutional Unit Represented by the Formula (2')]

In the above-described formula (2'), mA is preferably an integer of 0 or more and 3 or less, more preferably an integer of 0 or more and 2 or less, further preferably 0 or 1, and particularly preferably 0, from the viewpoint of improving the charge transportability of the block copolymer.

m is preferably an integer of 1 or more and 3 or less, more preferably 1 or 2, and further preferably 2, from the viewpoint of improving the charge transportability of the block copolymer.

c is preferably 0, from the standpoint of easy production of the block copolymer and from the viewpoint of improvement in the charge transportability.

In the above-described formula (2'), $Ar^5$ is preferably an aromatic hydrocarbon group optionally having a substituent, from the viewpoint of improving the charge transportability of the block copolymer.

The definition and examples of the arylene group portion obtained by removing m substituents from the aromatic hydrocarbon group represented by $Ar^5$ are the same as the definition and examples of the arylene group represented by $Ar^{X2}$ in the above-described formula (X).

The definition and examples of the divalent heterocyclic group portion obtained by removing m substituents from the heterocyclic group represented by $Ar^5$ are the same as the definition and examples of the divalent heterocyclic group portion represented by $Ar^{X2}$ in the above-described formula (X).

The definition and examples of the divalent group obtained by removing m substituents from the group in which at least one aromatic hydrocarbon ring and at least one hetero ring are directly bonded represented by $Ar^5$ are the same as the definition and examples of the divalent group in which at least one arylene group and at least one divalent heterocyclic group are bonded directly represented by $Ar^{X2}$.

In the above-described formula (2'), $Ar^4$ and $Ar^6$ are preferably arylene groups optionally having a substituent, from the viewpoint of improving the charge transportability of the block copolymer.

The definition and examples of the arylene group represented by $Ar^4$ and $Ar^6$ are the same as the definition and examples of the arylene group represented by $Ar^{X1}$ and $Ar^{X3}$ in the above-described formula (X).

The definition and examples of the divalent heterocyclic group represented by $Ar^4$ and $Ar^6$ are the same as the definition and examples of the divalent heterocyclic group represented by $Ar^{X1}$ and $Ar^{X3}$ in the above-described formula (X).

The substituent which $Ar^4$, $Ar^5$ and $Ar^6$ optionally have is preferably an alkyl group, a cycloalkyl group, an alkoxy group, a cycloalkoxy group, an aryl group, an aryloxy group, a halogen atom, a monovalent heterocyclic group or a cyano group, more preferably an alkyl group, a cycloalkyl group, an aryl group, a monovalent heterocyclic group or a substituted amino group, further preferably an alkyl group, a cycloalkyl group or an aryl group, and particularly preferably an alkyl group, and the foregoing groups optionally further have a substituent.

Examples and preferable examples of the aryl group, the monovalent heterocyclic group and the substituted amino group as the substituent which the groups represented by $Ar^4$ to $Ar^6$ optionally have are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have.

Examples and preferable examples of the substituent which the substituent which the groups represented by $Ar^4$ to $Ar^6$ optionally have optionally further has are the same as the examples and preferable examples of the substituent which the substituent which the groups represented by $Ar^{X1}$ to $Ar^{X4}$ and $R^{X1}$ to $R^{X3}$ optionally have optionally further has.

Definition and examples of the alkylene group, the cycloalkylene group, the arylene group and the divalent heterocyclic group represented by $K^A$ in the above-described formula (2') are the same as the definition and examples of the alkylene group, the cycloalkylene group, the arylene group and the divalent heterocyclic group represented by $L^A$ in the above-described formula (2).

Examples and preferable examples of $K^A$ are the same as the examples and preferable examples of $L^A$, and $K^A$ is preferably a phenylene group or a methylene group, and the foregoing groups optionally have a substituent, from the viewpoint of easy production of the block copolymer.

Examples and preferable examples of the substituent which the group represented by $K^A$ optionally has are the same as the examples and preferable examples of the substituent which the group represented by $L^A$ optionally has.

Examples and preferable examples of R" are the same as the examples and preferable examples of R'.

X' is preferably a crosslinkable group, an aryl group or a monovalent heterocyclic group, more preferably a crosslinkable group or an aryl group, and the foregoing groups optionally have a substituent.

Examples and preferable examples of the aryl group and the monovalent heterocyclic group represented by X' are the same as the examples and preferable examples of the aryl group and the monovalent heterocyclic group as the substituent which the groups represented by $Ar^{X1}$ to $Ar^{X4}$ and $R^{X1}$ to $R^{X3}$ optionally have, respectively.

Examples and preferable examples of the substituent which the group represented by X' optionally has are the same as the examples and preferable examples of the substituent which the groups represented by $Ar^{X1}$ to $Ar^{X4}$ and $R^{X1}$ to $R^{X3}$ optionally have.

In the above-described formula (2'), at least one X' is a crosslinkable group, preferably a crosslinkable group selected from the above Group A.

The definition and examples of the crosslinkable group represented by X' are the same as the definition and examples of the crosslinkable group represented by X in the above-described formula (2).

[Specific Example of Constitutional Unit Represented by the Formula (2) or (2')]

The constitutional unit represented by the formula (2) includes, for example, constitutional units represented by the following formula (2-1) to formula (2-30), and the constitutional unit represented by the formula (2') includes, for example, constitutional units represented by the following formula (2'-1) to formula (2'-9). Of them, the constitutional unit represented by the formula (2) and the constitutional unit represented by the formula (2') are preferably constitutional units represented by the formula (2-1) to the formula (2-30), more preferably constitutional units represented by the formula (2-1) to the formula (2-15), the formula (2-19), the formula (2-20), the formula (2-23), the formula (2-25) or the formula (2-30), and further preferably constitutional units represented by the formula (2-1) to the formula (2-9) or the formula (2-30), from the standpoint of improvement in the crosslinkability of the block copolymer.

[Chemical Formula 60]

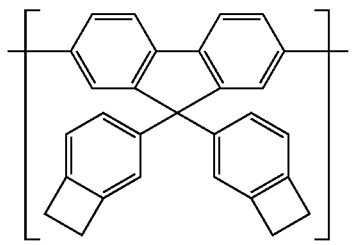

(2-1)

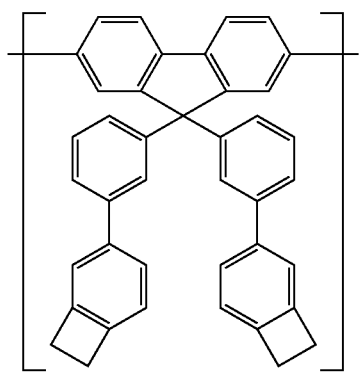

(2-2)

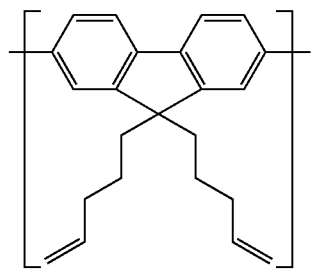

(2-3)

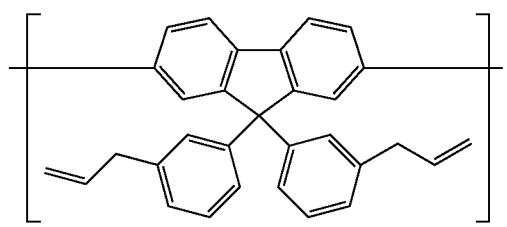

(2-4)

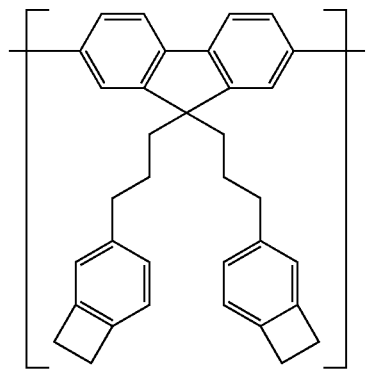

(2-5)

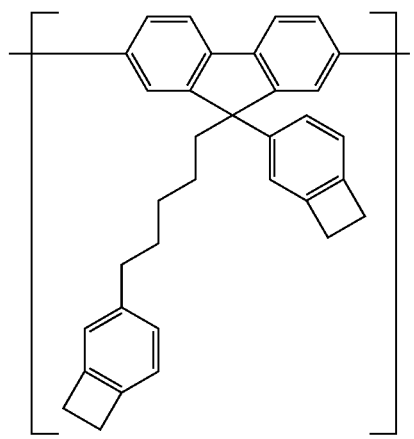

(2-6)

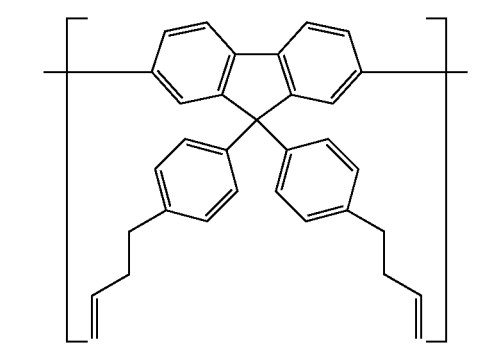
(2-7)
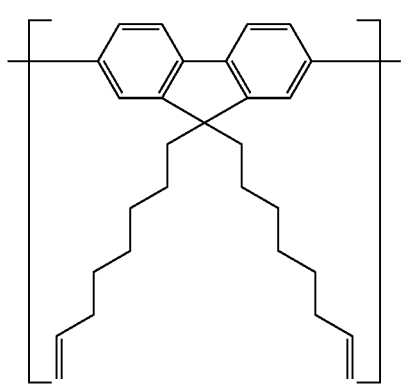
(2-8)
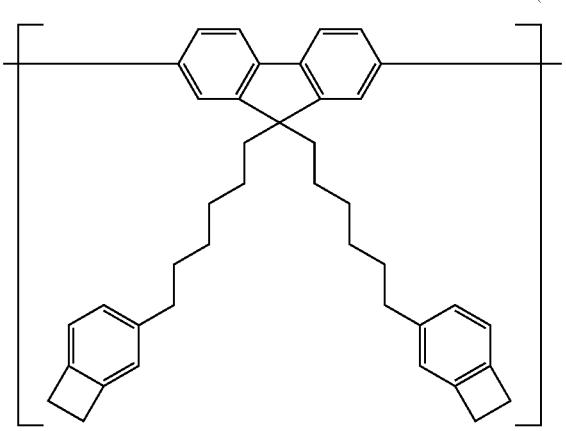
(2-9)
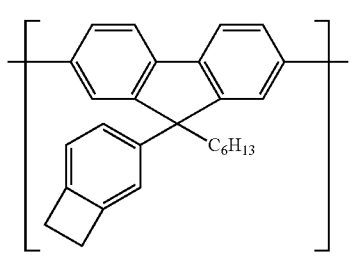
(2-10)
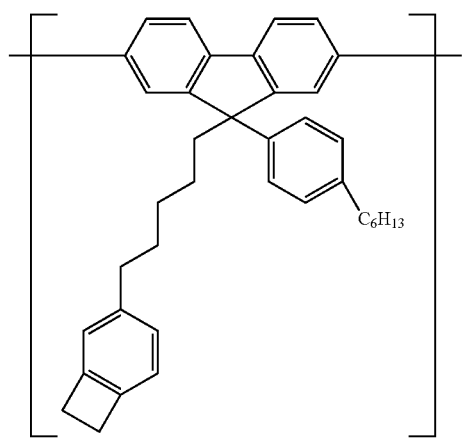
(2-11)
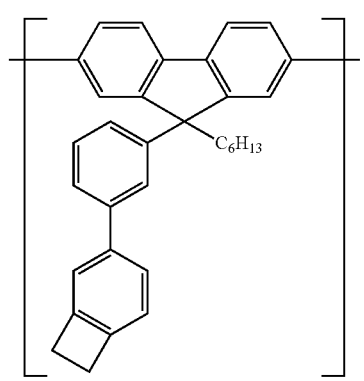
(2-12)
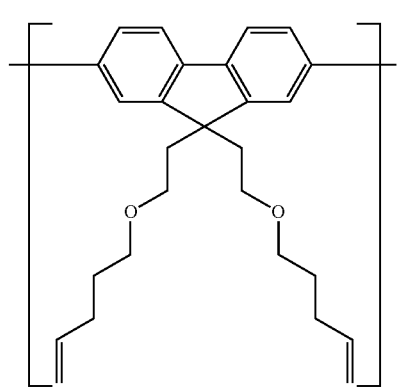
(2-13)
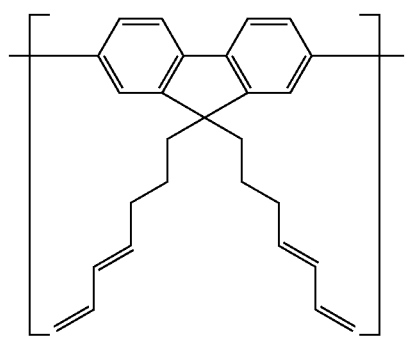
(2-14)

-continued
(2-15)
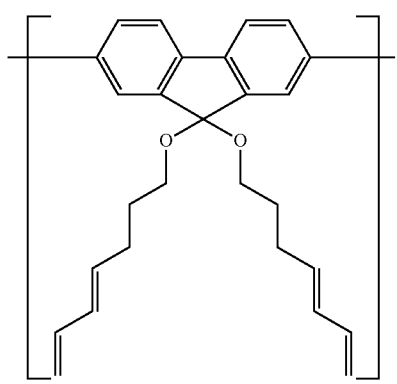
[Chemical Formula 61]
(2-16)
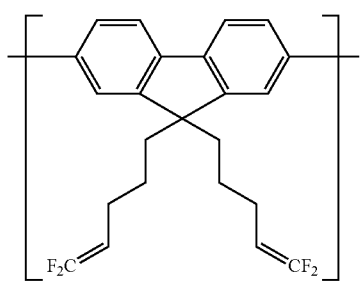
(2-17)
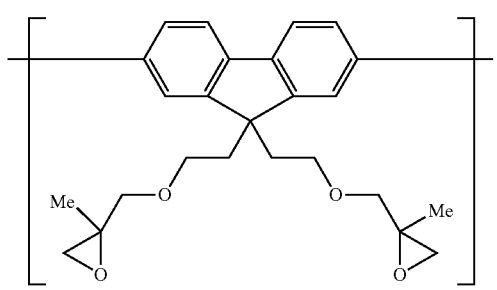
(2-18)
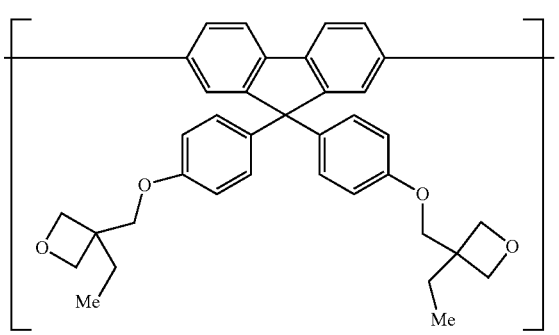
-continued
(2-19)
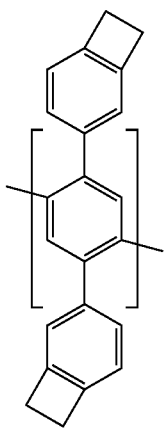
(2-20)
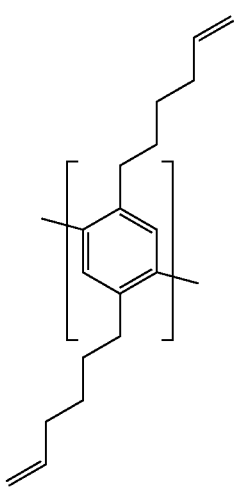
[Chemical Formula 62]
(2-21)
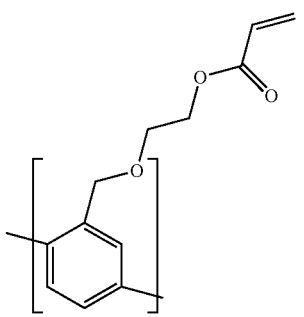

(2-22)
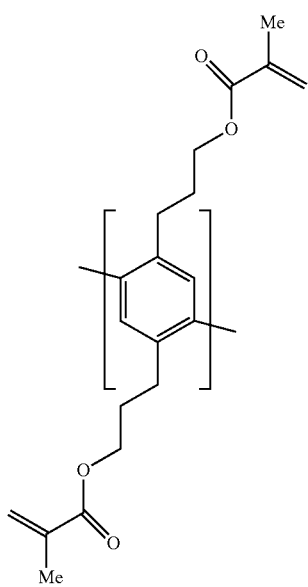
(2-24)
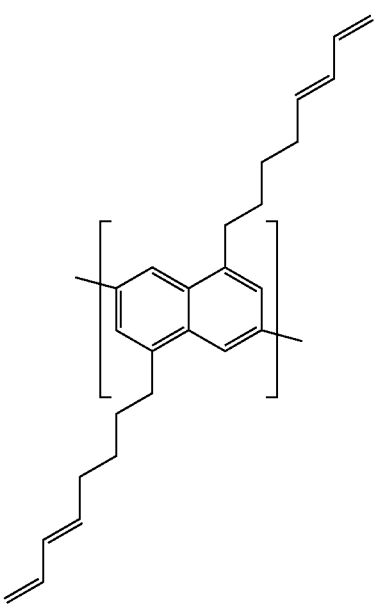
(2-23)
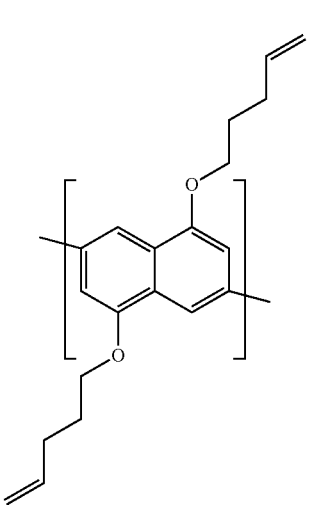
(2-25)

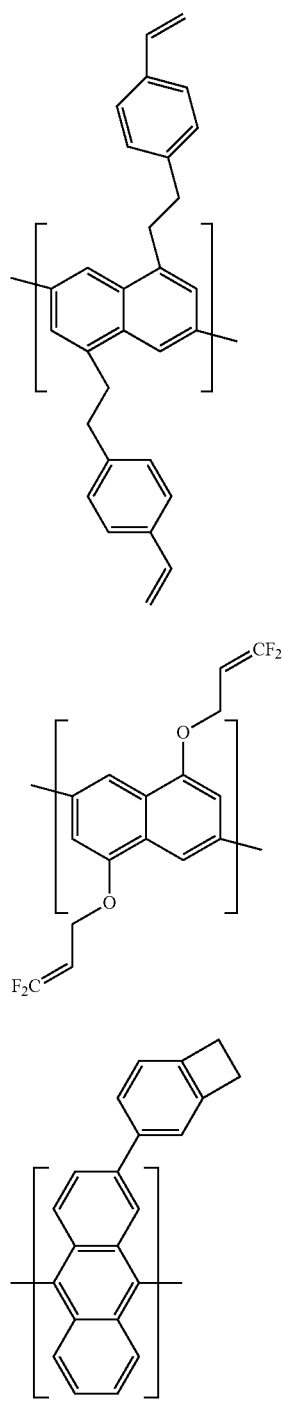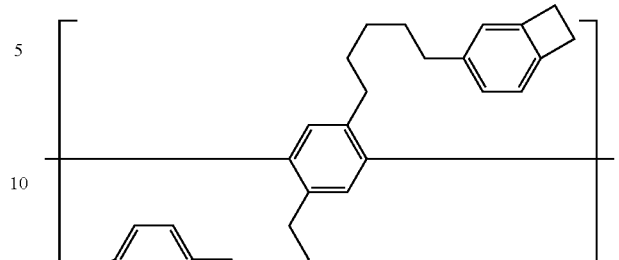

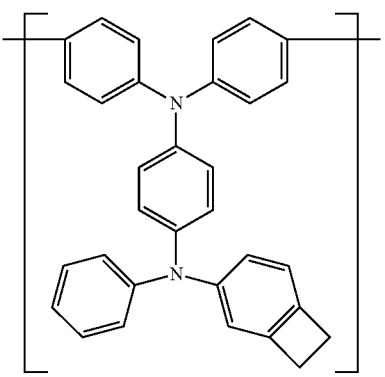

(2'-5)

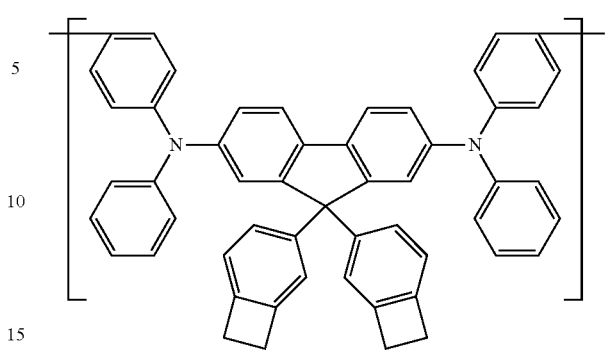

(2'-9)

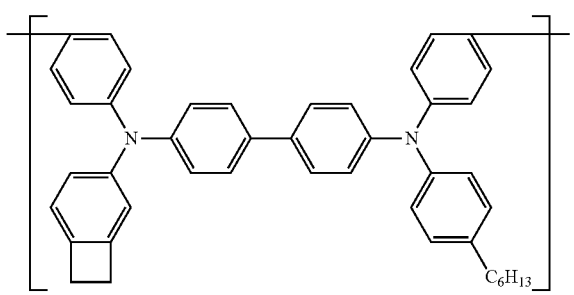

(2'-6)

[Other Constitutional Unit Having Crosslinkable Group]

The block copolymer may contain a crosslinkable group as a constitutional unit other than the constitutional unit represented by the formula (2) and the constitutional unit represented by the formula (2'). That is, the constitutional unit having a crosslinkable group may be a constitutional unit having a crosslinkable group other than the constitutional unit represented by the formula (2) and the constitutional unit represented by the formula (2'). The constitutional unit having a crosslinkable group other than the constitutional unit represented by the formula (2) and the constitutional unit represented by the formula (2') includes, for example, constitutional units represented by the following formulae.

[Chemical Formula 64]

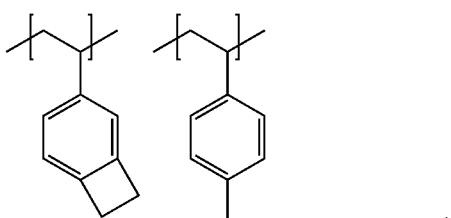

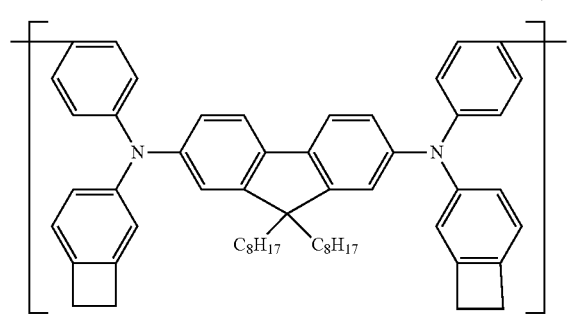

(2'-7)

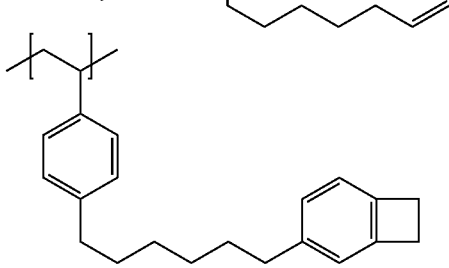

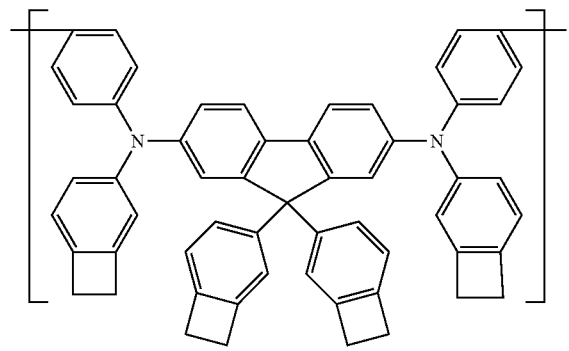

(2'-8)

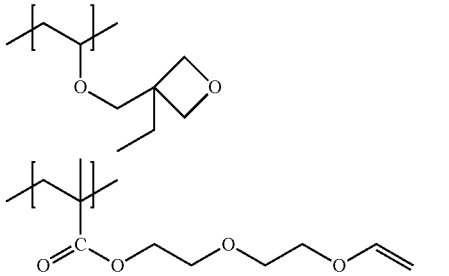

<Block Copolymer>

The block copolymer according to the present invention is a block copolymer containing an end group, a block that binds to the end group (hereinafter, also referred to as "terminal block"), and a block that does not bind to the end group (hereinafter, also referred to as "non-terminal block"). That is, the block copolymer according to the present invention is a block copolymer containing an end group, a terminal block and a non-terminal block in this order. The block copolymer preferably contains an end group, a terminal block, a non-terminal block, a terminal block and an end group in this order. In the block copolymer, the two end groups may be the same or different, but from the viewpoint of easiness of production of the block copolymer, it is preferable that they are the same. In the block copolymer, the two terminal blocks may be the same or different, but it is preferable that they are the same from the viewpoint of easy production of the block copolymer.

The block copolymer may contain a constitutional unit other than an end group, a terminal block and a non-terminal block, but from the viewpoint of easiness of production of the block copolymer, it is preferable that the block copolymer is composed only of an end group, a terminal block and a non-terminal blocks.

Examples of the constitutional unit other than the end group, the terminal block and the non-terminal block include a joining unit and a branching unit.

The polystyrene-equivalent number-average molecular weight (Mn) of the block copolymer is, for example, $2 \times 10^3$ or more and $5 \times 10^6$ or less, preferably $5 \times 10^3$ or more and $5 \times 10^5$ or less, more preferably $1 \times 10^4$ or more and $3 \times 10^5$ or less, and further preferably $2 \times 10^4$ or more and $1 \times 10^5$ or less.

The polystyrene-equivalent weight-average molecular weight (Mw) of the block copolymer is, for example, $5 \times 10^3$ or more and $1 \times 10^7$ or less, preferably $1 \times 10^4$ or more and $5 \times 10^6$ or less, more preferably $5 \times 10^4$ or more and $1 \times 10^6$ or less, and further preferably $1 \times 10^5$ or more and $5 \times 10^5$ or less.

[End Group]

The "end group" is a group that is arranged at the end of the block copolymer and bonded directly to the terminal block, and is preferably an atomic group as a residue in the reagent (end-capping agent) used when introducing the end group into the block copolymer after the reagent is introduced.

From the viewpoint of the stability of the block copolymer, the end groups are preferably arranged at all ends of the block copolymer. When a plurality of end groups are present, they may be the same or different, but are preferably the same from the viewpoint of easiness of production of the block copolymer.

From the viewpoint of the stability of the block copolymer, the end group is preferably an aryl group or a monovalent heterocyclic group, more preferably an aryl group, and the foregoing groups optionally have a substituent, but it is further preferable that it has no substituent.

Since the crosslinkability of the block copolymer can be enhanced, the end group preferably contains a crosslinkable group, and more preferably is a crosslinkable group. Examples and preferable examples of the crosslinkable group in the end group are the same as the examples and preferable examples mentioned in the explanation for the above-described crosslinkable group.

Examples and preferable examples of the aryl group and monovalent heterocyclic group in the end group are the same as the examples and preferable examples of the aryl group and monovalent heterocyclic group represented by $R^{X1}$ to $R^{X3}$, respectively.

The substituent which the aryl group and the monovalent heterocyclic group in the end group optionally have is preferably an alkyl group, a cycloalkyl group, an aryl group, a monovalent heterocyclic group or a crosslinkable group, more preferably an alkyl group, a cycloalkyl group, an aryl group or a crosslinkable group, further preferably an alkyl group or a crosslinkable group, particularly preferably an alkyl group, and the foregoing groups optionally further have a substituent, but it is especially preferable that it has no further substituent.

Examples and preferable examples of the aryl group, the monovalent heterocyclic group and the substituted amino group in the end group which the aryl group and the monovalent heterocyclic group in the end group optionally have are the same as the examples and preferable examples of the aryl group, the monovalent heterocyclic group and the substituted amino group as the substituent which the groups represented by $Ar^{X1}$ to $Ar^{X4}$ and $R^{X1}$ to $R^{X3}$ optionally have.

Examples and preferable examples of the crosslinkable group as the substituent which the aryl group and the monovalent heterocyclic group in the end group optionally have are the same as the examples and preferable examples mentioned in the explanation for the above-described crosslinkable group.

[Non-Terminal Block]

The non-terminal block is a block that does not bind directly to the end group, and consisting of one or more constitutional units. The number of the type of the constitutional unit contained in the non-terminal block is usually 1 or more and 10 or less, and from the standpoint of easy production of the block copolymer and improvement in the charge transportability, preferably 1 or more and 7 or less, more preferably 2 or more and 5 or less, and further preferably 2 or 3.

In the block copolymer, only one type of non-terminal block may be contained, or two or more types may be contained. The number of the type of the non-terminal block contained in the block copolymer is usually 1 or more and 10 or less, and from the standpoint of easy production of the block copolymer, preferably 1 or more and 5 or less, more preferably 1 or more and 3 or more, further preferably 1 or 2, and particularly preferably 1.

Cases wherein the types of the non-terminal blocks are different include, for example, a case wherein the types of the constitutional units constituting the block are different and a case wherein the content ratios and chain distributions of constitutional units are different. When a plurality of non-terminal blocks are present, they may be the same or different.

It is preferable that at least one non-terminal block is a block formed before forming the end block in production of the block copolymer.

The non-terminal block contains at least one constitutional unit selected from the group consisting of constitutional units represented by the formula (X) and the constitutional units represented by the formula (Z). In the non-terminal block, each of the constitutional unit represented by the formula (X) and the constitutional unit represented by the formula (Z) may be contained alone or in combination of two or more, and one or more constitutional units represented by the formula (X) and one or more constitutional units represented by the formula (Z) may be contained.

The non-terminal block preferably contains a constitutional unit represented by the formula (X).

The non-terminal block preferably further contains at least one constitutional unit selected from the group consisting of a constitutional unit represented by the formula (Y) and a constitutional unit having a crosslinkable group, more preferably further contains a constitutional unit represented by the formula (Y), and further preferably further contains only a constitutional unit represented by the formula (Y), from the standpoint of improving the charge transportability of the block copolymer. In the non-terminal block, each of the constitutional unit represented by the formula (Y) and the constitutional unit having a crosslinkable group may be contained alone or in combination of two or more.

From the viewpoint of improving the charge transportability of the block copolymer, it is preferable that at least one of constitutional units contained in the terminal block is not contained in the non-terminal block and/or at least one of constitutional units contained in the non-terminal block is not contained in the terminal block, in the block copolymer, and it is more preferable that at least one of constitutional units contained in the terminal block is not contained in the non-terminal block and at least one of constitutional units contained in the non-terminal block is not contained in the terminal block.

The polystyrene-equivalent number-average molecular weight (Mn) of the non-terminal block contained in the block copolymer is, for example, $1\times10^3$ or more and $1\times10^6$ or less, preferably $2\times10^3$ or more and $1\times10^5$ or less, more preferably $3\times10^3$ or more and $5\times10^4$ or less, and further preferably $5\times10^3$ or more and $2\times10^4$ or less.

The polystyrene-equivalent weight-average molecular weight (Mw) of the non-terminal block contained in the block copolymer is, for example, $2\times10^3$ or more and $2\times10^6$ or less, preferably $3\times10^3$ or more and $2\times10^5$ or less, more preferably $4\times10^3$ or more and $1\times10^5$ or less, and further preferably $1\times10^4$ or more and $5\times10^4$ or less.

[Terminal Block]

The terminal block is a block that binds directly to the end group and consisting of one or more constitutional units. The number of the type of the constitutional unit contained in the terminal block is usually 1 or more and 10 or less, and from the viewpoint of easy production of the block copolymer and improvement of the charge transportability, preferably 1 or more and 7 or less, more preferably 2 or more and 5 or less, and further preferably 2 or 3.

In the block copolymer, only one type of terminal block may be contained, or two or more types thereof may be contained. The number of the type of the terminal block contained in the block copolymer is generally 1 or more and 10 or less, and from the viewpoint of easiness of production of the block copolymer, preferably 1 or more and 5 or less, more preferably 1 or more and 3 or less, and further preferably 1.

Examples of cases wherein the types of terminal blocks are different are the same as the examples wherein the types of non-terminal blocks are different. When a plurality of terminal blocks are present, they may be the same or different, but are preferably the same from the viewpoint of easiness of production of the block copolymer.

The terminal block is preferably a block formed, in the production of the block copolymer, before forming the end group (particularly, before reacting with the end-capping agent).

The terminal block preferably contain at least one constitutional unit selected from the group consisting of a constitutional unit represented by the formula (X), a constitutional unit represented by the formula (Y), a constitutional unit represented by the formula (Z) and a constitutional unit having a crosslinkable group, more preferably contains at least one constitutional unit selected from the group consisting of a constitutional unit represented by the formula (X), a constitutional unit represented by the formula (Y) and a constitutional unit having a crosslinkable group, further preferably contains at least one constitutional unit selected from the group consisting of a constitutional unit represented by the formula (Y) and a constitutional unit having a crosslinkable group, and particularly preferably contains only a constitutional unit represented by the formula (Y) and a constitutional unit having a crosslinkable group, from the standpoint of improving the charge transportability of the block copolymer.

As described above, in the block copolymer, at least one selected from the group consisting of end groups and terminal blocks contains a crosslinkable group. In the block copolymer, the terminal block preferably contains a crosslinkable group, and more preferably contains a constitutional unit having a crosslinkable group. When the terminal block has a crosslinkable group, the end group may or may not have a crosslinkable group. Since the terminal block has a crosslinkable group, the amount of the crosslinkable group introduced can be easily increased, and thus the crosslinkability of the block copolymer can be easily increased to a sufficient degree.

When the terminal block has a crosslinkable group, the crosslinkability of the block copolymer tends to be excellent, and therefore, the crosslinkable group is preferably contained in the terminal block as at least one constitutional unit selected from the group consisting of a constitutional unit represented by the above-described formula (2) and a constitutional unit represented by the above-described formula (2').

In the terminal block, the constitutional unit represented by the formula (X), the constitutional unit represented by the formula (Y), and the constitutional unit represented by the formula (Z) and the constitutional unit having a crosslinkable group may each be contained singly or in combination of two or more.

The terminal block preferably does not contain a constitutional unit represented by the formula (X) or does not contain a constitutional unit represented by the formula (Z), more preferably does not contain a constitutional unit represented by the formula (Z), and further preferably does not contain a constitutional unit represented by the formula (X) and a constitutional unit represented by the formula (Z), from the standpoint of improving the charge transportability of the block copolymer.

In the block copolymer, the terminal block and the non-terminal block each independently may be any of a homopolymer, a block copolymer, a random copolymer, an alternating copolymer and a graft copolymer, or may be other form, but are preferably copolymers.

The block copolymer is preferably a block copolymer containing 2 or more and 15 or less constitutional units selected from the group consisting of a constitutional unit represented by the formula (X), a constitutional unit represented by the formula (Y), a constitutional unit represented by the formula (Z) and a constitutional unit having a crosslinkable group, more preferably a block copolymer containing 2 or more and 10 or less constitutional units, further preferably a block copolymer containing 3 or more and 8 or less constitutional unit, and particularly preferably a block copolymer containing 3 or more and 6 or less constitutional units, from the standpoint of easy production of the block copolymer and improvement in the charge transportability of the block copolymer.

In the block copolymer, the constitutional unit represented by the formula (X), the constitutional unit represented by the formula (Z), the constitutional unit represented by the formula (Y), and the constitutional unit having a crosslinkable group may each be contained singly or in combination of two or more.

The sum of the types of constitutional units contained in the block copolymer is preferably 2 or more and 20 or less, more preferably 2 or more and 15 or less, further preferably 2 or more and 10 or less, particularly preferably 3 or more and 8 or less, and especially preferably 3 or more and 6 or less, from the standpoint of easy production of the block copolymer and improvement in the charge transportability of the block copolymer.

[Total Number of Constitutional Unit]

In this specification, the total number of the constitutional units contained in the polymer compound means the average number of the constitutional units per 1000 of the molecular weight of the polymer compound. The total number of the crosslinkable groups contained in the polymer compound means the average number of the crosslinkable groups per 1000 of the molecular weight the polymer compound.

The total number of each constitutional units and crosslinkable groups contained in the polymer compound can be determined, for example, by the following method.

For each constitutional unit constituting the polymer compound, if the sum of the values obtained by multiplying the molar ratio of the constitutional unit to the total moles of all the constitutional units excluding the end group and the molecular weight of the constitutional unit is expressed as $D_1$, the sum of the molar ratios determined for each constitutional unit is expressed as $E_1$, and the sum of the values obtained by multiplying the molar ratio and the number of crosslinkable groups of the constituent unit is expressed as $E_2$, then, the total number of the respective constitutional units contained in the polymer compound shall be $(E_1 \times 1000)/D_1$, and the total number of the crosslinkable group contained in the polymer compound shall be $(E_2 \times 1000)/D_1$.

The molecular weight of each of the constitutional units constituting the polymer compound can be calculated using, for example, the value of Molecular Weight according to ChemDraw (manufactured by HULINKS INC.).

Specific methods for calculating the total number of each constitutional unit and the total number of the crosslinkable group will be described in detail by taking the block copolymer P1 used in Example 1 as an example.

The block copolymer P1 has a non-terminal block containing a constitutional unit derived from the compound M1, a constitutional unit derived from the compound M2, and a constitutional unit derived from the compound M3 in a molar ratio of 40:30:2.5, and a terminal block containing a constitutional unit derived from the compound M1, a constitutional unit derived from the compound M4, and a constitutional unit derived from the compound M5 in a molar ratio of 10:10:7.5.

The molecular weight of the constitutional unit derived from the compound M1 is 653.05, the molecular weight of the constitutional unit derived from the compound M2 is 751.12, the molecular weight of the constitutional unit derived from the compound M3 is 388.64, the molecular weight of the constitutional unit derived from the compound M4 is 176.22, and the molecular weight of the constitutional unit derived from the compound M5 is 368.48.

The number of the crosslinkable group contained in the constitutional unit derived from the compound M1 is 0, the number of the crosslinkable group contained in the constitutional unit derived from the compound M2 is 0, the number of the crosslinkable group contained in the constitutional unit derived from the compound M3 is 0, the number of the crosslinkable group contained in the constitutional unit derived from the compound M4 is 0, and the number of the crosslinkable group contained in the constitutional unit derived from the compound M5 is 2.

The constitutional unit derived from the compound M1 is a constitutional unit represented by the formula (Y), the constitutional unit derived from the compound M2 is a constitutional unit represented by the formula (X), the constitutional unit derived from the compound M3 is a constitutional unit represented by the formula (Y), the constitutional unit derived from the compound M4 is a constitutional unit represented by the formula (Y), and the constitutional unit derived from the compound M5 is a constitutional unit having a crosslinkable group.

$D_1$ is determined as follows.

$$D_1 = (653.05 \times 0.40) + (751.12 \times 0.30) + (388.64 \times 0.025) + (653.05 \times 0.10) + (176.22 \times 0.10) + (368.48 \times 0.075) = 606.835$$

In the block copolymer P1, $E_1$ of each constitutional unit is determined as follows.

($E_1$ of the constitutional unit represented by the formula (Y) in the non-terminal block)=0.40+0.025=0.425

($E_1$ of the constitutional unit represented by the formula (X) in the non-terminal block)=0.30

($E_1$ of the constitutional unit represented by the formula (Z) in the non-terminal block)=0

($E_1$ of the constitutional unit represented by the formula (X) and the constitutional unit represented by the formula (Z) in the non-terminal block)=0.30+0=0.30

($E_1$ of the constitutional unit having a crosslinkable group in the non-terminal block)=0

($E_1$ of the constitutional unit represented by the formula (Y) in the terminal block)=0.10+0.10=0.20

($E_1$ of the constitutional unit represented by the formula (X) in the terminal block)=0

($E_1$ of the constitutional unit represented by the formula (Z) in the terminal block)=0

($E_1$ of the constitutional unit represented by the formula (X) and the constitutional unit represented by the formula (Z) in the terminal block)=0

($E_1$ of the constitutional unit having a crosslinkable group in the terminal block)=0.075

($E_1$ of the constitutional unit represented by the formula (Y) in the block copolymer)=0.40+0.025+0.10+0.10=0.625

($E_1$ of the constitutional unit represented by the formula (X) in the block copolymer)=0.30

($E_1$ of the constitutional unit represented by the formula (Z) in the block copolymer)=0

($E_1$ of the constitutional unit represented by the formula (X) and the constitutional unit represented by the formula (Z) in the block copolymer)=0.30+0=0.30

($E_1$ of the constitutional unit having a crosslinkable group in the block copolymer)=0.075

$E_2$ is determined as follows.

($E_2$ in the non-terminal block)=(0.40×0)+(0.30×0)+(0.025×0)=0

($E_2$ in the terminal block)=(0.10×0)+(0.10×0)+(0.075×2)=0.15

($E_2$ in the block copolymer)=(0.40×0)+(0.30×0)+(0.025×0)+(0.10×0)+(0.10×0)+(0.075×2)=0.15

In the block copolymer P1, the total number of each constitutional unit and crosslinkable group is determined as follows.

(Total number of the constitutional unit represented by the formula (Y) in the non-terminal block)=(0.425×1000)/606.835=0.700

(Total number of the constitutional unit represented by the formula (X) in the non-terminal block)=$X_I$=(0.30×1000)/606.835=0.494

(Total number of the constitutional unit represented by the formula (Z) in the non-terminal block)=$Z_I$=(0×1000)/606.835=0

(Total number of the constitutional unit represented by the formula (X) and the constitutional unit represented by the formula (Z) in the non-terminal block)=$X_I$+$Z_I$=(0.30×1000)/606.835=0.494

(Total number of the constitutional unit having the crosslinkable group in the non-terminal block)=(0×1000)/606.835=0

(Total number of the crosslinkable group in the non-terminal block)=(0×1000)/606.835=0

(Total number of the constitutional unit represented by the formula (Y) in the terminal block)=(0.20×1000)/606.835=0.330

(Total number of the constitutional unit represented by the formula (X) in the terminal block)=$X_{II}$=(0×1000)/606.835=0

(Total number of the constitutional unit represented by the formula (Z) in the terminal block)=$Z_{II}$=(0×1000)/606.835=0

(Total number of the constitutional unit represented by the formula (X) and the constitutional unit represented by the formula (Z) in the terminal block)=$X_{1I}$+$Z_{1I}$=(0×1000)/606.835=0

(Total number of the constitutional unit having the crosslinkable group in the terminal block)=(0.075×1000)/606.835=0.124

(Total number of the crosslinkable group in the terminal block)=(0.15×1000)/606.835=0.247

(Total number of the constitutional unit represented by the formula (Y) in the block copolymer)=(0.625×1000)/606.835=1.030

(Total number of the constitutional unit represented by the formula (X) in the block copolymer)=(0.30×1000)/606.835=0.494

(Total number of the constitutional unit represented by the formula (Z) in the block copolymer)=(0×1000)/606.835=0

(Total number of the constitutional unit represented by the formula (X) and the constitutional unit represented by the formula (Z) in the block copolymer)=(0.30×1000)/606.835=0.494

(Total number of the constitutional unit having the crosslinkable group in the block copolymer)=(0.075×1000)/606.835=0.124

(Total number of the crosslinkable group in the block copolymer)=(0.15×1000)/606.835=0.247

In the block copolymer, the total number of the constitutional unit represented by the formula (Y) contained in the non-terminal block is usually 0 or more and 50 or less. In the block copolymer, when the non-terminal block contains a constitutional unit represented by the formula (Y), the total number of the constitutional unit represented by the formula (Y) contained in the non-terminal block is preferably 0.01 or more and 20 or less, more preferably 0.05 or more and 10 or less, further preferably 0.1 or more and 5 or less, particularly preferably 0.1 or more and 3 or less, especially preferably 0.1 or more and 2 or less, and may also be 0.5 or more and 2 or less, from the viewpoint of improving the charge transportability of the block copolymer.

In the block copolymer, the total number ($X_I$) of the constitutional unit represented by the formula (X) contained in the non-terminal block is usually 0 or more and 50 or less. In the block copolymer, when the non-terminal block contains the constitutional unit represented by the formula (X), the total number ($X_I$) of the constitutional unit represented by the formula (X) contained in the non-terminal block is preferably 0.01 or more and 20 or less, more preferably 0.05 or more and 10 or less, further preferably 0.1 or more and 5 or less, particularly preferably 0.2 or more and 3 or less, and especially preferably 0.3 or more and 2 or less, from the viewpoint of improving the charge transportability of the block copolymer.

In the block copolymer, the total number ($Z_I$) of the constitutional unit represented by the formula (Z) contained in the non-terminal block is usually 0 or more and 50 or less, and from the viewpoint of improving the charge transportability of the block copolymer, it is preferably 0 or more and 20 or less, more preferably 0 or more and 10 or less, further preferably 0 or more and 5 or less, particularly preferably 0 or more and 2 or less, especially preferably 0 or more and 1 or less, especially more preferably 0 or more and 0.1 or less, and especially further preferably 0.

In the block copolymer, the total number ($X_I$+$Z_1$) of the constitutional units represented by the formula (X) and the constitutional units represented by the formula (Z) contained in the non-terminal block is usually 0.01 or more and 50 or less, and from the viewpoint of improving the charge transportability of the block copolymer, it is preferably 0.01 or more and 20 or less, more preferably 0.05 or more and 10 or less, further preferably 0.1 or more and 5 or less, particularly preferably 0.2 or more and 3 or less, and especially preferably 0.3 or more and 2 or less.

In the block copolymer, the total number of the constitutional unit having a crosslinkable group contained in the non-terminal block is usually 0 or more and 10 or less, and from the viewpoint of improving the charge transportability of the block copolymer, it is preferably 0 or more and 5 or more, more preferably 0 or more and 1 or less, further preferably 0 or more and 0.5 or less, may be 0 or more and 0.1 or less, and may also be 0.

In the block copolymer, the total number of the crosslinkable group contained in the non-terminal block is usually 0 or more and 10 or less, and from the viewpoint of improving the charge transportability of the block copolymer, it is preferably 0 or more and 5 or less, more preferably 0 or more and 1 or less, may be 0 or more and 0.1 or less, and may also be 0.

In the block copolymer, the total number of the constitutional unit represented by the formula (Y) contained in the terminal block is usually 0 or more and 50 or less. In the block copolymers, when the terminal block contains the constitutional unit represented by the formula (Y), the total number of the constitutional unit represented by the formula (Y) contained in the terminal block (Y) is preferably 0.01 or more and 20 or less, more preferably 0.03 or more and 10 or less, further preferably 0.05 or more and 5 or less, particularly preferably 0.1 or more and 1 or less, and especially preferably 0.1 or more and 0.5 or less, from the viewpoint of improving the charge transportability of the block copolymer.

In the block copolymer, the total number ($X_{II}$) of the constitutional units represented by the formula (X) contained in the terminal block is usually 0 or more and 10 or less, and from the viewpoint of improving the charge transportability of the block copolymer, it is preferably 0 or more and 5 or less, more preferably 0 or more and 1 or less, further preferably 0 or more and 0.5 or less, particularly preferably 0 or more and 0.3 or less, may be 0 or more and 0.1 or less, and may also be 0.

In the block copolymer, the total number ($Z_{II}$) of the constitutional unit represented by the formula (Z) contained in the terminal block is usually 0 or more and 10 or less, and from the viewpoint of improving the charge transportability of the block copolymer, it is preferably 0 or more and 5 or less, more preferably 0 or more and 1 or less, further preferably 0 or more and 0.1 or less, and particularly preferably 0.

In the block copolymer, the total number ($X_{II}+Z_{II}$) of the constitutional unit represented by the formula (X) and the constitutional unit represented by the formula (Z) contained in the terminal block is usually 0 or more and 10 or less, and from the viewpoint of improving the charge transportability of the block copolymer, it is preferably 0 or more and 5 or less, more preferably 0 or more and 1 or less, further preferably 0 or more and 0.5 or less, particularly preferably 0 or more and 0.3 or less, may be 0 or more and 0.1 or less, and may also be 0.

In the block copolymer, the total number of the constitutional unit having the crosslinkable group contained in the terminal block is usually 0 or more and 50 or less. In the block copolymer, when the terminal block contains a constitutional unit having a crosslinkable group, the total number of the constitutional unit having a crosslinkable group contained in the terminal block is preferably 0.01 or more and 20 or less, more preferably 0.02 or more and 5 or less, further preferably 0.05 or more and 5 or less, particularly preferably 0.1 or more and 3 or less, especially preferably 0.1 or more and 1 or less, and especially more preferably 0.1 or more and 0.5 or less, from the standpoint of improving the charge transportability and improving the crosslinkability of the block copolymer.

In the block copolymer, the total number of the crosslinkable group contained in the terminal block is usually 0 or more and 50 or less. In the block copolymer, when the terminal block contains a crosslinkable group, the total number of the crosslinkable group contained in the terminal block is preferably 0.01 or more and 20 or less, more preferably 0.02 or more and 5 or less, further preferably 0.05 or more and 5 or less, particularly preferably 0.1 or more and 3 or less, and especially preferably 0.1 or more and 1 or less, from the viewpoint of improving the charge transportability and improving the crosslinkability of the block copolymer.

The total number of the constitutional unit represented by the formula (Y) contained in the block copolymer is usually 0 or more and 50 or less. When the block copolymer contains the constitutional unit represented by the formula (Y), the total number of the constitutional unit represented by the formula (Y) contained in the block copolymer is preferably 0.01 or more and 20 or less, more preferably 0.05 or more and 10 or less, further preferably 0.1 or more and 5 or less, particularly preferably 0.1 or more and 3 or less, and may be 0.5 or more and 3 or less, from the standpoint of improving the charge transportability of the block copolymer.

The total number of the constitutional unit represented by the formula (X) contained in the block copolymer is usually 0 or more and 50 or less. When the block copolymer contains the constitutional unit represented by the formula (X), the total number of the constitutional unit represented by the formula (X) contained in the block copolymer is preferably 0.01 or more and 20 or less, more preferably 0.05 or more and 10 or less, further preferably 0.1 or more and 5 or less, particularly preferably 0.2 or more and 3 or less, and especially preferably 0.3 or more and 2 or less, from the standpoint of improving the charge transportability of the block copolymer.

The total number of the constitutional unit represented by the formula (Z) contained in the block copolymer is usually 0 or more and 50 or less, and from the standpoint of improving the charge transportability of the block copolymer, it is preferably 0 or more and 20 or less, more preferably 0 or more and 10 or less, further preferably 0 or more and 5 or less, particularly preferably 0 or more and 2 or less, especially preferably 0 or more and 1 or less, especially more preferably 0 or more and 0.1 or less, and especially further preferably 0.

The total number of the constitutional unit represented by the formula (X) and the constitutional units represented by the formula (Z) contained in the block copolymer is usually 0.01 or more and 50 or less, and from the standpoint of improving the charge transportability of the block copolymer, it is preferably 0.01 or more and 20 or less, more preferably 0.05 or more and 10 or less, further preferably 0.1 or more and 5 or less, particularly preferably 0.2 or more and 3 or less, and especially preferably 0.3 or more and 2 or less.

The total number of the constitutional unit having the crosslinkable group contained in the block copolymer is usually 0 or more and 50 or less. When the block copolymer contains a constitutional unit having a crosslinkable group, the total number of the constitutional unit having a crosslinkable group contained in the block copolymer is preferably 0.01 or more and 20 or less, more preferably 0.01 or more and 10 or less, further preferably 0.02 or more and 5 or less, particularly preferably 0.05 or more and 5 or less, especially preferably 0.1 or more and 3 or less, and especially more preferably 0.1 or more and 1 or less, from the standpoint of improving the charge transportability and improving the crosslinkability of the block copolymer.

The total number of the crosslinkable group contained in the block copolymer is usually 0 or more and 50 or less. When the block copolymer contains a crosslinkable group, the total number of the crosslinkable groups contained in the block copolymer is preferably 0.01 or more and 20 or less, more preferably 0.01 or more and 10 or less, further preferably 0.02 or more and 5 or less, particularly preferably 0.05 or more and 5 or less, especially preferably 0.1 or more and 3 or less, especially more preferably 0.1 or more and 2 or less, and may also be 0.1 or more and 1 or less, from the viewpoint of improving the charge transportability and improving the crosslinkability of the block copolymer.

When the block copolymer according to the present invention satisfies at least one of the above-described formulae (i) to (iii), it is possible to obtain a block copolymer exhibiting good charge transportability. It is preferable for the block copolymer to satisfy at least two of the formulae (i) to (iii), from the viewpoint of improving the charge transportability of the block copolymer.

Further, it is preferable for the block copolymer to satisfy the formula (i) or the formula (iii), more preferable to satisfy the formula (i), and further preferable to satisfy the formula (i) and the formula (iii), from the viewpoint of improving the charge transportability of the block copolymer.

<Method for Producing Block Copolymer>

The block copolymer according to the present invention can be suitably produced by a method including the following steps.

[a] A step of polymerizing one or more compounds (monomers) forming a non-terminal block, to form a non-terminal block,

[b] A step of polymerizing one or more compounds (monomers) forming a terminal block, in the presence of the non-terminal block, to bond the terminal block to the non-terminal block, and

[c] A step of reacting a reagent (end-capping agent) for introducing an end group with the terminal block, to introduce the end group into the terminal block.

The above-described step [a] preferably includes a step of polymerizing at least one selected from the group consisting of a compound represented by the formula (M-5) described below and a compound represented by the formula (M-1) described below to form a non-terminal block, more preferably includes a step of polymerizing at least one selected from the group consisting of a compound represented by the formula (M-2) described below, a compound represented by the formula (M-3) described below and a compound represented by the formula (M-4) described below and at least one selected from the group consisting of a compound represented by the formula (M-5) described below and a compound represented by the formula (M-1) described below to form a non-terminal block, further preferably includes a step of polymerizing at least one selected from the group consisting of a compound represented by the formula (M-2) described below and a compound represented by the formula (M-4) described below and at least one selected from the group consisting of a compound represented by the formula (M-5) described below and a compound represented by the formula (M-1) described below to form a non-terminal block, and particularly preferably includes a step of polymerizing at least one selected from the group consisting of a compound represented by the formula (M-2) described below and a compound represented by the formula (M-4) described below and at least one compound represented by the formula (M-5) described below to form a non-terminal block.

The above-described step [b] preferably includes a step of polymerizing, in the presence of the non-terminal block, at least one selected from the group consisting of a compound represented by the formula (M-1) described below, a compound represented by the formula (M-2) described below, a compound represented by the formula (M-3) described below, a compound represented by the formula (M-4) described below and a compound represented by the formula (M-5) described below to bind the terminal block to the non-terminal block, more preferably includes a step of polymerizing, in the presence of the non-terminal block, at least one selected from the group consisting of a compound represented by the formula (M-2) described below, a compound represented by the formula (M-3) described below, a compound represented by the formula (M-4) described below and a compound represented by the formula (M-5) described below to bind the terminal block to the non-terminal block, and further preferably includes a step of polymerizing at least one selected from the group consisting of a compound represented by the formula (M-2) described below and a compound represented by the formula (M-3) described below to bind the terminal block to the non-terminal block.

In the above-described step [b], when the terminal block of the block copolymer according to the present invention contains a crosslinkable group, it is possible to polymerize at least one selected from the group consisting of a compound represented by the formula (M-2) described below and a compound represented by the formula (M-3) described below to form a terminal block containing a crosslinkable group.

When the terminal block of the block copolymer according to the present invention contains a crosslinkable group, the above-described step [b] preferably includes a step of polymerizing, in the presence of a non-terminal block, at least one selected from the group consisting of a compound represented by the formula (M-2) described below and a compound represented by the formula (M-3) described below to bind the terminal block to the non-terminal block, more preferably includes a step of polymerizing at least one selected from the group consisting of a compound represented by the formula (M-2) described below and a compound represented by the formula (M-3) described below and at least one selected from the group consisting of a compound represented by the formula (M-1) described below, a compound represented by the formula (M-4) described below and a compound represented by the formula (M-5) described below to bind the terminal block to the non-terminal block, and further preferably includes a step of polymerizing at least one selected from the group consisting of a compound represented by the formula (M-2) described below and a compound represented by the formula (M-3) described below and at least one selected from the group consisting of a compound represented by the formula (M-4) described below and a compound represented by the formula (M-5) described below to bind the terminal block to the non-terminal block.

The above-described step [c] preferably includes a step of reacting a compound (end-capping agent) represented by the formula (M-6) described below with the terminal block to introduce the end group into the terminal block. In the above-described step [c], when the end group of the block copolymer according to the present invention contains a crosslinkable group, for example, a compound having a crosslinkable group among compounds (end-capping agents) represented by the formula (M-6) described below (preferably, a compound represented by the formula (M-6) described below in which $Ar^T$ is a crosslinkable group) can be reacted with the terminal block to form an end group containing the crosslinkable group.

In the present specification, the compounds used for producing the block copolymer according to the present invention are collectively referred to as "raw material monomer" in some cases.

In each of the above steps, the raw material monomers, that is, the compound forming the non-terminal block, the compound forming the terminal block, and the end capping agent can be selected, respectively, so that each block contains a desired constitutional unit and the end group is constituted of a desired group, in the light of the description in the above section <Block Copolymer>.

In one embodiment of the method for producing a block copolymer according to the present invention, the above-described step [a] is a step of polymerizing at least one compound represented by the formula (M-4) described below and at least one selected from the group consisting of a compound represented by the formula (M-5) described below and a compound represented by the formula (M-1) to form a non-terminal block, the above-described step [b] is a step of polymerizing, in the presence of the non-terminal block, at least one compound represented by the formula (M-4) described below and at least one selected from the group consisting of a compound represented by the formula (M-2) described below and a compound represented by the formula (M-3) to bind the terminal block to the non-terminal block, and the above-described step [c] is a step of reacting a compound (end-capping agent) represented by the formula (M-6) described below with the terminal block to introduce the end group into the terminal block.

[Chemical Formula 65]

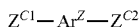
(M-1)

[Chemical Formula 66]

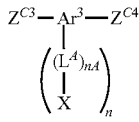
(M-2)

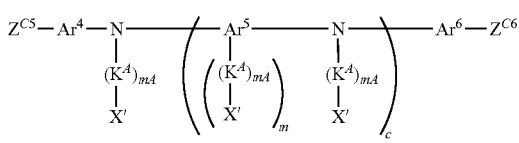
(M-3)

[Chemical Formula 67]

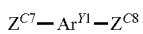
(M-4)

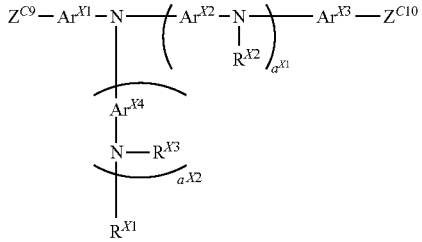
(M-5)

[Chemical Formula 68]

(M-6)

[wherein, $Ar^2$, $Ar^3$, $L^A$, nA, X, n, $Ar^4$, $Ar^5$, $Ar^6$, $K^A$, mA, X', m, c, $Ar^{Y1}$, $Ar^{X1}$, $Ar^{X2}$, $Ar^{X3}$, $Ar^{X4}$, $R^{X1}$, $R^{X2}$, $R^{X3}$, $a^{X1}$ and $a^{X2}$ represent the same meaning as described above.

$Ar^T$ represents an aryl group, a monovalent heterocyclic group or a crosslinkable group, and the foregoing groups optionally have a substituent.

$Z^{C1}$ to $Z^{C11}$ are each a reactive group, and each independently represent a group selected from the group consisting of Group B and Group C.].

The compound represented by the formula (M-1) is a compound capable of forming the constitutional unit represented by the formula (Z).

The compound represented by the formula (M-2) is a compound capable of forming the constitutional unit represented by the formula (2).

The compound represented by the formula (M-3) is a compound capable of forming the constitutional unit represented by the formula (2').

The compound represented by the formula (M-4) is a compound capable of forming the constitutional unit represented by the formula (Y).

The compound represented by the formula (M-5) is a compound capable of forming the constitutional unit represented by the formula (X).

The compound represented by the formula (M-6) is a compound capable of forming an end group.

From the viewpoint of stability of the block copolymer, $Ar^T$ is preferably an aryl group or a monovalent heterocyclic group, and more preferably an aryl group, and the foregoing groups optionally have a substituent. Further, $Ar^T$ is preferably a crosslinkable group because the crosslinkability of the block copolymer can be enhanced.

Examples and preferable examples of the aryl group and the monovalent heterocyclic group represented by $Ar^T$ are the same as the examples and preferable examples of the aryl group and the monovalent heterocyclic group in the end group.

Group B and Group C are as follows, respectively.

(Group B)

A chlorine atom, a bromine atom, an iodine atom, a group represented by $—O—S(=O)_2R^{C1}$ (wherein, $R^{C1}$ represents an alkyl group, a cycloalkyl group or an aryl group, and the foregoing groups optionally have a substituent.).

(Group C)

A group represented by $—B(OR^{C2})_2$ (wherein, $R^{C2}$ represents a hydrogen atom, an alkyl group, a cycloalkyl group or an aryl group, and the foregoing groups optionally have a substituent. A plurality of $R^{C2}$ may be the same or different, and may be combined together to form a ring structure together with oxygen atoms to which they are attached);

a group represented by $—BF_3Q'$ (wherein, Q' represents Li, Na, K, Rb or Cs);

a group represented by $—MgY'$ (wherein, Y' represents a chlorine atom, a bromine atom or an iodine atom);

a group represented by $—ZnY''$ (wherein, Y'' represents a chlorine atom, a bromine atom or an iodine atom); and a group represented by $—Sn(R^{C3})_3$ (wherein, $R^{C3}$ represents a hydrogen atom, an alkyl group, a cycloalkyl group or an aryl group, and the foregoing groups optionally have a substituent. A plurality of $R^{C3}$ may be the same or different, and may be combined together to form a ring structure together with tin atoms to which they are attached.).

Examples of the group represented by —B(OR$^{C2}$)$_2$ include groups represented by the following formulae in addition to —B(OH)$_2$.

[Chemical Formula 69]

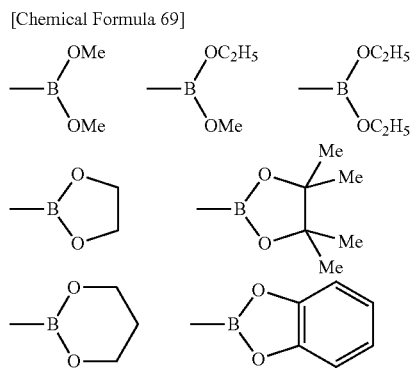

The raw material monomers for forming each block can have two reactive groups selected from Group B or Group C, as is the case with the compounds represented by the formulae (M-1) to (M-5) described above. It is preferable that the two reactive groups which each of the raw material monomer for forming each block has are both selected from Group B or both selected from Group C, since production of the raw material monomer is easy.

For example, a compound having a group selected from Group B and a compound having a group selected from Group C are subjected to a known coupling reaction, to generate a bond between a carbon atom bonded to a group selected from Group B and a carbon atom bonded to a group selected from Group C. Hence, if a compound having two groups selected from Group B and a compound having two groups selected from Group C are subjected to a known coupling reaction, a condensation polymer of these compounds can be obtained by condensation polymerization.

By the condensation polymerization, formation of a non-terminal block and binding of a terminal block to a non-terminal block (formation of a terminal block) can be performed.

When the production method according to the above-mentioned embodiment is taken as an example, for example, when $Z^{C1}$, $Z^{C2}$, $Z^{C3}$, $Z^{C4}$, $Z^{C5}$, $Z^{C6}$, $Z^{C9}$, and $Z^{C10}$ are groups selected from Group B, if a group selected from Group C is selected as $Z^{C7}$ and $Z^{C8}$, formation of a non-terminal block and binding of a terminal block to a non-terminal block (formation of a terminal block) can be performed by condensation polymerization. When $Z^{C1}$, $Z^{C2}$, $Z^{C3}$, $Z^{C4}$, $Z^{C5}$, $Z^{C6}$, $Z^{C9}$ and $Z^{C10}$ are groups selected from the C group, if a group selected from Group B is selected as $Z^{C7}$ and $Z^{C8}$, formation of a non-terminal block and binding of a terminal block to a non-terminal block (formation of a terminal block) can be performed by condensation polymerization.

Further, one embodiment in which two or more compounds represented by the formula (M-1) to the formula (M-5) are used in the production method according to the above-mentioned embodiment will be explained with reference to the case where two or more compounds represented by the formula (M-4) are used. When performing formation of a non-terminal block or a terminal block using two or more compounds represented by the formula (M-4), if $Z^{C7}$ and $Z^{C8}$ of any at least one compound among at least two compounds represented by the formula (M-4) are selected from Group C and $Z^{C7}$ and $Z^{C8}$ of the other at least one compound are selected from Group B, formation of a non-terminal block or formation of a terminal block can be performed by condensation polymerization.

Introduction of an end group into a terminal block can be carried out by utilizing the same reaction. That is, when the end of the terminal block is a group selected from Group B, an end group can be introduced by a coupling reaction if a group selected from Group C is selected as $Z^{C11}$. When the end of a terminal block is a group selected from Group C, an end group can be introduced by a coupling reaction if a group selected from Group B is selected as $Z^{C11}$.

In the case of producing a block copolymer by the above condensation polymerization in which a non-terminal block and a terminal block are each formed using a compound having two groups selected from Group B and a compound having two groups selected from Group C as raw material monomers, it is preferable to appropriately control the amount ratio of the raw material monomers used in each of the step of forming a non-terminal block (step [a] described above) and the step of forming a terminal block (step [b] described above).

That is, in the step [a], it is preferable to use one of the compound having two groups selected from Group B and the compound having two groups selected from Group C in excess on a molar basis. This makes it possible to reliably produce a non-terminal block having a group selected from Group B or a group selected from Group C at the end. When the compound used in excess is a compound having two groups selected from Group B, a non-terminal block having a group selected from Group B at the end is produced, while when the compound used in excess is a compound having two groups selected from Group C, a non-terminal block having a group selected from Group C at the end is produced.

In the subsequent step [b], it is preferable that a compound not used in excess in the step [a], among the compound having two groups selected from Group B and the compound having two groups selected from Group C, is used in excess on a molar basis. This makes it possible to reliably produce a terminal block which is bonded to the non-terminal block and has a group selected from Group C or a group selected from Group B at the end. When the compound used in excess is a compound having two groups selected from Group B, a terminal block having a group selected from Group B at the end is produced, while when the compound used in excess is a compound having two groups selected from Group C, a terminal block having a group selected from Group C at the end is produced.

When a terminal block having a group selected from Group B at the end is produced in the step [b], an end-capping agent having a group selected from Group C is used in the step [c]. In the step [b], when a terminal block having a group selected from Group C at the end is produced, an end-capping agent having a group selected from Group B is used in the step [c].

The control of the use amount ratio of the raw material monomer in production of the block copolymer will be described in detail with reference to the block copolymer P1 used in Example 1 as an example.

In Example 1, the mixture P1a was used for the formation of a non-terminal block, and this mixture contains a compound M1 which is a compound having two groups selected from Group C, a compound M2 which is a compound having two groups selected from Group B and a compound M3 which is a compound having two groups selected from Group B at a molar ratio of 40:30:2.5. As described, for the mixture P1a, the use amount ratio is controlled so that the compound having two groups selected from Group C is excess on a molar basis. Hence, the non-terminal block to be formed has a group selected from Group C at the end.

Further, the mixture P1b is used for forming a terminal block, and this mixture contains a compound M1 which is a compound having two groups selected from Group C, a compound M4 which is a compound having two groups selected from Group B and a compound M5 which is a compound having two groups selected from Group B at a molar ratio of 10:10:7.5. As described above, for the mixture P1b, the use amount ratio is controlled so that the compound having two groups selected from Group B is in excess on a molar basis. Thus, a terminal block which binds to a non-terminal block having a group selected from Group C at the end, and has a group selected from Group B at the end, is formed.

Phenylboronic acid, which is the end-capping agent used in Example 1, is a compound having one group selected from Group C. Therefore, phenylboronic acid is bonded to a terminal block having a group selected from Group B at the end, to seal the end of the block copolymer and to form a phenyl group as the end group.

The above-described condensation polymerization (coupling reaction) is usually carried out in the presence of a catalyst, a base and a solvent, but it may be carried out in the co-existence of a phase transfer catalyst, if necessary.

The catalyst includes, for example, transition metal complexes such as palladium complexes such as bis(triphenylphosphine)palladium(II) dichloride, bis(tris-o-methoxyphenylphosphine)palladium(II) dichloride, tetrakis(triphenylphosphine)palladium (0), tris(dibenzylideneacetone)dipalladium(0), palladium acetate and the like, nickel complexes such as tetrakis(triphenylphosphine)nickel(0), [1,3-bis(diphenylphosphino)propane]nickel(II) dichloride, bis(1,4-cyclooctadiene)nickel(0) and the like; these transition metal complexes further having a ligand such as triphenylphosphine, tri(o-tolyl)phosphine, tri(tert-butyl)phosphine, tricyclohexylphosphine, 1,3-bis(diphenylphosphino)propane, bipyridyl and the like. The catalyst may be used alone or in combination of two or more.

The amount of the catalyst used is usually 0.00001 molar equivalent or more and 3 molar equivalent or less as the amount of the transition metal with respect to the sum of the number of moles of the raw material monomers.

The base and the phase transfer catalyst include, for example, inorganic bases such as sodium carbonate, potassium carbonate, cesium carbonate, potassium fluoride, cesium fluoride, tripotassium phosphate and the like; organic bases such as tetrabutylammonium fluoride, tetraethylammonium hydroxide, tetrabutylammonium hydroxide and the like; phase transfer catalysts such as tetrabutylammonium chloride, tetrabutylammonium bromide and the like. The base and the phase transfer catalyst may each be used alone or in combination of two or more.

Each of the use amounts of the base and the phase transfer catalyst is usually 0.001 molar equivalent or more and 100 molar equivalent or less with respect to the total number of moles of the raw material monomers.

The solvent includes, for example, organic solvents such as toluene, xylene, mesitylene, tetrahydrofuran, 1,4-dioxane, dimethoxyethane, N,N-dimethylacetamide, N,N-dimethylformamide and the like, and water. The solvent may be used alone or in combination of two or more.

The amount of the solvent used is usually 10 parts by mass or more and 100000 parts by mass or less with respect to 100 parts by mass of the sum of the raw material monomers.

The reaction temperature of the condensation polymerization is usually −100° C. or higher and 200° C. or lower. The reaction time of the condensation polymerization is usually 1 hour or more.

For the post-treatment of the condensation polymerization reaction (coupling reaction), known methods, for example, a method for removing water-soluble impurities by liquid separation, a method in which the reaction liquid after the reaction is added to a lower alcohol such as methanol or the like, the deposited precipitate is filtered, then, dried, and other methods, can be used alone or in combination.

When the purity of the block copolymer is low, it can be purified by a usual method such as, for example, crystallization, reprecipitation, continuous extraction with a Soxhlet extractor, column chromatography and the like.

<Composition>

The composition according to the present invention contains the block copolymer according to the present invention and other components other than the block copolymer.

The other component is preferably at least one component selected from the group consisting of a hole transporting material, a hole injection material, an electron transporting material, an electron injection material, a light emitting material, an antioxidant and a solvent. The hole transporting material, the hole injection material, the electron transporting material, the electron injection material and the light emitting material referred to here are different from the block copolymer according to the present invention.

In the composition according to the present invention, the block copolymer according to the present invention may be contained alone or in combination of two or more.

[Ink]

A composition containing a block copolymer and a solvent (hereinafter, also referred to as "ink") is suitable for fabricating a light emitting device using a printing method such as an inkjet printing method, a nozzle printing method or the like.

The block copolymer and the solvent may each be used alone or in combination of two or more.

The ink may further contain at least one component selected from the group consisting of a hole transporting material, a hole injection material, an electron transporting material, an electron injection material, a light emitting material and an antioxidant.

The viscosity of the ink can be adjusted according to the type of the printing method, but is preferably 1 mPa·s or more and 20 mPa·s or less at 25° C.

The solvent contained in the ink is preferably a solvent capable of dissolving or uniformly dispersing the solid content in the ink.

The solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-dodecane, bicyclohexyl and the like; ketone solvents such as acetone, methyl ethyl ketone, cyclohexanone, acetophenone and the like; ester solvents such as ethyl acetate, butyl acetate, ethyl cellosolve acetate, methyl benzoate, phenyl acetate and the like; polyhydric alcohol solvents such as ethylene glycol, glycerin, 1,2-hexanediol and the like; alcohol solvents such as isopropyl alcohol, cyclohexanol and the like; sulfoxide solvents such as dimethyl sulfoxide and the like; amide solvents such as N-methyl-2-pyrrolidone, N,N-dimethylformamide and the like.

In the ink, the content of the solvent is usually 1000 parts by mass or more and 100000 parts by mass or less with respect to 100 parts by mass of the block copolymer.

[Hole Transporting Material]

The hole transporting material is classified into a low molecular weight compound and a polymer compound, and is preferably a polymer compound having a crosslinkable group.

The polymer compound includes, for example, polyvinylcarbazole and its derivatives; and polyarylene having an aromatic amine structure in its side chain or main chain and its derivatives. The polymer compound may be a compound to which an electron accepting site such as fullerene, tetrafluorotetracyanoquinodimethane, tetracyanoethylene, trinitrofluorenone and the like is bonded.

In the composition according to the present invention, the content of the hole transporting material is usually 1 part by mass or more and 400 parts by mass or less with respect to 100 parts by mass of the block copolymer according to the present invention.

The hole transporting materials may be used alone or in combination of two or more.

[Electron Transporting Material]

The electron transporting material is classified into a low molecular weight compound and a polymer compound. The electron transporting material may have a crosslinkable group.

The low molecular weight compound includes, for example, a metal complex having 8-hydroxyquinoline as a ligand; oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof. The polymer compound may be doped with a metal.

In the composition of the present invention, the content of the electron transporting material is usually 1 part by mass or more and 400 parts by mass or less with respect to 100 parts by mass of the block copolymer of the present invention.

The electron transporting material may be used alone or in combination of two or more.

[Hole Injection Material and Electron Injection Material]

The hole injection material and the electron injection material are each classified into a low molecular weight compound and a polymer compound. The hole injection material and the electron injection material may have a crosslinkable group.

The low molecular weight compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylene vinylene, polythienylene vinylene, polyquinoline and polyquinoxaline, and derivatives thereof; conductive polymers such as polymers containing an aromatic amine structure in its main chain or side chain.

In the composition according to the present invention, the content of each of the hole injection material and the electron injection material is usually 1 part by mass or more and 400 parts by mass or less with respect to 100 parts by mass of the block copolymer according to the present invention.

The hole injection material and the electron injection material may each be used alone in combination of two or more.

[Ion Doping]

When the hole injection material or the electron injection material contains a conductive polymer, the electrical conductivity of the conductive polymer is preferably $1 \times 10^{-5}$ S/cm or more and $1 \times 10^3$ S/cm or less.

In order to set the electric conductivity of the conductive polymer within the above range, the conductive polymer can be doped with an appropriate amount of ions. The types of ions to be doped are anions for hole injection materials and cations for electron injection materials.

The anion includes, for example, a polystyrenesulfonate ion, an alkylbenzenesulfonate ion and a camphorsulfonate ion.

The cation includes, for example, a lithium ion, a sodium ion, a potassium ion, and a tetrabutylammonium ion.

The ions to be doped may be used alone or in combination of two or more.

[Light Emitting Material]

The light emitting material is classified into a low molecular weight compound and a polymer compound. The light emitting material may have a crosslinkable group.

The low molecular weight compound includes, for example, naphthalene and its derivatives, anthracene and its derivatives, perylene and its derivatives, and, phosphorescent compounds having iridium, platinum or europium as the central metal.

The phosphorescent compound usually means a compound exhibiting a phosphorescent property at room temperature (25° C.), and is preferably a metal complex which emits light from the triplet excited state at room temperature. This metal complex which emits light from the triplet excited state has a central metal atom and a ligand.

The polymer compound includes, for example, polymer compounds containing a phenylene group, a naphthalenediyl group, a fluorenediyl group, a phenanthrenediyl group, a dihydrophenanthrenediyl group, a group represented by the formula (X), a carbazolediyl group, a phenoxazinediyl group, phenothiazinediyl group, an anthracenediyl group, a pyrenediyl group, and the like.

Examples of the phosphorescent compound include the following metal complexes.

[Chemical Formula 70]
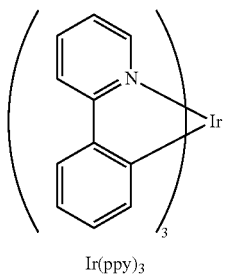
Ir(ppy)₃
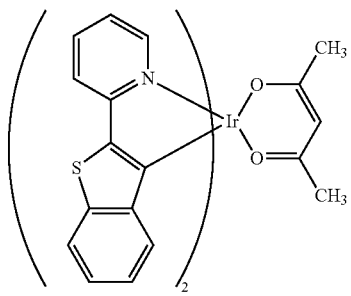
Btp₂Ir(acac)
Flrpic
PtOEP
[Chemical Formula 71]
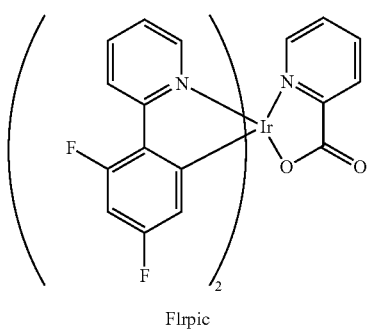
Eu(TTA)₃phen
COM-1
COM-2 COM-3
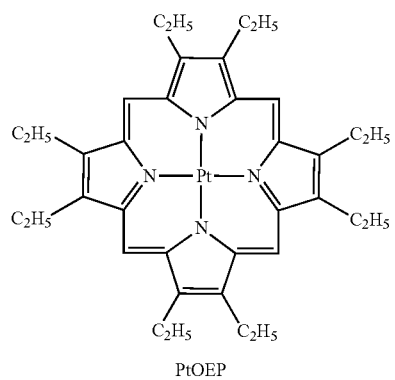

-continued
[Chemical Formula 72]
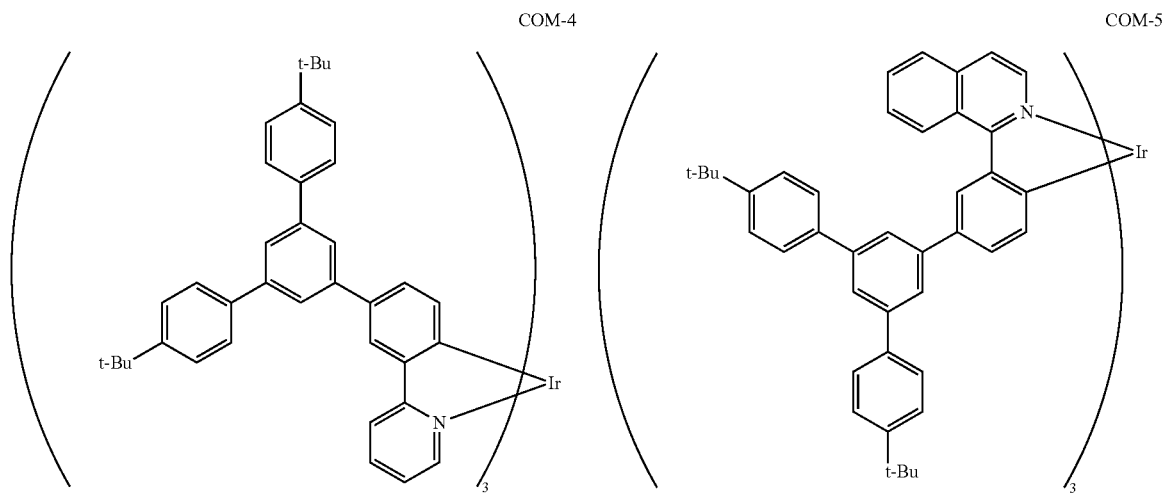
COM-4
COM-5
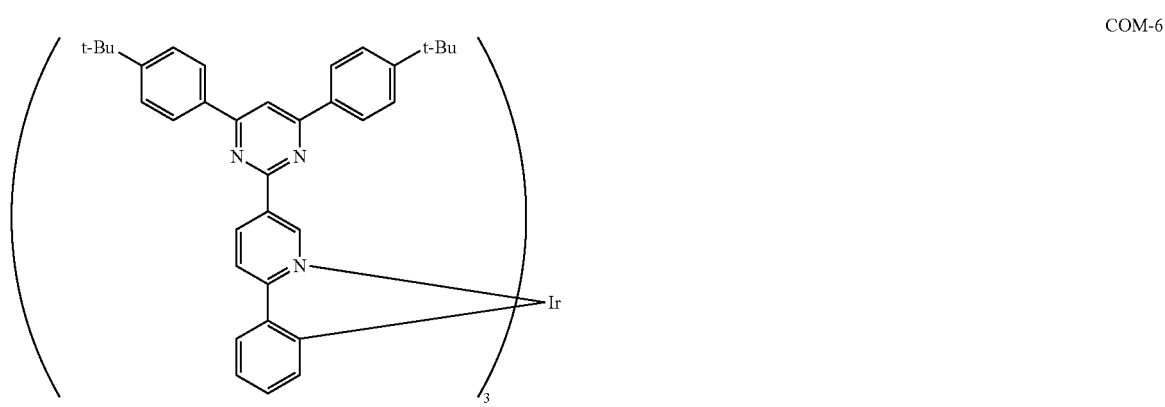
COM-6
[Chemical Formula 73]
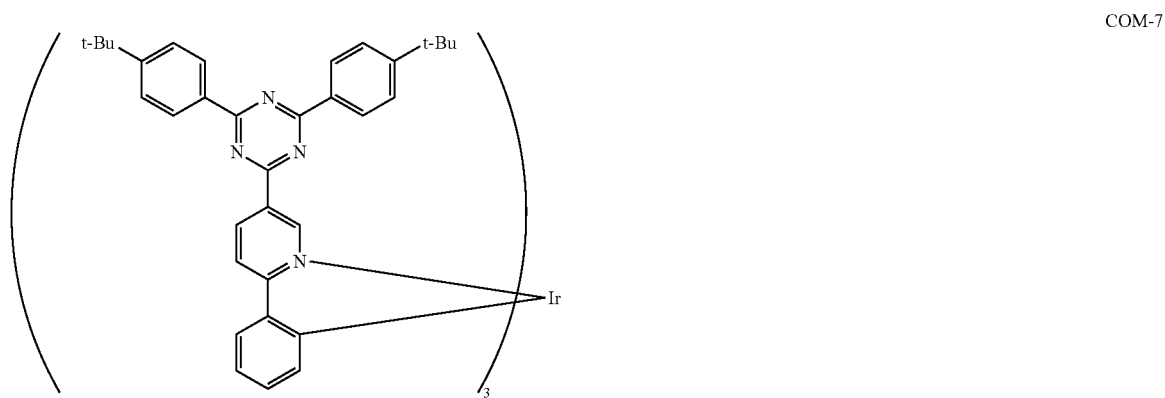
COM-7

-continued
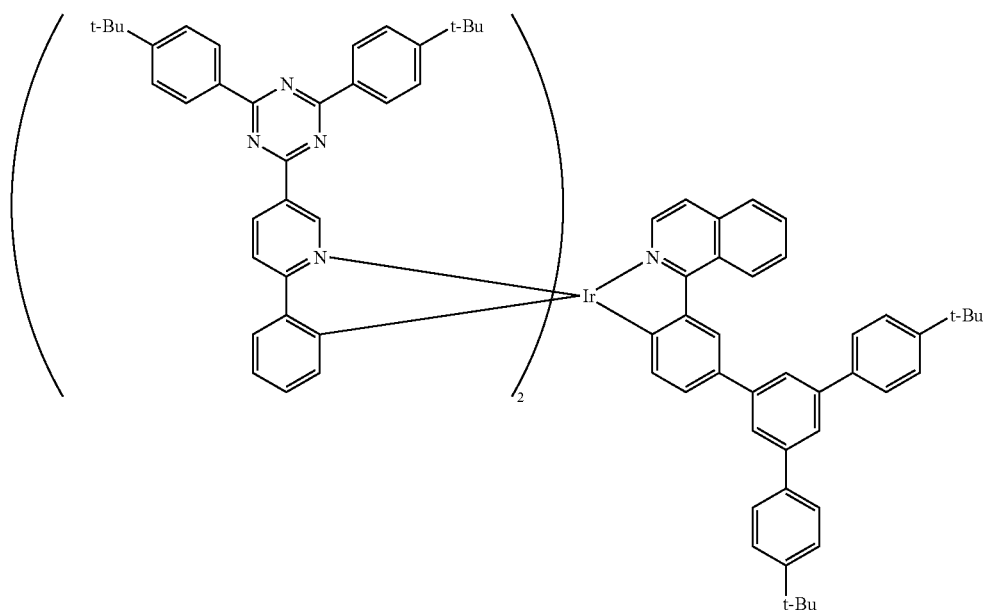
COM-8
[Chemical Formula 74]
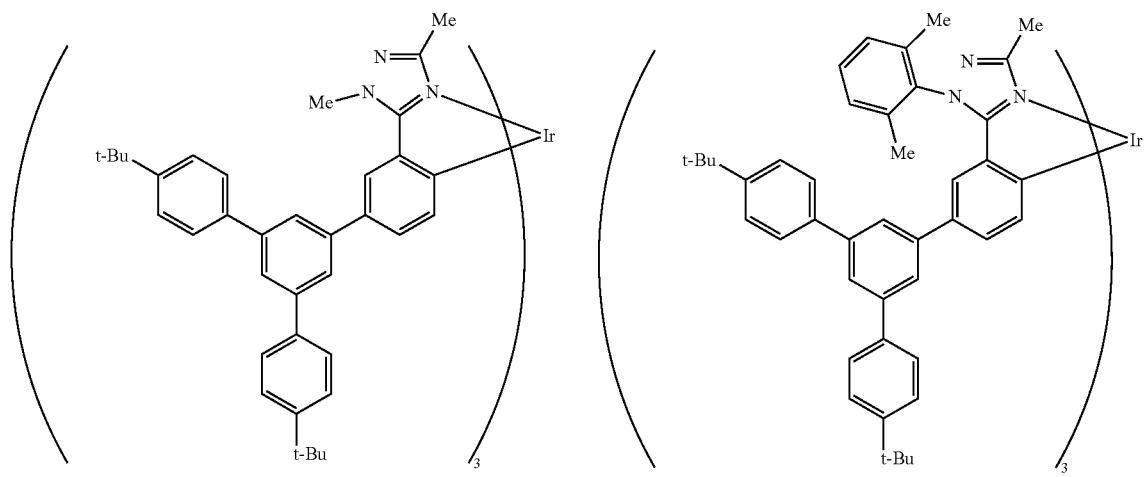
COM-9   COM-10
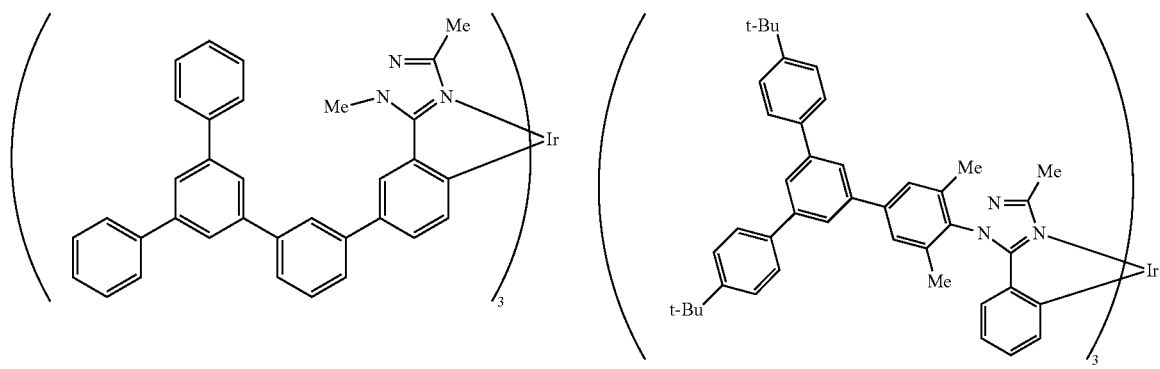
COM-11   COM-12

COM-13
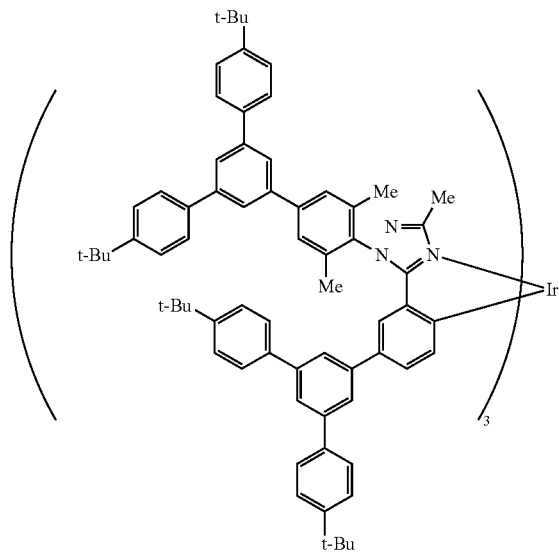
[Chemical Formula 75]
COM-14
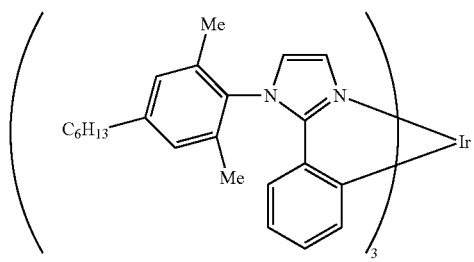
COM-15
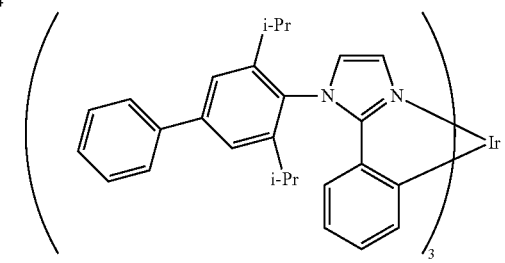
COM-16
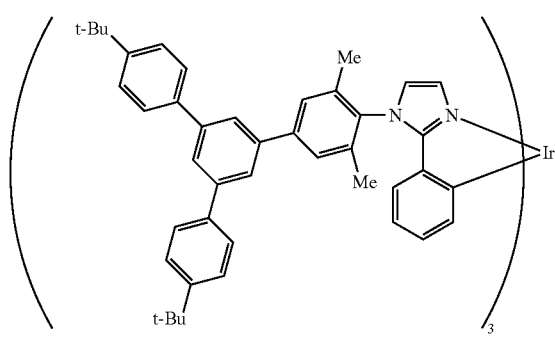
COM-17
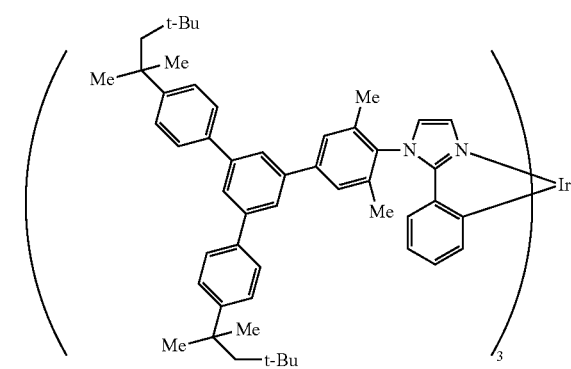

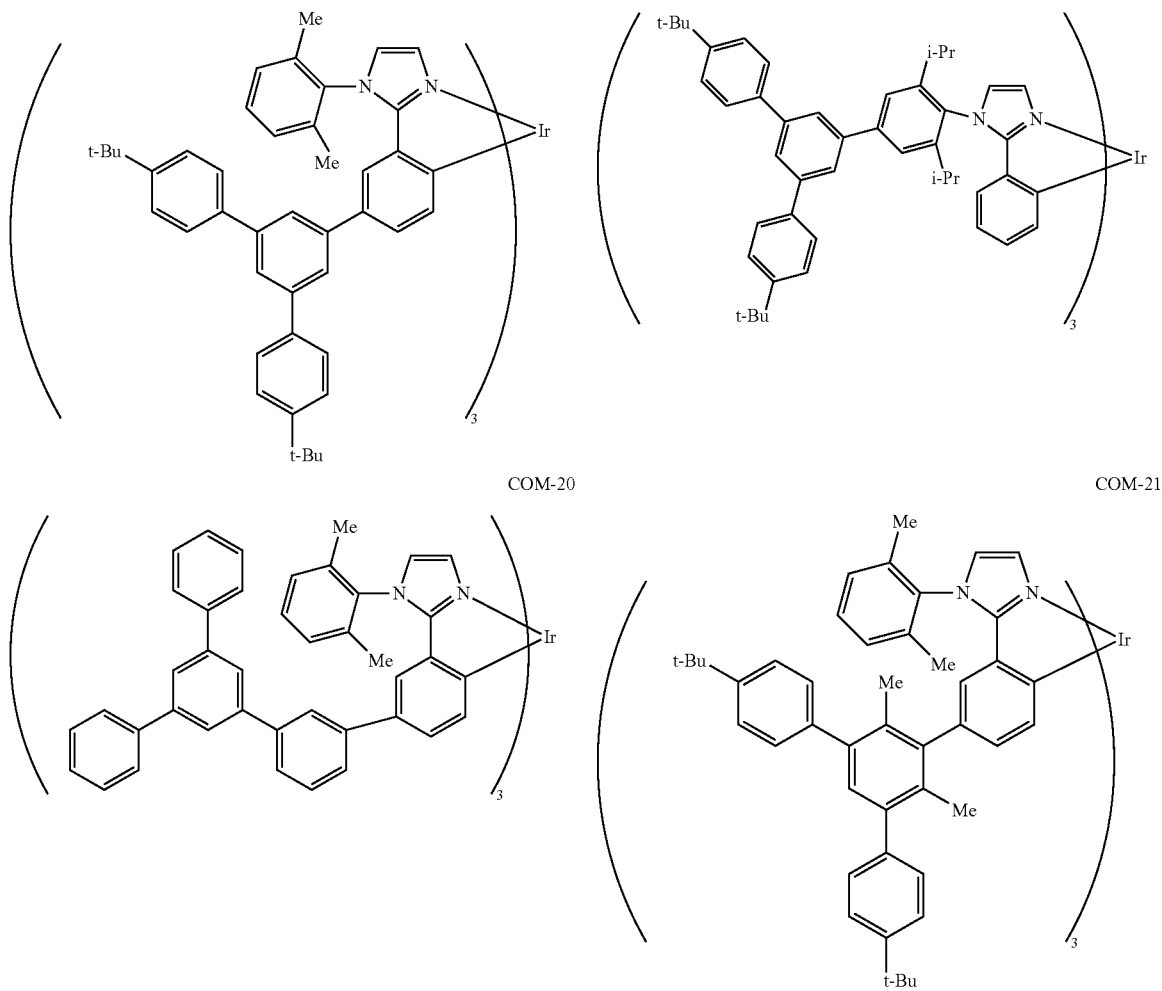

In the composition of the present invention, the content of the light emitting material is usually 0.1 to 1000 parts by mass, and preferably 0.1 part by mass or more and 400 parts by mass or less with respect to 100 parts by mass of the block copolymer of the present invention.

The light emitting material may be used only singly or in combination of two or more.

[Antioxidant]

The antioxidant is preferably a compound that is soluble in the solvent contained in the composition and does not inhibit light emission and charge transportation, and examples thereof include a phenol-based antioxidant and a phosphorus-based antioxidant.

In the composition according to the present invention, the content of the antioxidant is usually 0.001 part by mass or more and 10 parts by mass or less with respect to 100 parts by mass of the block copolymer according to the present invention.

The antioxidant may be used only singly or in combination of two or more.

<Film>

The block copolymer according to the present invention can be used as a film forming material.

The film may contain the block copolymer according to the present invention as it is, or may contain a cross-linked product of the block copolymer according to the present invention, or may contain both the block copolymer according to the present invention and a cross-linked product thereof.

The crosslinked product of the block copolymer means a substance in a state where the block copolymer is cross-linked intramolecularly or intermolecularly, or both intramolecularly and intermolecularly.

The crosslinked product of the block copolymer according to the present invention may be a crosslinked product in which the block copolymer according to the present invention and another compound are intermolecularly cross-linked.

The above film can be suitably applied as a film (layer) included in the light emitting device.

The film containing the crosslinked product can be obtained by crosslinking the film containing the block copolymer according to the present invention by an external stimulus such as heating or light irradiation.

Since the film containing the crosslinked product is substantially insolubilized in a solvent, it can be suitably used for laminating a light emitting device described later.

The above film, especially the film containing the above crosslinked product, is suitable as a hole transporting layer in a light emitting device.

The heating temperature for crosslinking the film is usually 25° C. or higher and 300° C. or lower, and from the viewpoint of stability of the film containing the crosslinked product, it is preferably 50° C. or higher and 250° C. or lower, and more preferably 150° C. or higher and 200° C. or lower, The type of light used for light irradiation for crosslinking the film is, for example, ultraviolet light, near-ultraviolet light, or visible light.

The film containing the block copolymer according to the present invention can be formed by coating the above-described ink by, for example, a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an inkjet printing method, a capillary coating method, a nozzle coating method, and if necessary, drying. By heating the obtained film or irradiating the film with light, a film containing the crosslinked product can be formed.

The thickness of the film is usually 1 nm or more and 10 µm or less.

<Light Emitting Device>

The light emitting device according to the present invention is a light emitting device containing a crosslinked product of the block copolymer according to the present invention.

In one embodiment according to the present invention, the light emitting device has electrodes composed of an anode and a cathode, and a layer (film) containing a crosslinked product of the block copolymer of the present invention disposed between the electrodes.

[Layer Constitution of Light Emitting Device]

The layer containing the crosslinked product of the block copolymer according to the present invention is usually at least one layer selected from the group consisting of a light emitting layer, a hole transporting layer, a hole injection layer, an electron transporting layer and an electron injection layer, and is preferably a hole injection layer, a hole transporting layer and/or a light emitting layer, and more preferably a hole transporting layer.

The light emitting layer, the hole transporting layer, the hole injecting layer, the electron transporting layer and the electron injecting layer contain a light emitting material, a hole transporting material, a hole injection material, an electron transporting material and an electron injection material, respectively. These layers can be formed by dissolving the light emitting material, the hole transporting material, the hole injection material, the electron transporting material and the electron injection material respectively in the above-mentioned solvent to prepare inks, and using the same method as for the above-described film fabrication.

The light emitting device has a light emitting layer between an anode and a cathode. The light emitting device according to the present invention preferably has at least one of a hole injection layer and a hole transporting layer between an anode and a light emitting layer from the viewpoint of hole injectability and hole transportability, and preferably has at least one of an electron injection layer and an electron transporting layer between a cathode and a light emitting layer from the standpoint of electron injectability and electron transportability.

The materials for a hole transporting layer, an electron transporting layer, a light emitting layer, a hole injection layer and an electron injection layer include the above-described hole transporting material, electron transporting material, light emitting material, hole injection material and electron injection material, respectively, in addition to the block copolymer according to the present invention.

If the material of a hole transporting layer, the material of an electron transporting layer and the material of a light emitting layer are soluble in a solvent used in forming layers adjacent to the hole transporting layer, the electron transporting layer and the light emitting layer, respectively, in fabrication of a light emitting device, it is preferable that the materials has a crosslinkable group for avoiding dissolution of the materials in the solvent. After forming each layer using the material having a crosslinkable group, the crosslinkable group can be crosslinked to insolubilize the layer.

As the method of forming each layer such as a light emitting layer, a hole transporting layer, an electron transporting layer, a hole injection layer, and electron injection layer and the like in a light emitting device according to the present invention, for example, a vacuum vapor deposition method from a powder, and a method by film formation from a solution or melted state are used when a low molecular weight compound is used, and for example, a method by film formation from a solution or melted state is used when a polymer compound is used.

The order, the number, and the thickness of the layers to be laminated can be adjusted in consideration of the luminous efficiency of the light emitting device and the device life.

[Substrate/Electrode]

The substrate in the light emitting device is preferably a substrate that can form an electrode and does not chemically change when forming the organic layer, and is a substrate made of a material such as glass, plastic, or silicon. When an opaque substrate is used, it is preferable that the electrode farthest from the substrate is transparent or semitransparent.

The material for the anode includes, for example, conductive metal oxides and semitransparent metals, preferably, indium oxide, zinc oxide, tin oxide; conductive compounds such as indium.tin.oxide (ITO), indium.zinc.oxide, and the like; a complex of argentine, palladium and copper (APC); NESA, gold, platinum, silver, and copper.

The material of the cathode includes, for example, metals such as lithium, sodium, potassium, rubidium, cesium, beryllium, magnesium, calcium, strontium, barium, aluminum, zinc, indium and the like; alloys composed of two or more metals selected from the above metal group; alloys composed of one or more metals selected from the above metal group and one or more metals selected from the group consisting of silver, copper, manganese, titanium, cobalt, nickel, tungsten and tin; and graphite and graphite intercalation compounds.

The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The anode and the cathode each may take a laminated structure composed of two or more layers.

[Application]

In order to obtain planar light emission using a light emitting device, a planar anode and a planar cathode are arranged so that they overlap with each other.

In order to obtain a patterned light emission, there are a method of providing a mask with a patterned window on the surface of a planar light emitting device, a method of forming a layer to be a non-light emitting portion with an extremely large thickness to make it substantially nonluminescent, and a method of forming an anode or a cathode, or both electrodes in a pattern.

By forming a pattern by any of the above-mentioned methods and arranging some electrodes so that they can be turned ON/OFF independently, a segment type display device capable of displaying numbers, characters and the like can be obtained.

In order to obtain a dot matrix display device, both the anode and the cathode may be formed in stripes and arranged so as to be orthogonal to each other.

Partial color display and multi-color display become possible by a method of separately coating a plurality of types of polymer compounds having different emission colors or a method of using a color filter or a fluorescence conversion filter.

The dot matrix display device can be passively driven or can be actively driven in combination with TFT or the like. These display devices can be used for displays of computers, televisions, mobile terminals and the like.

The planar light emitting device can be suitably used as a planar light source for a backlight of a liquid crystal display device or a planar light source for illumination. If a flexible substrate is used, it can be used as a curved light source and a curved display device.

EXAMPLES

Hereinafter, the present invention will be described in more detail with reference to Examples, but the present invention is not limited to these Examples.

In the examples, the polystyrene-equivalent number-average molecular weight (Mn) and the polystyrene-equivalent weight-average molecular weight (Mw) of the polymer compound and its intermediate were determined by the following size exclusion chromatography (SEC) using tetrahydrofuran as the mobile phase.

The polymer compound to be measured or its intermediate was dissolved in tetrahydrofuran at a concentration of about 0.05% by mass, and 10 μL of the solution was injected into SEC. The mobile phase was run at a flow rate of 1.0 mL/min. PLgel MIXED-B (manufactured by Polymer Laboratories) was used as a column. A UV-VIS detector (manufactured by Tosoh Corporation, trade name: UV-8320GPC) was used as a detector.

In the present example, the molecular weight of the constitutional unit in the polymer compound was calculated using the value of Molecular Weight of ChemDraw Pro 13.0 (manufactured by Hulinks Ink.).

Synthesis Examples M1 to M13: Synthesis and Acquisition of Compounds M1 to M13

The compound M1 was synthesized according to a method described in JP-A No. 2011-174062.
The compound M2 was synthesized according to a method described in WO2005/049546.
The compounds M3 and M7 were synthesized according to a method described in WO2002/045184.
As the compound M4, a commercially available product was used.
The compound M5 was synthesized according to a method described in JP-A No. 2008-106241.
The compound M6 was synthesized according to a method described in JP-A No. 2010-189630.
The compound M8 was synthesized according to a method described in JP-A No. 2010-215886.

The compound M9 was synthesized according to a method described in WO2011/049241.
The compound M10 was synthesized according to a method described in WO2015/145871.
The compound M11 was synthesized according to a method described in WO2009/157424.
The compound M12 was synthesized according to a method described in WO2016/047536.
The compound M13 was synthesized according to a method described in WO2013/191088.

[Compound 76]

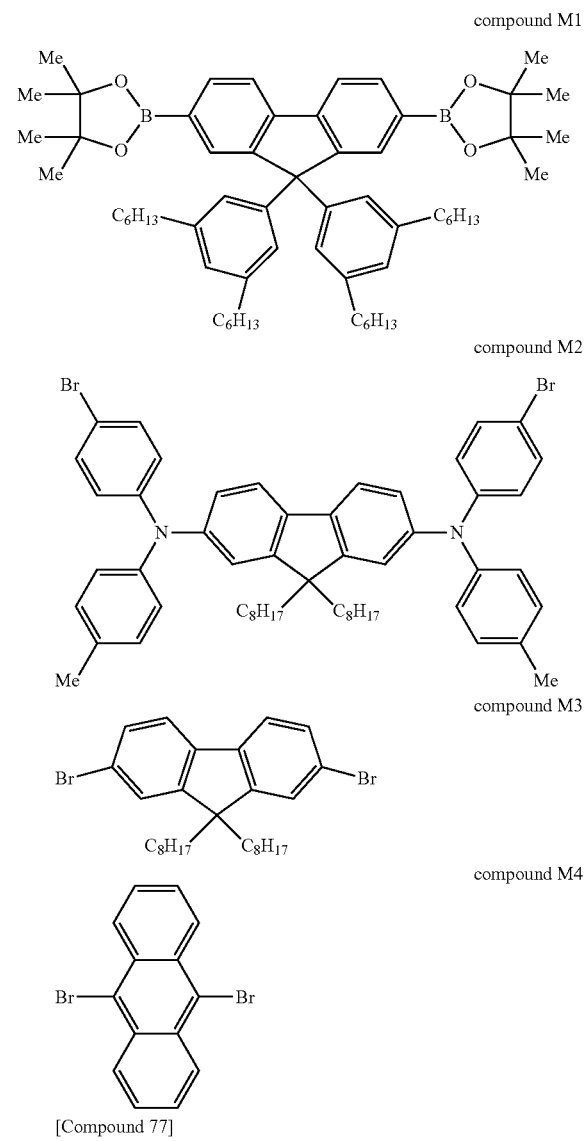

[Compound 77]

-continued compound M6

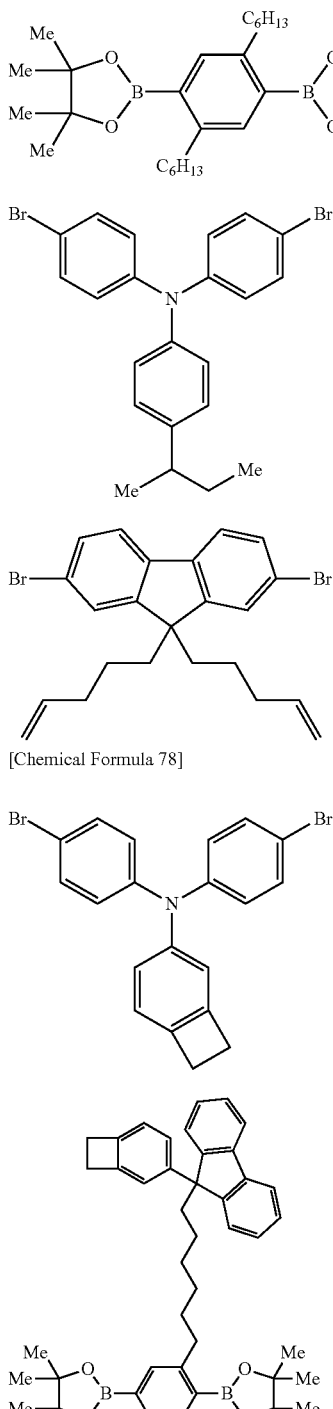

compound M7 compound M8

[Chemical Formula 78]

compound M9 compound M10

-continued compound M11

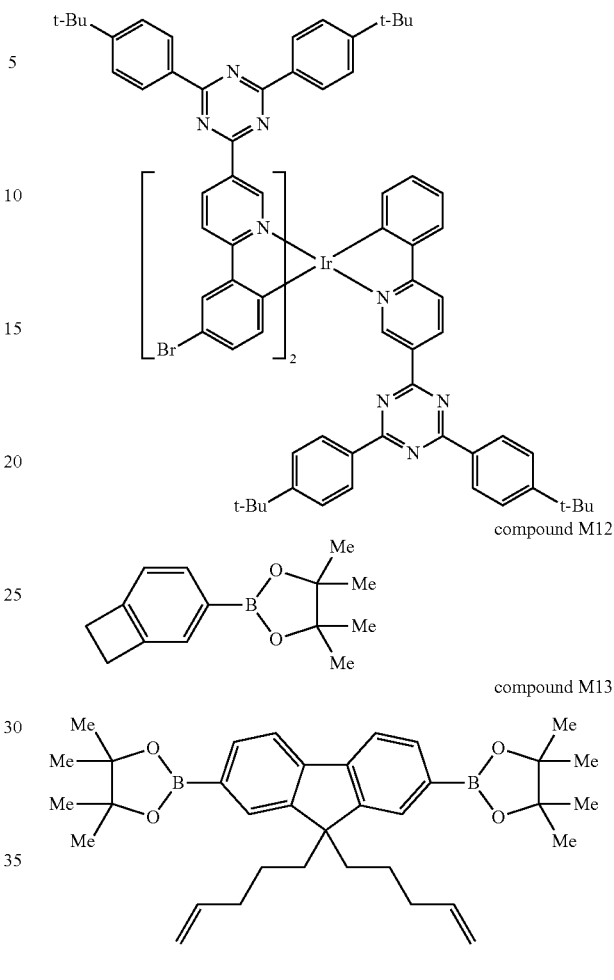

compound M12 compound M13

Example 1: Synthesis of Block Copolymer P1

(1) Formation of Non-Terminal Block

An inert gas atmosphere was prepared in the reaction vessel, then, a mixture P1a [compound M1 (2.39 g), compound M2 (1.81 g) and compound M3 (91.4 mg)] shown in Table 1 below and toluene (23 mL) were added and heated to 80° C. To this were added bis(tris-o-methoxyphenylphosphine)palladium(II) dichloride (1.9 mg) and a 20% by mass tetraethylammonium hydroxide aqueous solution (23.4 g), then, the mixture was heated to 100° C. and stirred for 2.5 hours under reflux, to form a non-terminal block.

The polymer compound (non-terminal block) present in the reaction liquid had an Mn of $7.6 \times 10^3$ and an Mw of $1.7 \times 10^4$.

(2) Formation of Terminal Block

To the reaction liquid obtained in the above-described (1) were added a mixture P1b [compound M1 (0.45 g), compound M4 (0.22 g) and compound M5 (0.26 g)] shown in Table 1 below, toluene (22 mL) and a 20% by mass tetraethylamoniumm hydroxide aqueous solution (26.6 g) and the mixture was heated to 80° C. To this was added bis(tris-o-methoxyphenylphosphine)palladium(II) dichloride (1.0 mg), then, the mixture was heated to 100° C. and stirred under reflux for 4.5 hours, thereby binding the terminal block to the non-terminal block, to form a terminal block.

(3) Formation of End Group

To the reaction liquid obtained in the above-described (2) was added phenylboronic acid (160 mg), which is an end-capping agent, then, the mixture was heated to 100° C. and stirred under reflux for 16 hours, thereby introducing the end group into the terminal block, to form an end group.

(4) Post-Treatment

The reaction liquid obtained in the above-described (3) was cooled down to room temperature, the aqueous layer was removed, then, washed once with 10% by mass hydrochloric acid, once with a 3% by mass aqueous ammonia solution, and once with ion exchanged water. When the resultant solution was added dropwise to methanol, a precipitate was generated, so the precipitate was collected by filtration and dried, to obtain a solid. This solid was dissolved in toluene and purified by passing the solution through an alumina column and a silica gel column in series through which toluene had been passed previously. When the purified liquid was added dropwise to methanol and the mixture was stirred, a precipitate was generated, so the precipitate was collected by filtration and dried, to obtain a block copolymer P1 (3.2 g).

The block copolymer P1 had an Mn of $4.9 \times 10^4$ and an Mw of $1.4 \times 10^5$.

TABLE 1

| | mixture | | | | | |
| --- | --- | --- | --- | --- | --- | --- |
| | P1a compound | | | P1b | | |
| | M1 | M2 | M3 | M1 | M4 | M5 |
| molar ratio (mol %) | 40 | 30 | 2.5 | 10 | 10 | 7.5 |

The block copolymer P1 is a block copolymer having a non-terminal block containing a constitutional unit derived from the compound M1, a constitutional unit derived from the compound M2 and a constitutional unit derived from the compound M3 at a molar ratio of 40:30:2.5, having a terminal block containing a constitutional unit derived from the compound M1, a constitutional unit derived from the compound M4 and a constitutional unit derived from the compound M5 at a molar ratio of 10:10:7.5, according to the theoretical values determined from the amounts of the charging raw material, and having a phenyl group as the end group.

The block copolymer P1 contains an end group, a terminal block, a non-terminal block, a terminal block, and an end group in this order. The block copolymer P1 satisfies the above-described formulae (i) and (iii).

(5) Fabrication and Evaluation of HOD Device 1

A HOD (Hole only device) device capable of flowing only holes was produced.

After UV ozone cleaning was performed on a glass substrate on which ITO was formed as an anode, a hole injection material (ND3202, manufactured by Nissan Chemical Industries, Ltd.) was spin-coated on the substrate to form a film with a thickness of 35 nm. This was place in an air atmosphere, and heated on a hot plate at 50° C. for 3 minutes to volatilize the solvent, and subsequently heated on a hot plate at 230° C. for 15 minutes, then, naturally cooled down to room temperature, to form a hole injection layer.

Next, the block copolymer P1 was dissolved in xylene to prepare a 2.1% by mass xylene solution. On the hole injection layer, this xylene solution was spin-coated to form a film with a thickness of 100 nm, and this was placed in a nitrogen gas atmosphere, and heated on a hot plate at 180° C. for 60 minutes to crosslink the block copolymer P1, then, naturally cooled down to room temperature, to form a hole transporting layer.

Thereafter, aluminum was vapor-deposited on the hole transporting layer as a cathode with a thickness of about 120 nm, to fabricate a HOD device 1. Vapor-deposition of aluminum was started after the degree of vacuum reached $1 \times 10^{-4}$ Pa or less.

A voltage from −5 V to +12 V was applied to the HOD device 1 using a DC voltage/current generator, and the current density flowing through the device when the electric field strength was 0.4 MV/cm was measured.

In this evaluation, when an electric field strength of 0.4 MV/cm was applied to the device, light emission due to current excitation was not observed, and the electron current flowing through the device was confirmed to be extremely small as compared with the hole current.

Comparative Example 1: Synthesis of Block Copolymer CP1

(1) Synthesis of Block Copolymer CP1

The block copolymer CP1 was synthesized according to a method described in JP-A No. 2012-144722 using a mixture CP1a shown in Table 2 describe below and a mixture CP1b shown in the same table.

In the synthesis of the block copolymer CP1, the non-terminal block had an Mn of $4.1 \times 10^4$ and an Mw of $1.2 \times 10^5$. The block copolymer CP1 had an Mn of $5.4 \times 10^4$ and an Mw of $1.8 \times 10^5$.

TABLE 2

| | mixture | | | | | |
| --- | --- | --- | --- | --- | --- | --- |
| | CP1a compound | | | | CP1b | |
| | M1 | M2 | M3 | M5 | M1 | M4 |
| molar ratio (mol %) | 40 | 30 | 2.5 | 7.5 | 10 | 10 |

The block copolymer CP1 is a block copolymer having a non-terminal block containing a constitutional unit derived from the compound M1, a constitutional unit derived from the compound M2, a constitutional unit derived from the compound M3 and a constitutional unit derived from the compound M5 at a molar ratio of 40:30:2.5:7.5, having a terminal block containing a constitutional unit derived from the compound M1 and a constitutional unit derived from the compound M4 at a molar ratio of 10:10, according to the theoretical values determined from the amounts of the charging raw material, and having a phenyl group as the end group.

In the block copolymer CP1, the terminal block and the end group have no crosslinkable group.

(2) Fabrication and Evaluation of HOD Device C1

A HOD device C1 was fabricated in the same manner as in (5) of Example 1 except that the block copolymer CP1 was used instead of the block copolymer P1 in (5) of Example 1.

A voltage from −5 V to +12 V was applied to the HOD device C1 using a DC voltage/current generator, and the current density flowing through the device when the electric field strength was 0.4 MV/cm was measured.

In this evaluation, when an electric field strength of 0.4 MV/cm was applied to the device, light emission due to current excitation was not observed, and the electron current flowing through the device was confirmed to be extremely small as compared with the hole current.

The results of Example 1 and Comparative Example 1 are shown in Table 3 below.

As shown in Table 3, the relative value of the current density flowing through the HOD device 1 at 0.4 MV/cm was 1.34 if the current density flowing through the HOD device C1 at 0.4 MV/cm was taken as 1.00. That is, it can be evaluated that the hole transportability is more excellent as the relative value of the current density is larger.

TABLE 3

| | HOD device | material used for formation of hole transporting layer | relative value of current density |
|---|---|---|---|
| Example 1 | 1 | block copolymer P1 | 1.34 |
| Comparative Example 1 | C1 | block copolymer CP1 | 1.00 |

Example 2: Synthesis of Block Copolymer P2

(1) Formation of Non-Terminal Block

An inert gas atmosphere was prepared in the reaction vessel, then, a mixture P2a [compound M6 (1.46 g) and compound M7 (1.20 g)] shown in Table 4 below, bis(tris-o-methoxyphenylphosphine)palladium(II) dichloride (2.3 mg) and toluene (30 mL) were added, and the mixture was heated at 80° C. A 16% by mass tetramethylammonium hydroxide aqueous solution (20.6 g) was added thereto, then, the mixture was stirred at 100° C. for 2.5 hours, to form a non-terminal block.

The polymer compound (non-terminal block) present in the reaction liquid had an Mn of $8.4 \times 10^3$ and an Mw of $1.8 \times 10^4$.

(2) Formation of Terminal Block

To the reaction liquid obtained in the above-described (1) were added a mixture P2b [compound M6 (0.146 g), compound M5 (0.174 g) and compound M8 (0.150 g)] shown in Table 4 below, bis(tris-o-methoxyphenylphosphine)palladium(II) dichloride (0.57 mg) and toluene (10 mL) were added, and the mixture was stirred at 100° C. for 4.5 hours, thereby binding the terminal block to the non-terminal block, to form a terminal block.

(3) Formation of End Group

To the reaction liquid obtained in the above-described (2) were added phenylboronic acid (160 mg), which is an end-capping agent, and bis(tris-o-methoxyphenylphosphine)palladium(II) dichloride (2.9 mg), then, the mixture was heated at 100° C. and stirred for 16 hours under reflux, thereby introducing the end group into the terminal block, to form an end group.

(4) Post-Treatment

The reaction liquid obtained in the above-described (3) was cooled down to room temperature, the aqueous layer was removed, then, washed once with 10% by mass hydrochloric acid, once with a 3% by mass aqueous ammonia solution, and once with deionized water. When the resultant solution was added dropwise to methanol, a precipitate was generated, so the precipitate was collected by filtration and dried, to obtain a solid. This solid was dissolved in toluene and purified by passing the solution through an alumina column and a silica gel column in series thought which toluene had been passed previously. When the purified liquid was added dropwise to methanol and the mixture was stirred, a precipitate was generated, so the precipitate was collected by filtration and dried, to obtain a block copolymer P2 (0.81 g).

The block copolymer P2 had an Mn of $5.5 \times 10^4$ and an Mw of $3.7 \times 10^5$.

TABLE 4

| | mixture | | | | |
|---|---|---|---|---|---|
| | P2a | | P2b | | |
| | compound | | | | |
| | M6 | M7 | M6 | M5 | M8 |
| molar ratio (mol %) | 45 | 40 | 5 | 5 | 5 |

The block copolymer P2 is a block copolymer having a non-terminal block containing a constitutional unit derived from the compound M6 and a constitutional unit derived from the compound M7 at a molar ratio of 45:40, having a terminal block containing a constitutional unit derived from the compound M6, a constitutional unit derived from the compound M5 and a constitutional unit derived from the compound M8 at a molar ratio of 5:5:5, according to the theoretical values determined from the amounts of the charging raw material, and having a phenyl group as the end group.

The block copolymer P2 contains an end group, a terminal block, a non-terminal block, a terminal block, and an end group in this order. The block copolymer P2 satisfies the above-described formulae (i) and (iii).

The molecular weight of the constitutional unit derived from the compound M6 is 244.42, the molecular weight of the constitutional unit derived from the compound M7 is 299.42, the molecular weight of the constitutional unit derived from the compound M5 is 368.48, and the molecular weight of the constitutional unit derived from the compound M8 is 300.44.

The number of the crosslinkable group contained in the constitutional unit derived from the compound M6 is 0, the number of the crosslinkable group contained in the constitutional unit derived from the compound M7 is 0, the number of the crosslinkable group contained in the constitutional unit derived from the compound M5 is 2, and the number of the crosslinkable group contained in the constitutional unit derived from the compound M8 is 2.

The constitutional unit derived from the compound M6 is a constitutional unit represented by the formula (Y), the constitutional unit derived from the compound M7 is a constitutional unit represented by the formula (X), the constitutional unit derived from the compound M5 is a constitutional unit having a crosslinkable group, and the constitutional unit derived from the compound M8 is a constitutional unit having a crosslinkable group.

In the block copolymer P2, the calculation results of the total number of each constitutional unit and the crosslinkable group are as follows.

(Total number of the constitutional unit represented by the formula (Y) in the non-terminal block)=1.634

(Total number of the constitutional unit represented by the formula (X) in the non-terminal block)=$X_f$=1.452

(Total number of the constitutional unit represented by the formula (Z) in the non-terminal block)=$Z_f$=0

(Total number of the constitutional unit represented by the formula (X) and the constitutional unit represented by the formula (Z) in the non-terminal block)=$X_I+Z_I$=1.452

(Total number of the constitutional unit having the crosslinkable group in the non-terminal block)=0

(Total number of the crosslinkable group in the non-terminal block)=0

(Total number of the constitutional unit represented by the formula (Y) in the terminal block)=0.182

(Total number of the constitutional unit represented by the formula (X) in the terminal block)=$X_{II}$=0

(Total number of the constitutional unit represented by the formula (Z) in the terminal block)=$Z_{II}$=0

(Total number of the constitutional unit represented by the formula (X) and the constitutional unit represented by the formula (Z) in the terminal block)=$X_{II}+Z_{II}$=0

(Total number of the constitutional unit having the crosslinkable group in the terminal block)=0.363

(Total number of the crosslinkable group in the terminal block)=0.726

(Total number of the constitutional unit represented by the formula (Y) in the block copolymer)=1.815

(Total number of the constitutional unit represented by the formula (X) in the block copolymer)=1.452

(Total number of the constitutional unit represented by the formula (Z) in the block copolymer)=0

(Total number of the constitutional unit represented by the formula (X) and the constitutional unit represented by the formula (Z) in the block copolymer)=1.452

(Total number of the constitutional unit having the crosslinkable group in the block copolymer)=0.363

(Total number of the crosslinkable group in the block copolymer)=0.726

(5) Fabrication and Evaluation of HOD Device 2

A HOD device 2 was fabricated in the same manner as in (5) of Example 1 except that the block copolymer P2 was used instead of the block copolymer P1 in (5) of Example 1.

A voltage from −5 V to +12 V was applied to the HOD device 2 using a DC voltage/current generator, and the current density flowing through the device when the electric field strength was 1.0 MV/cm was measured.

In this evaluation, when an electric field strength of 1.0 MV/cm was applied to the device, light emission due to current excitation was not observed, and the electron current flowing through the device was confirmed to be extremely small as compared with the hole current.

Comparative Example 2: Synthesis of Polymer Compound CP2

(1) Synthesis of Polymer Compound CP2

The polymer compound CP2 was synthesized according to a method described in JP-A No. 2015-110751 using a mixture CP2a shown in Table 5 below.

The polymer compound CP2 had an Mn of $5.9 \times 10^4$ and an Mw of $1.8 \times 10^5$.

TABLE 5

|  | mixture CP2a compound | | | |
|---|---|---|---|---|
|  | M6 | M7 | M5 | M8 |
| molar ratio (mol %) | 50 | 40 | 5 | 5 |

The polymer compound CP2 is a random copolymer (copolymer not having terminal block and non-terminal block) containing a constitutional unit derived from the compound M6, a constitutional unit derived from the compound M7, a constitutional unit derived from the compound M5, and a constitutional unit derived from the compound M8 at a molar ratio of 50:40:5:5 according to the theoretical values determined from the amounts of the charging raw materials, and has a phenyl group as the end group.

(2) Fabrication and Evaluation of HOD Device C2

A HOD device C2 was fabricated in the same manner as in (5) of Example 1 except that the polymer compound CP2 was used instead of the block copolymer P1 in (5) of Example 1.

A voltage from −5 V to +12 V was applied to the HOD device C2 using a DC voltage/current generator, and the current density flowing though the device when the electric field strength was 1.0 MV/cm was measured.

In this evaluation, when an electric field strength of 1.0 MV/cm was applied to the device, light emission due to current excitation was not observed, and the electron current flowing through the device was confirmed to be extremely small as compared with the hole current.

The results of Example 2 and Comparative Example 2 are shown in Table 6 below.

As shown in Table 6, the relative value of the current density flowing through the HOD device 2 at 1.0 MV/cm was 1.54 if the current density flowing through the HOD device C2 at 1.0 MV/cm was taken as 1.00. That is, it can be evaluated that the hole transportability is more excellent as the relative value of the current density is larger.

TABLE 6

|  | HOD device | material used for formation of hole transporting layer | relative value of current density |
|---|---|---|---|
| Example 2 | 2 | block copolymer P2 | 1.54 |
| Comparative Example 2 | C2 | polymer compound CP2 | 1.00 |

Example 3: Synthesis of Block Copolymer P3

(1) Formation of Non-Terminal Block

An inert gas atmosphere was prepared in the reaction vessel, then, a mixture P3a [compound M1 (2.08 g) and compound M2 (1.75 g)] shown in Table 7 below, bis(triso-methoxyphenyl phosphine)palladium(II) dichloride (0.17 mg) and toluene (35 mL) were added, and the mixture was heated at 80° C. A 20% by mass tetraethylammonium hydroxide aqueous solution (23.4 g) was added thereto, then, the mixture was stirred at 100° C. for 2.5 hours, to form a non-terminal block.

The polymer compound (non-terminal block) present in the reaction liquid had an Mn of $7.4 \times 10^3$ and an Mw of $1.7 \times 10^4$.

(2) Formation of Terminal Block

To the reaction liquid obtained in the above-described (1) were added a mixture P3b [compound M1 (1.35 g), compound M9 (0.328 g) and compound M2 (1.05 g)] shown in Table 7 below, bis(tris-o-methoxyphenylphosphine)palladium(II) dichloride (0.17 mg), a 20% by mass tetraethylammonium hydroxide aqueous solution (26.6 g), and toluene (40 mL), and the mixture was stirred at 100° C. for 4.5 hours, thereby binding the terminal block to the non-terminal block, to form a terminal block.

(3) Formation of End Group

To the reaction liquid obtained in the above-described (2) were added M12 (352 mg), which is an end-capping agent, and bis(tris-o-methoxyphenylphosphine)palladium(II) dichloride (0.16 mg), then, the mixture was heated at 100° C. and stirred for 16 hours under reflux, thereby introducing an end group into the terminal block, to form an end group.

(4) Post-Treatment

The reaction liquid obtained in the above-described (3) was cooled down to room temperature, the aqueous layer was removed, then, washed once with 10% by mass hydrochloric acid, once with a 3% by mass aqueous ammonia solution, and once with ion exchanged water. When the resultant solution was added dropwise to methanol, a precipitate was generated, so the precipitate was collected by filtration and dried, to obtain a solid. This solid was dissolved in toluene and purified by passing the solution through an alumina column and a silica gel column in series through which toluene had been passed previously. When the purified solution was added dropwise to methanol and the mixture was stirred, a precipitate was generated, so the precipitate was collected by filtration and dried, to obtain a block copolymer P3 (4.47 g).

The block copolymer P3 had an Mn of $3.3 \times 10^4$ and an Mw of $1.6 \times 10^5$.

TABLE 7

|  | mixture | | | | |
| --- | --- | --- | --- | --- | --- |
|  | P3a | | P3b | | |
|  | compound | | | | |
|  | M1 | M2 | M1 | M9 | M2 |
| molar ratio (mol %) | 30 | 25 | 20 | 10 | 15 |

The block copolymer P3 is a block copolymer having a non-terminal block containing a constitutional unit derived from the compound M1 and a constitutional unit derived from the compound M2 at a molar ratio of 30:25, having a terminal block containing a constitutional unit derived from the compound M1, a constitutional unit derived from the compound M9 and a constitutional unit derived from the compound M2 at a molar ratio of 20:10:15, according to the theoretical values determined from the amounts of the charging raw material, and having a crosslinkable group derived from the compound M12 as the end group.

The block copolymer P3 contains an end group, a terminal block, a non-terminal block, a terminal block, and an end group in this order. The block copolymer P3 satisfies the above-described formulae (i) and (iii).

The molecular weight of the constitutional unit derived from the compound M1 is 653.05, the molecular weight of the constitutional unit derived from the compound M2 is 751.12, and the molecular weight of the constitutional unit derived from the compound M9 is 269.35.

The number of the crosslinkable group contained in the constitutional unit derived from the compound M1 is 0, the number of the crosslinkable group contained in the constitutional unit derived from the compound M2 is 0, and the number of the crosslinkable group contained in the constitutional unit derived from the compound M9 is 1.

The constitutional unit derived from the compound M1 is a constitutional unit represented by the formula (Y), the constitutional unit derived from the compound M2 is a constitutional unit represented by the formula (X), and the constitutional unit derived from the compound M9 is a constitutional unit having a crosslinkable group.

In the block copolymer P3, the calculation results of the total number of each constitutional unit and the crosslinkable group are as follows.

(Total number of the constitutional unit represented by the formula (Y) in the non-terminal block)=0.459

(Total number of the constitutional unit represented by the formula (X) in the non-terminal block)=$X_I$=0.382

(Total number of the constitutional unit represented by the formula (Z) in the non-terminal block)=$Z_I$=0

(Total number of the constitutional unit represented by the formula (X) and the constitutional unit represented by the formula (Z) in the non-terminal block)=$X_I+Z_I$=0.382

(Total number of the constitutional unit having the crosslinkable group in the non-terminal block)=0

(Total number of the crosslinkable group in the non-terminal block)=0

(Total number of the constitutional unit represented by the formula (Y) in the terminal block)=0.306

(Total number of the constitutional unit represented by the formula (X) in the terminal block)=$X_{II}$=0.229

(Total number of the constitutional unit represented by the formula (Z) in the terminal block)=$Z_{II}$=0

(Total number of the constitutional unit represented by the formula (X) and the constitutional unit represented by the formula (Z) in the terminal block)=$X_{II}+Z_{II}$=0.229

(Total number of the constitutional unit having the crosslinkable group in the terminal block)=0.153

(Total number of the crosslinkable group in the terminal block)=0.153

(Total number of the constitutional unit represented by the formula (Y) in the block copolymer)=0.765

(Total number of the constitutional unit represented by the formula (X) in the block copolymer)=0.612

(Total number of the constitutional unit represented by the formula (Z) in the block copolymer)=0

(Total number of the constitutional unit represented by the formula (X) and the constitutional unit represented by the formula (Z) in the block copolymer)=0.612

(Total number of the constitutional unit having the crosslinkable group in the block copolymer)=0.153 (Total number of the crosslinkable group in the block copolymer)=0.153

(5) Fabrication and Evaluation of HOD Device 3

A HOD device 3 was fabricated in the same manner as in (5) of Example 1 except that the block copolymer P3 was used instead of the block copolymer P1 in (5) of Example 1.

A voltage from −5 V to +12 V was applied to the HOD device 3 using a DC voltage/current generator, and the current density flowing through the device when the electric field strength was 0.4 MV/cm was measured.

In this evaluation, when an electric field strength of 0.4 MV/cm was applied to the device, light emission due to current excitation was not observed, and the electron current flowing through the device was confirmed to be extremely small as compared with the hole current.

Comparative Example 3: Synthesis of Block Copolymer CP3

(1) Formation of Non-Terminal Block

An inert gas atmosphere was prepared in the reaction vessel, then, a mixture CP3a [compound M1 (0.694 g) and compound M2 (1.05 g)] shown in Table 8 below, bis(tris-o-methoxyphenylphosphine)palladium(II) dichloride (0.10 mg) and toluene (35 mL) were added, and the mixture was heated a 80° C. A 20% by mass tetraethylammonium hydroxide aqueous solution (23.4 g) was added thereto, then, the mixture was stirred at 100° C. for 2.5 hours, to form a non-terminal block.

The polymer compound (non-terminal block) present in the reaction liquid had an Mn of 3.2×10³ and an Mw of 7.8×10³.

(2) Formation of Terminal Block

To the reaction liquid obtained in the above-described (1) were added a mixture CP3b [compound M1 (2.38 g), compound M9 (0.328 g) and compound M2 (1.75 g)] shown in Table 8 below, bis(tris-o-methoxyphenyl phosphine)palladium(II) dichloride (0.24 mg), a 20% by mass tetraethylammonium hydroxide aqueous solution (26.6 g), and toluene (40 mL), and the mixture was stirred for 4.5 hours at 100° C., thereby binding the terminal block to the non-terminal block, to form a terminal block.

(3) Formation of End Group

To the reaction liquid obtained in the above-described (2) were added M12 (352 mg), which is an end-capping agent, and bis(tris-o-methoxyphenylphosphine)palladium(II) dichloride (0.24 mg), then, the mixture was heated to 100° C. and stirred under reflux for 16 hours, thereby introducing the end group into the terminal block, to form end group.

(4) Post-Treatment

The reaction liquid obtained in the above-described (3) was cooled down to room temperature, the aqueous layer was removed, then, washed once with 10% by mass hydrochloric acid, once with a 3% by mass aqueous ammonia solution, and once with ion exchanged water. When the resultant solution was added dropwise to methanol, a precipitate was generated, so the precipitate was collected by filtration and dried, to obtain a solid. This solid was dissolved in toluene and purified by passing the solution through an alumina column and a silica gel column in series through which toluene had been passed previously. When the purified liquid was added dropwise to methanol and the mixture was stirred, a precipitate was generated, so the precipitate was collected by filtration and dried, to obtain a block copolymer CP3 (4.55 g).

The block copolymer CP3 had an Mn of 3.4×10⁴ and an Mw of 1.3×10⁵.

TABLE 8

| | mixture | | | | |
|---|---|---|---|---|---|
| | CP3a | | CP3b | | |
| | compound | | | | |
| | M1 | M2 | M1 | M9 | M2 |
| molar ratio (mol %) | 10 | 15 | 40 | 10 | 25 |

The block copolymer CP3 is a block copolymer having a non-terminal block containing a constitutional unit derived from the compound M1 and a constitutional unit derived from the compound M2 at a molar ratio of 10:15, having a terminal block containing a constitutional unit derived from the compound M1, a constitutional unit derived from the compound M9 and a constitutional unit derived from the compound M2 at a molar ratio of 40:10:25, according to the theoretical values determined from the amounts of the charging raw material, and having a crosslinkable group derived from the compound M12 as the end group.

The block copolymer CP3 does not satisfy the above-described formulae (i), (ii) and (iii).

The molecular weight of the constitutional unit derived from the compound M1 is 653.05, the molecular weight of the constitutional unit derived from the compound M2 is 751.12, and the molecular weight of the constitutional unit derived from the compound M9 is 269.35.

The number of the crosslinkable group contained in the constitutional unit derived from the compound M1 is 0, the number of the crosslinkable group contained in the constitutional unit derived from the compound M2 is 0, and the number of the crosslinkable group contained in the constitutional unit derived from the compound M9 is 1.

The constitutional unit derived from the compound M1 is a constitutional unit represented by the formula (Y), the constitutional unit derived from the compound M2 is a constitutional unit represented by the formula (X), and the constitutional unit derived from the compound M9 is a constitutional unit having a crosslinkable group.

In the block copolymer CP3, the calculation results of the total number of each constitutional unit and the crosslinkable group are as follows.

(Total number of the constitutional unit represented by the formula (Y) in the non-terminal block)=0.153

(Structure represented by the formula (X) in a non-terminal block total number of adult units)=$X_f$=0.229

(Total number of the constitutional unit represented by the formula (Z) in the non-terminal block)=$Z_f$=0

(Total number of the constitutional unit represented by the formula (X) and the constitutional unit represented by the formula (Z) in the non-terminal block)=$X_I+Z_I$=0.229

(Total number of the constitutional unit having the crosslinkable group in the non-terminal block)=0 (Total number of the crosslinkable group in the non-terminal block)=0

(Total number of the constitutional unit represented by the formula (Y) in the terminal block)=0.612

(Total number of the constitutional unit represented by the formula (X) in the terminal block)=$X_{II}$=0.382

(Terminal Bro total number of the constitutional unit represented by the formula (Z) in click)=$Z_{II}$=0

(Total number of the constitutional unit represented by the formula (X) and the constitutional unit represented by the formula (Z) in the terminal block)=$X_{II}+Z_{II}$=0.382

(Total number of the constitutional unit having the crosslinkable group in the terminal block)=0.153

(Total number of the crosslinkable group in the terminal block)=0.153

(Total number of the constitutional unit represented by the formula (Y) in the block copolymer)=0.765

(Total number of the constitutional unit represented by the formula (X) in the block copolymer)=0.612

(Total number of the constitutional unit represented by the formula (Z) in the block copolymer)=0

(Total number of the constitutional unit represented by the formula (X) and the constitutional unit represented by the formula (Z) in the block copolymer)=0.612

(Total number of the constitutional unit having the crosslinkable group in the block copolymer)=0.153

(Total number of the crosslinkable group in the block copolymer)=0.153

(5) Fabrication and Evaluation of HOD Device C3

A HOD device C3 was fabricated in the same manner as in (5) of Example 1 except that the block copolymer CP3 was used instead of the block copolymer P1 in (5) of Example 1.

A voltage from −5 V to +12 V was applied to the HOD device C3 using a DC voltage/current generator, and the current density flowing through the device when the electric field strength was 0.4 MV/cm was measured.

In this evaluation, when an electric field strength of 0.4 MV/cm was applied to the device, light emission due to current excitation was not observed, and the electron current flowing through the device was confirmed to be extremely small as compared with the hole current.

The results of Example 3 and Comparative Example 3 are shown in Table 9 below.

As shown in Table 9, the relative value of the current density flowing through the HOD device 3 at 0.4 MV/cm was 1.59 if the current density flowing through the HOD device C3 at 0.4 MV/cm was taken as 1.00. That is, it can be evaluated that the hole transportability is more excellent as the relative value of the current density is larger.

TABLE 9

| | HOD device | material used for formation of hole transporting layer | relative value of current density |
|---|---|---|---|
| Example 3 | 3 | block copolymer P3 | 1.59 |
| Comparative Example 3 | C3 | block copolymer CP3 | 1.00 |

Example 4: Synthesis of Block Copolymer P4

(1) Formation of Non-Terminal Block

An inert gas atmosphere was prepared in the reaction vessel, then, a mixture P4a [compound M1 (0.407 g), compound M10 (1.39 g), and compound M2 (1.37 g)] shown in Table 10 below, bis(tris-o-methoxyphenylphosphine)palladium(II) dichloride (0.29 mg) and toluene (23 mL) were added, and the mixture was heated at 80° C. A 20% by mass tetraethylammonium hydroxide aqueous solution (15.4 g) was added thereto, and the mixture was stirred at 100° C. for 2.5 hours, to form a non-terminal block.

The polymer compound (non-terminal block) present in the reaction liquid had an Mn of $6.6\times10^3$ and an Mw of $1.8\times10^4$.

(2) Formation of Terminal Block

To the reaction liquid obtained in the above-described (1) were added a mixture P4b [compound M13 (0.241 g), compound M2 (0.556 g) and compound M11 (0.248 g)] shown in Table 10 below, bis(tris-o-methoxyphenylphosphine)palladium(II) dichloride (0.33 mg), a 20% by mass tetraethylammonium hydroxide aqueous solution (14.5 g) and toluene (29 mL), and the mixture was stirred at 100° C. for 4.5 hours, thereby binding the terminal block to the non-terminal block, to form a terminal block.

(3) Formation of End Group

To the reaction liquid obtained in the above-described (2) were added phenylboronic acid (109 mg), which is an end capping agent, and bis(tris-o-methoxyphenylphosphine)palladium(II) dichloride (0.07 mg), then, the mixture was heated at 100° C. and stirred for 16 hours under reflux, thereby introducing the end group into the terminal block, to form an end group.

(4) Post-Treatment

The reaction liquid obtained in the above-described (3) was cooled down to room temperature, the aqueous layer was removed, then, washed once with 10% by mass hydrochloric acid, once with a 3% by mass aqueous ammonia solution, and once with ion exchanged water. When the resultant solution was added dropwise to methanol, a precipitate was generated, so the precipitate was collected by filtration and dried, to obtain a solid. This solid was dissolved in toluene and purified by passing the solution through an alumina column and a silica gel column in series through which toluene had been passed previously. When the purified liquid was added dropwise to methanol and the mixture was stirred, a precipitate was generated, so the precipitate was collected by filtration and dried, to obtain a block copolymer P4 (2.72 g).

The block copolymer P4 had an Mn of $3.2\times10^4$ and an Mw of $1.6\times10^5$.

TABLE 10

|  | mixture | | | | | |
| --- | --- | --- | --- | --- | --- | --- |
|  | P4a | | | | P4b | |
|  | compound | | | | | |
|  | M1 | M10 | M2 | M13 | M2 | M11 |
| molar ratio (mol %) | 10 | 30 | 33.4 | 10 | 13.6 | 3 |

The block copolymer P4 is a block copolymer having a non-terminal block containing a constitutional unit derived from the compound M1, a constitutional unit derived from the compound M10 and a constitutional unit derived from the compound M2 at a molar ratio of 10:30:33.4, having a terminal block containing a constitutional unit derived from the compound M13, a constitutional unit derived from the compound M2 and a constitutional unit derived from the compound M11 at a molar ratio of 10:13.6:3, according to the theoretical values determined from the amounts of the charging raw materials, and having a phenyl group as the end group. The block copolymer P4 contains an end group, a terminal block, a non-terminal block, a terminal block, and an end group in this order. The block copolymer P4 satisfies the above-described formulae (i) and (iii).

The molecular weight of the constitutional unit derived from a compound M1 is 653.05, the molecular weight of the constitutional unit derived from a compound M10 is 777.11, the molecular weight of the constitutional unit derived from a compound M2 is 751.12, the molecular weight of the constitutional unit derived from a compound M13 is 300.44, and the molecular weight of the constitutional unit derived from the compound M11 is 1683.20.

The number of the crosslinkable group contained in the constitutional unit derived from the compound M1 is 0, the number of the crosslinkable group contained in the constitutional unit derived from the compound M10 is 2, the number of the crosslinkable group contained in the constitutional unit derived from the compound M2 is 0, the number of the crosslinkable group contained in the constitutional unit derived from the compound M13 is 2, and the number of the crosslinkable group contained in the constitutional unit derived from the compound M11 is 0.

The constitutional unit derived from the compound M1 is a constitutional unit represented by the formula (Y), the constitutional unit derived from the compound M10 is a constitutional unit having a crosslinkable group, the constitutional unit derived from the compound M2 is a constitutional unit represented by the formula (X), and the constitutional unit derived from the compound M13 is a constitutional unit having a crosslinkable group. In contrast, the constitutional unit derived from the compound M11 is a constitutional unit other than the constitutional unit represented by the formula (Y), the constitutional unit represented by the formula (X) and the constitutional unit having a crosslinkable group (hereinafter, referred to also as "other constitutional unit").

In the block copolymer P4, the calculation results of the total number of each constitutional unit and crosslinkable group are as follows.

(Total number of the constitutional unit represented by the formula (Y) in the non-terminal block)=0.137

(Total number of the constitutional unit represented by the formula (X) in the non-terminal block)=$X_I$=0.456

(Total number of the constitutional unit represented by the formula (Z) in the non-terminal block)=$Z_I$=0

(Total number of the constitutional unit represented by the formula (X) and the constitutional unit represented by the formula (Z) in the non-terminal block)=$X_I+Z_I$=0.456

(Total number of the constitutional unit having the crosslinkable group in the non-terminal block)=0.410

(Total number of the crosslinkable group in the non-terminal block)=0.820

(Total number of other constitutional units in the non-terminal block)=0

(Total number of the constitutional unit represented by the formula (Y) in the terminal block)=0

(Total number of the constitutional unit represented by the formula (X) in the terminal block)=$Xu_{II}$=0.186

(Total number of the constitutional unit represented by the formula (Z) in the terminal block)=$Z_{II}$=0

(Total number of the constitutional unit represented by the formula (X) and the constitutional unit represented by the formula (Z) in the terminal block)=$X_{II}+Z_{II}$=0.186

(Total number of the constitutional unit having the crosslinkable group in the terminal block)=0.137

(Total number of the crosslinkable group in the terminal block)=0.273

(Total number of other constitutional units in the terminal block)=0.041

(Total number of the constitutional unit represented by the formula (Y) in the block copolymer)=0.137

(Total number of the constitutional unit represented by the formula (X) in the block copolymer)=0.642

(Total number of the constitutional unit represented by the formula (Z) in the block copolymer)=0

(Total number of the constitutional unit represented by the formula (X) and the constitutional unit represented by the formula (Z) in the block copolymer)=0.642

(Total number of the constitutional unit having the crosslinkable group in the block copolymer)=0.546

(Total number of the crosslinkable group in the block copolymer)=1.093

(Total number of other constitutional units in the block copolymer)=0.041

(5) Fabrication and Evaluation of HOD Device 4

A HOD device 4 was fabricated in the same manner as in (5) of Example 1 except that the block copolymer P4 was used instead of the block copolymer P1 in (5) of Example 1.

A voltage from −5 V to +12 V was applied to the HOD device 4 using a DC voltage/current generator, and the current density flowing through the device when the electric field strength was 0.1 MV/cm was measured.

In this evaluation, when an electric field strength of 0.1 MV/cm was applied to the device, light emission due to current excitation was not observed, and the electron current flowing through the device was confirmed to be extremely small as compared with the hole current.

Comparative Example 4: Synthesis of Block Copolymer CP4

(1) Synthesis of Block Copolymer CP4

The block copolymer CP4 was synthesized according to a method described in JP-A No. 2016-111355 using a mixture CP4a shown in Table 11 described below and a mixture CP4b shown in the same table.

In synthesis of the block copolymer CP4, the non-terminal block had an Mn of $2.8 \times 10^3$ and an Mw of $5.8 \times 10^3$. The block copolymer CP4 had an Mn of $3.3 \times 10^4$ and an Mw of $1.7 \times 10^5$.

TABLE 11

| | mixture | | | | | |
|---|---|---|---|---|---|---|
| | CP4a | | | CP4b | | |
| | compound | | | | | |
| | M1 | M2 | M11 | M10 | M13 | M2 |
| molar ratio (mol %) | 10 | 13.6 | 3 | 30 | 10 | 33.4 |

The block copolymer CP4 is a block copolymer having a non-terminal block containing a constitutional unit derived from the compound M1, a constitutional unit derived from the compound M2 and a constitutional unit derived from the compound M11 at a molar ratio of 10:13.6:3, having a terminal block containing a constitutional unit derived from the compound M10, a constitutional unit derived from the compound M13 and a constitutional unit derived from the compound M2 at a molar ratio of 30:10:33.4, according to the theoretical values determined from the amounts of the charging raw materials, and having a phenyl group as the end group. The block copolymer CP4 contains an end group, a terminal block, a non-terminal block, a terminal block, and an end group in this order. The block copolymer CP4 does not satisfy the above-described formulae (i), (ii) and (iii).

The molecular weight of the constitutional unit derived from the compound M1 is 653.05, the molecular weight of the constitutional unit derived from the compound M2 is 751.12, the molecular weight of the constitutional unit derived from the compound M11 is 1683.20, the molecular weight of the constitutional unit derived from the compound M10 is 777.11, and the molecular weight of the constitutional unit derived from compound M13 is 300.44.

The number of the crosslinkable group contained in the constitutional unit derived from the compound M1 is 0, the number of the crosslinkable group contained in the constitutional unit derived from the compound M2 is 0, the number of the crosslinkable group contained in the constitutional unit derived from the compound M11 is 0, the number of the crosslinkable group contained in the constitutional unit derived from the compound M10 is 2, and the number of the crosslinkable group contained in the constitutional unit derived from the compound M13 is 2.

The constitutional unit derived from the compound M1 is a constitutional unit represented by the formula (Y), the constitutional unit derived from the compound M2 is a constitutional unit represented by the formula (X), the constitutional unit derived from the compound M10 is a constitutional unit having a crosslinkable group, and the constituent component derived from the compound M13 is a constitutional unit having a crosslinkable group. In contrast, the constitutional unit derived from the compound M11 is other constitutional unit.

In the block copolymer CP4, the calculation results of the total number of each constitutional unit and the crosslinkable group are as follows.

(Total number of the constitutional unit represented by the formula (Y) in the non-terminal block)=0.137

(Total number of the constitutional unit represented by the formula (X) in the non-terminal block)=$X_I$=0.186

(Total number of the constitutional unit represented by the formula (Z) in the non-terminal block)=$Z_I$=0

(Total number of the constitutional unit represented by the formula (X) and the constitutional unit represented by the formula (Z) in the non-terminal block)=$X_I+Z_I$=0.186

(Total number of the constitutional unit having the crosslinkable group in the non-terminal block)=0

(Total number of the crosslinkable group in the non-terminal block)=0

(Total number of other constitutional units in the non-terminal block)=0.041

(Total number of the constitutional unit represented by the formula (Y) in the terminal block)=0

(Total number of the constitutional unit represented by the formula (X) in the terminal block)=$X_{II}$=0.456

(The terminal block total number of the constitutional unit represented by the definitive the formula (Z))=$Z_{II}$=0

(Total number of the constitutional unit represented by the formula (X) and the constitutional unit represented by the formula (Z) in the terminal block)=$X_{II}+Z_{II}$=0.456

(Total number of the constitutional unit having the crosslinkable group in the terminal block)=0.546

(Total number of the crosslinkable group in the terminal block)=1.093

(Total number of other constitutional units in the terminal block)=0

(Total number of the constitutional unit represented by the formula (Y) in the block copolymer)=0.137

(Total number of the constitutional unit represented by the formula (X) in the block copolymer)=0.642

(Total number of the constitutional unit represented by the formula (Z) in the block copolymer)=0

(Total number of the constitutional unit represented by the formula (X) and the constitutional unit represented by the formula (Z) in the block copolymer)=0.642

(Total number of the constitutional unit having the crosslinkable group in the block copolymer)=0.546

(Total number of the crosslinkable group in the block copolymer)=1.093

(Total number of other constitutional units in the block copolymer)=0.041

(2) Fabrication and Evaluation of HOD Device C4

A HOD device C4 was fabricated in the same manner as in (5) of Example 1 except that the block copolymer CP4 was used instead of the block copolymer P1 in (5) of Example 1.

A voltage from −5 V to +12 V was applied to the HOD device C4 using a DC voltage/current generator, and the current density flowing through the device when the electric field strength was 0.1 MV/cm was measured.

In this evaluation, when an electric field strength of 0.1 MV/cm was applied to the device, light emission due to current excitation was not observed, and the electron current flowing through the device was confirmed to be extremely small as compared with the hole current.

The results of Example 4 and Comparative Example 4 are shown in Table 12 below.

As shown in Table 12, the relative value of the current density flowing through the HOD device 4 at 0.1 MV/cm was 2.41 if the current density flowing through the HOD device C4 at 0.1 MV/cm was taken as 1.00. That is, it can be evaluated that the hole transportability is more excellent as the relative value of the current density is larger.

TABLE 12

| | HOD device | material used for formation of hole transporting layer | relative value of current density |
|---|---|---|---|
| Example 4 | 4 | block copolymer P4 | 2.41 |
| Comparative Example 4 | C4 | block copolymer CP4 | 1.00 |

INDUSTRIAL APPLICABILITY

According to the present invention, a block copolymer which shows good hole transportability, a composition containing this block copolymer, and a light emitting device using this block copolymer can be provided.

The invention claimed is:

1. A block copolymer comprising an end group, a block that binds to the end group, and a block that does not bind to the end group, wherein
said block that does not bind to the end group contains at least one constitutional unit selected from the group consisting of a non-crosslinkable constitutional unit represented by the following formula (X) and a non-crosslinkable constitutional unit represented by the following formula (Z),
wherein said block that binds to the end group contains a non-crosslinkable constitutional unit represented by the following the formula (Y):

[Chemical Formula 8]

(Y)

wherein $Ar^{Y1}$ represents an arylene group optionally having a substituent,
at least one selected from the group consisting of said end group and said block that binds to the end group contains a crosslinkable group, and
at least one of the following formulae (i) to (iii) is satisfied when the total number of said non-crosslinkable constitutional unit represented by the formula (X) and the total number of said non-crosslinkable constitutional unit represented by the formula (Z) in said block that does not bind to the end group are represented by $X_I$ and $Z_I$, respectively, and the total number of said non-crosslinkable constitutional unit represented by the formula (X) and the total number of said non-crosslinkable constitutional unit represented by the formula (Z) in said block that binds to the end group are represented by $X_{II}$ and $Z_{II}$, respectively:

$X_I > X_{II}$  (i)

$Z_I > Z_{II}$  (ii)

$X_I + Z_I > X_{II} + Z_{II}$  (iii)

[Chemical Formula 1]

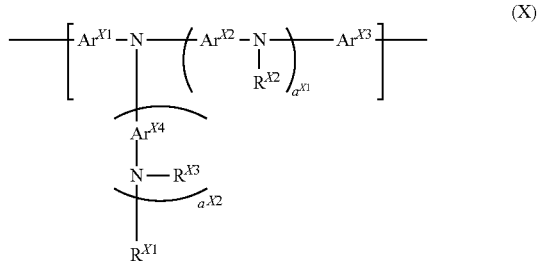

(X)

wherein,
$a^{X1}$ and $a^{X2}$ each independently represent an integer of 0 or more and 10 or less,
$Ar^{X1}$ and $Ar^{X3}$ each independently represent an arylene group or a divalent heterocyclic group, and the foregoing groups optionally have a substituent,
$Ar^{X2}$ and $Ar^{X4}$ each independently represent an arylene group, a divalent heterocyclic group, or a divalent group in which at least one arylene group and at least one divalent heterocyclic group are bonded directly, and the foregoing groups optionally have a substituent, and when a plurality of $Ar^{X2}$ are present, they may be the same or different and when a plurality of $Ar^{X4}$ are present, they may be the same or different,
$R^{X1}$, $R^{X2}$ and $R^{X3}$ independently represent a hydrogen atom, an alkyl group, a cycloalkyl group, an aryl group or a monovalent heterocyclic group, and the foregoing groups optionally have a substituent, and when a plurality of $R^{X2}$ are present, they may be the same or different and when a plurality of $R^{X3}$ are present, they may be the same or different,

[Chemical Formula 2]

(Z)

wherein, $Ar^Z$ represents a divalent heterocyclic group, or a divalent group in which at least one arylene group and at least one divalent heterocyclic group are bonded directly, and the foregoing groups optionally have a substituent.

2. The block copolymer according to claim 1, wherein said block that binds to the end group contains said crosslinkable group, and said crosslinkable group is contained in said block that binds to the end group as at least one constitutional unit selected from the group consisting of a constitutional unit represented by the following the formula (2) and a constitutional unit represented by the following the formula (2'):

[Chemical Formula 3]

(2)

wherein,
nA represents an integer of 0 or more and 5 or less, and n represents an integer of 1 or more and 5 or less, and when a plurality of nA are present, they may be the same or different, $Ar^3$ represents an aromatic hydrocarbon group or a heterocyclic group, and the foregoing groups optionally have a substituent, $L^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, and when a plurality of $L^A$ are present, they may be the same or different, X represents said crosslinkable group, and when a plurality of X are present, they may be the same or different,

[Chemical Formula 4]

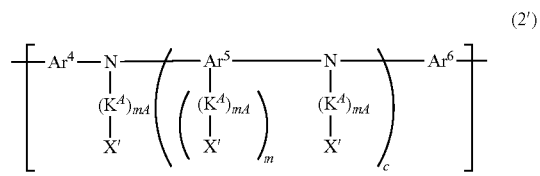

(2')

wherein,
mA represents an integer of 0 or more and 5 or less, m represents an integer of 1 or more and 5 or less, and c represents 0 or 1, and when a plurality of mA are present, they may be the same or different, $Ar^5$ represents an aromatic hydrocarbon group, a heterocyclic group, or a group in which at least one aromatic hydrocarbon group and at least one heterocyclic group are bonded directly, and the foregoing groups optionally have a substituent, $Ar^4$ and $Ar^6$ each independently represent an arylene group or a divalent heterocyclic group, and the foregoing groups optionally have a substituent, $K^A$ represents an alkylene group, a cycloalkylene group, an arylene group, a divalent heterocyclic group, a group represented by —NR"—, an oxygen atom or a sulfur atom, and the foregoing groups optionally have a substituent, R" represents a hydrogen atom, an alkyl group, a cycloalkyl group, an aryl group or a monovalent heterocyclic group, and the foregoing groups optionally have a substituent, and when a plurality of $K^A$ are present, they may be the same or different, X' represents said crosslinkable group, a hydrogen atom, an alkyl group, a cycloalkyl group, an aryl group or a monovalent heterocyclic group, and the foregoing groups optionally have a substituent, and when a plurality of X' are present, they may be the same or different, however, at least one X' is said crosslinkable group.

3. The block copolymer according to claim 1, wherein said end group contains a crosslinkable group.

4. The block copolymer according to claim 1, wherein said crosslinkable group contains at least one structure selected from the group consisting of a carbon-carbon double bond, a carbon-carbon triple bond, oxirane, oxetane, aziridine, azetidine, azide, benzocyclobutene and naphthocyclobutene.

5. The block copolymer according to claim 4, wherein said crosslinkable group contains at least one group selected from the group consisting of crosslinkable groups represented by the formula (XL-1) to the formula (XL-19) in Group A:

(Group A)

[Chemical Formula 5]

(XL-1)

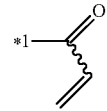

(XL-2)

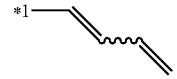

(XL-3)

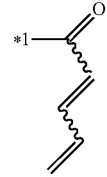

(XL-4)

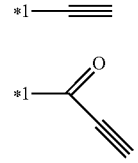

(XL-5)

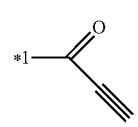

(XL-6)

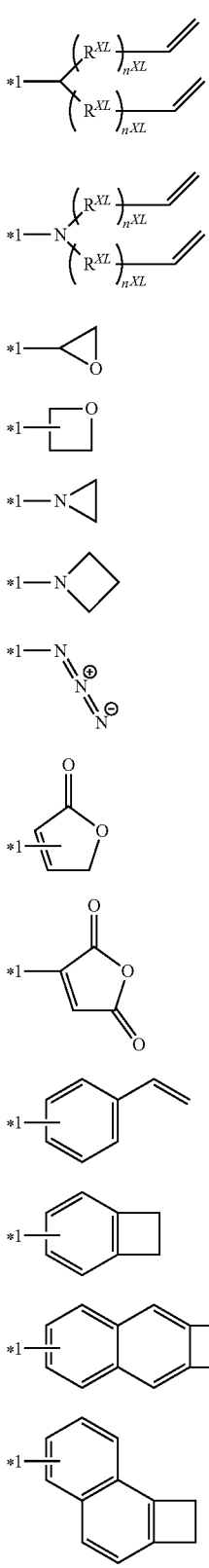

wherein, $n^{XL}$ represents an integer of 0 or more and 5 or less, and a plurality of $n^{XL}$ may be the same or different, $R^{XL}$ represents a methylene group, an oxygen atom or a sulfur atom, and when a plurality of R are present, they may be the same or different, the wavy line indicates that the group having the wavy line is any one of a plurality of geometric isomers or contains a plurality of geometric isomers,

*1 represents a binding position, the crosslinkable group in Group A optionally has a substituent, and when a plurality of the substituents are present, they may be combined together to form a ring together with carbon atoms to which they are attached.

6. The block copolymer according to claim 4, wherein said crosslinkable group contains at least one group selected from the group consisting of a crosslinkable group represented by the following the formula (XL-1), a crosslinkable group represented by the following the formula (XL-16), a crosslinkable group represented by the following the formula (XL-17), a crosslinkable group represented by the following the formula (XL-18) and a crosslinkable group represented by the following the formula (XL-19):

[Chemical Formula 6]

wherein, 1 represents a binding position, said crosslinkable group represented by the formula (XL-1), the formula (XL-16), the formula (XL-17), the formula (XL-18) or the formula (XL-19) optionally has a substituent, and when a plurality of the substituents are present, they may be combined together to form a ring together with carbon atoms to which they are attached.

7. The block copolymer according to claim 1, wherein said end group is an aryl group optionally having a substituent or a monovalent heterocyclic group optionally having a substituent.

8. The block copolymer according to claim 1, wherein said block that does not bind to the end group contains said non-crosslinkable constitutional unit represented by the formula (X).

9. The block copolymer according to claim 1, wherein said block that does not bind to the end group further contains a non-crosslinkable constitutional unit represented by the following the formula (Y):

[Chemical Formula 7]

(Y)

wherein, $Ar^{Y1}$ represents an arylene group optionally having a substituent.

10. The block copolymer according to claim 1, wherein said block that binds to the end group does not contain said non-crosslinkable constitutional unit represented by the formula (X) or said non-crosslinkable constitutional unit represented by the formula (Z).

11. The block copolymer according to claim 1, which satisfies said the formula (i).

12. A composition comprising the block copolymer according to claim 1 and at least one selected from the group consisting of a hole transporting material, a hole injection material, an electron transporting material, an electron injection material, a light emitting material, an antioxidant and a solvent.

13. A light emitting device comprising a crosslinked product of the block copolymer according to claim 1.

14. A block copolymer comprising an end group, a block that binds to the end group, and a block that does not bind to the end group, wherein
the block copolymer comprises said end group, said block that binds to the end group, said block that does not bind to the end group, said block that binds to the end group, and said end group in this order,
said block that does not bind to the end group contains at least one constitutional unit selected from the group consisting of a non-crosslinkable constitutional unit represented by the following formula (X) and a non-crosslinkable constitutional unit represented by the following formula (Z),
at least one selected from the group consisting of said end group and said block that binds to the end group contains a crosslinkable group, and
at least one of the following formulae (i) to (iii) is satisfied when the total number of said non-crosslinkable constitutional unit represented by the formula (X) and the total number of said non-crosslinkable constitutional unit represented by the formula (Z) in said block that does not bind to the end group are represented by $X_I$ and $Z_I$, respectively, and the total number of said non-crosslinkable constitutional unit represented by the formula (X) and the total number of said non-crosslinkable constitutional unit represented by the formula (Z) in said block that binds to the end group are represented by $X_{II}$ and $Z_{II}$, respectively:

$X_I > X_{II}$ (i)

$Z_I > Z_{II}$ (ii)

$X_I + Z_I > X_{II} + Z_{II}$ (iii)

[Chemical Formula 1]

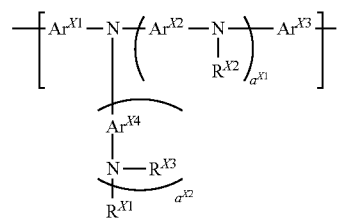

(X)

wherein,
$a^{X1}$ and $a^{X2}$ each independently represent an integer of 0 or more and 10 or less,
$Ar^{X1}$ and $Ar^{X3}$ each independently represent an arylene group or a divalent heterocyclic group, and the foregoing groups optionally have a substituent,
$Ar^{X2}$ and $Ar^{X4}$ ach independently represent an arylene group, a divalent heterocyclic group, or a divalent group in which at least one arylene group and at least one divalent heterocyclic group are bonded directly, and the foregoing groups optionally have a substituent, and when a plurality of $Ar^{X2}$ are present, they may be the same or different and when a plurality of $Ar^{X4}$ are present, they may be the same or different,
$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent, and when a plurality of $R^{X2}$ are present, they may be the same or different and when a plurality of $R^{X3}$ are present, they may be the same or different,

[Chemical Formula 2]

(Z)

wherein, $Ar^Z$ represents a divalent heterocyclic group, or a divalent group in which at least one arylene group and at least one divalent heterocyclic group are bonded directly, and the foregoing groups optionally have a substituent.

* * * * *